(12) United States Patent
Yamagata

(10) Patent No.: US 6,202,655 B1
(45) Date of Patent: Mar. 20, 2001

(54) ANODIZING APPARATUS AND APPARATUS AND METHOD ASSOCIATED WITH THE SAME

(75) Inventor: Kenji Yamagata, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/282,970

(22) Filed: Mar. 31, 1999

Related U.S. Application Data

(62) Division of application No. 08/979,602, filed on Nov. 26, 1997, now Pat. No. 5,951,833.

(30) Foreign Application Priority Data

| Nov. 28, 1996 | (JP) | ................................................. 8-317841 |
| Feb. 3, 1997 | (JP) | ................................................. 9-020814 |
| Oct. 22, 1997 | (JP) | ................................................. 9-290125 |

(51) Int. Cl.$^7$ ....................................................... B08B 3/02
(52) U.S. Cl. .......................... 134/61; 134/66; 134/95.2; 134/147; 134/159; 134/902
(58) Field of Search ............................ 134/56 R, 58 B, 134/61, 62, 66, 76, 82, 95.2, 102.3, 149, 153, 157, 159, 902

(56) References Cited

U.S. PATENT DOCUMENTS

| 3,010,885 | 11/1961 | Schink ................................. 205/157 |
| 3,261,773 | 7/1966 | Sandmann et al. .................... 205/157 |
| 4,043,894 | 8/1977 | Gibbs . |
| 4,131,267 | 12/1978 | Ono et al. ............................... 269/21 |
| 4,364,799 | 12/1982 | Steiger . |
| 4,787,805 | 11/1988 | Kosikowski . |
| 4,891,103 | 1/1990 | Zorinsky et al. . |
| 5,191,218 | 3/1993 | Mori et al. ............................... 269/21 |
| 5,324,012 | 6/1994 | Aoyama et al. ......................... 269/21 |
| 5,342,495 | 8/1994 | Tung et al. ............................. 204/297 |
| 5,458,755 | 10/1995 | Fujiyama et al. ...................... 204/256 |
| 5,501,787 | 3/1996 | Bassous et al. ........................ 205/157 |
| 5,522,975 | 6/1996 | Andricacos et al. . |
| 5,568,821 | * 10/1996 | Ohmori et al. .......................... 134/61 |
| 5,660,699 | 8/1997 | Saito et al. . |
| 5,743,685 | 4/1998 | Piggott .................................... 269/21 |
| 5,862,823 | * 1/1999 | Kamikawa et al. .................... 134/182 |

FOREIGN PATENT DOCUMENTS

| 0298564 A1 | 1/1989 | (EP) . |
| 0 597 428 | 5/1994 | (EP) . |
| 2615036 | 11/1988 | (FR) . |
| 3-202488 | 9/1991 | (JP) . |
| 5-243236 | 9/1993 | (JP) . |
| 5-295597 | 11/1993 | (JP) . |
| 06310488 | 11/1994 | (JP) . |
| 08037173 | 2/1996 | (JP) . |
| 8-225982 | 9/1996 | (JP) . |
| C2 1002387 | 11/1996 | (NL) . |

OTHER PUBLICATIONS

Patent Abstracts of Japan vol. 017, No. 625 (E–1461), Nov. 18, 1993 and JP 05 198556 A (Canon Inc.), Aug. 6, 1993 abstract.

European Search Report dated Nov. 10, 1999.

* cited by examiner

Primary Examiner—Frankie L. Stinson
(74) Attorney, Agent, or Firm—Morgan & Finnegan, L.L.P.

(57) ABSTRACT

A holder (102) made from an HF-resistant material includes annular suction pads (105, 108). The suction pad (105) is used to hold a small silicon substrate by suction, and the suction pad (108) is used to hold a large silicon substrate by suction. This makes silicon substrates with various sizes processable. A silicon substrate is held by suction by reducing a pressure in a space in a groove of the suction pad by a pump (120). An opening (103) is formed in the holder (102) so that the both surfaces of the silicon substrate are brought into contact with an HF solution (115). The silicon substrate is anodized by applying a DC voltage by using a platinum electrode (109*a*) as a negative electrode and a platinum electrode (109*b*) as a positive electrode, and thereby a substrate having a porous layer is produced.

6 Claims, 38 Drawing Sheets

FIG. 1
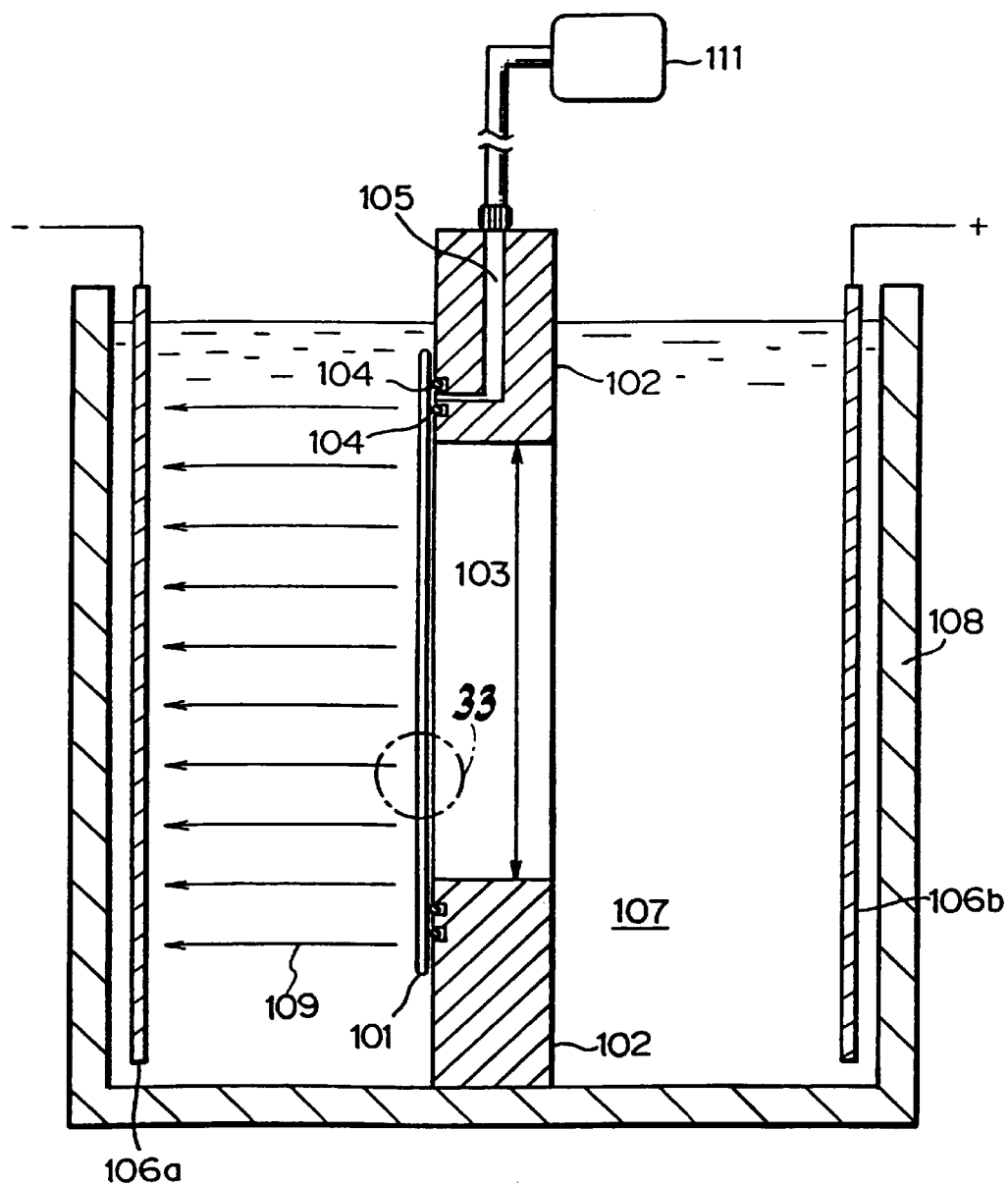
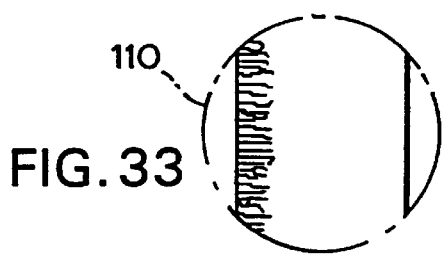
FIG. 33

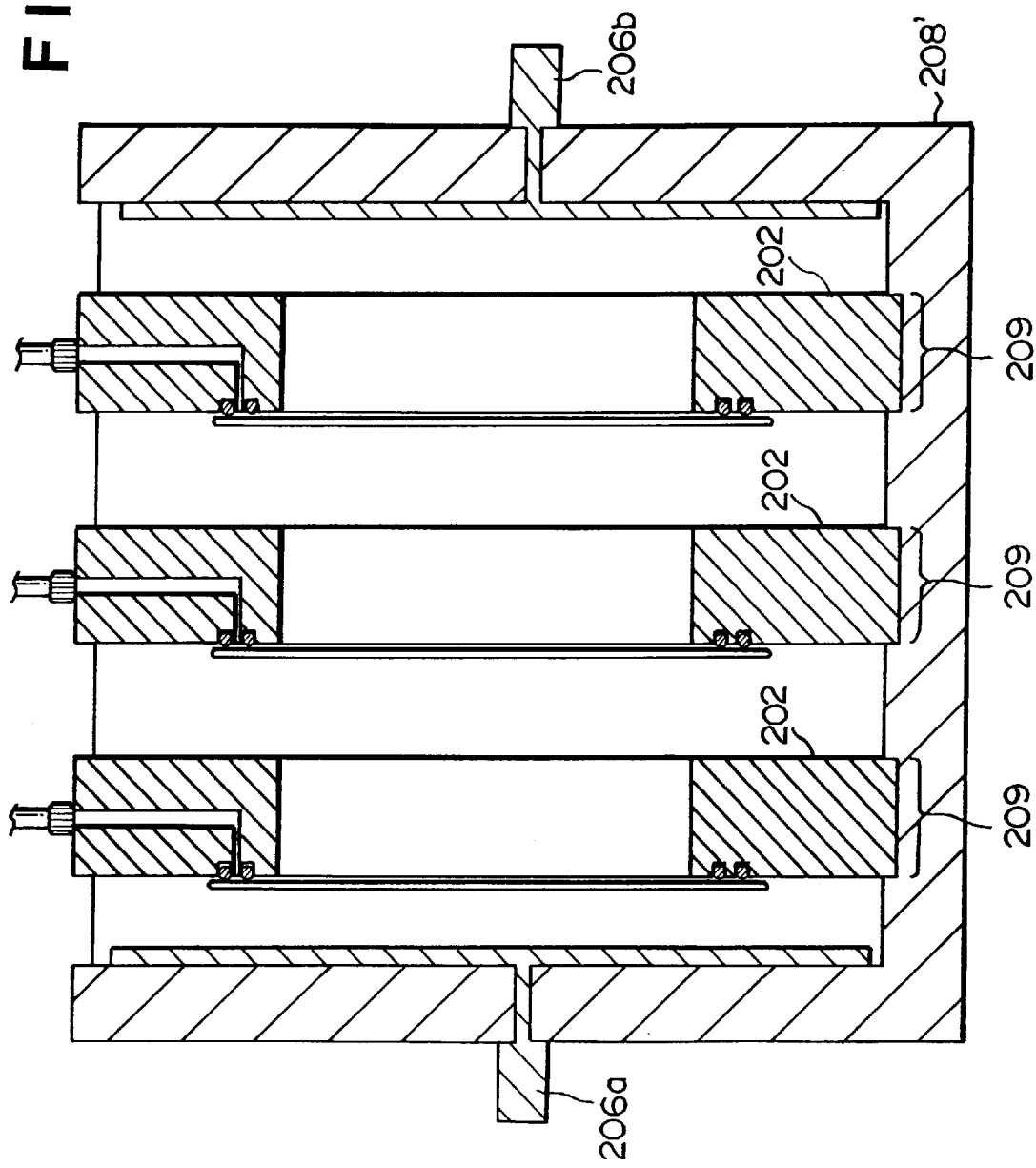

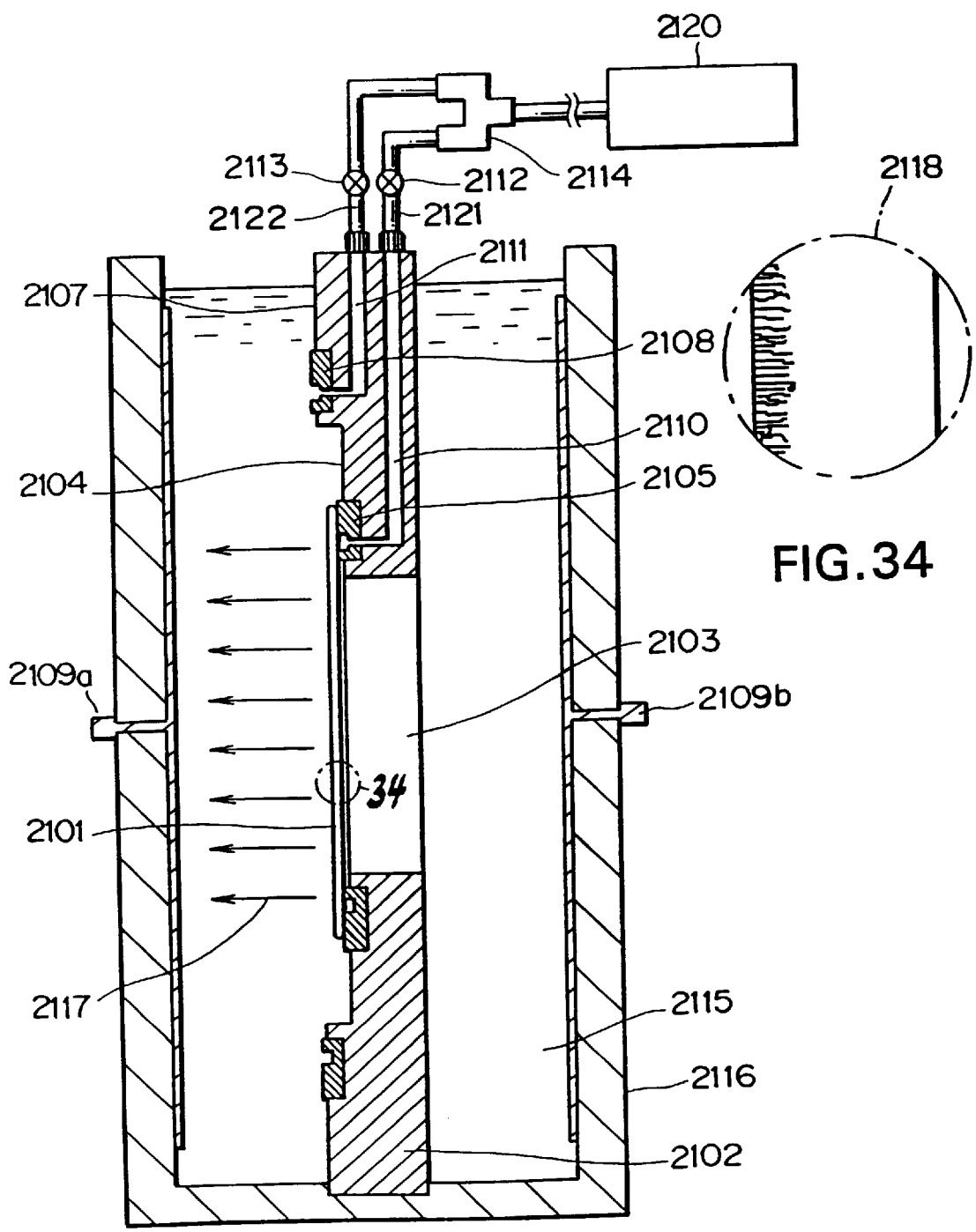

ANODIZING APPARATUS AND APPARATUS AND METHOD ASSOCIATED WITH THE SAME

This is a divisional of application Ser. No. 08/979,602, filed Nov. 26, 1997 now U.S. Pat. No. 5,951,833.

BACKGROUND OF THE INVENTION

1. Field of the Invention

The present invention relates to a substrate holder, an anodizing apparatus, a semiconductor processing system, and a method of processing or fabricating a substrate and, more particularly, to a substrate holder for holding a substrate to be anodized, an anodizing apparatus including the holder, a semiconductor processing system, and a method of processing or fabricating a substrate.

2. Description of the Related Art

Porous silicon was found by A. Uhlir and D. R. Turner during the course of researching electrolytic polishing of single-crystal silicon biased to a positive potential in an aqueous solution of hydrofluoric acid (to be abbreviated as HF hereinafter).

Thereafter, by focusing attention on a high reactivity of porous silicon, the application of porous silicon to a device isolation step requiring the formation of a thick insulator in the fabrication process of a silicon integrated circuit has been studied, and a complete isolation technique using a porous silicon oxide film (FIPOS: Full Isolation by Porous Oxidized Silicon) and the like have been developed (K. Imai, Solid State Electron 24, 159, 1981).

Also, an applied technique to a direct adhesion technique by which a silicon epitaxial layer grown on a porous silicon substrate is adhered on an amorphous substrate or a single-crystal silicon substrate via an oxide film has been developed recently (Japanese Patent Laid-Open No. 5-21338).

As another application, porous silicon which emits light by itself has attracted attention as so-called photoluminescence and electroluminescence materials (Japanese Patent Laid-Open No. 6-338631).

FIG. 17 is a view showing the arrangement of an apparatus for fabricating porous silicon by anodizing a silicon substrate. In this apparatus, the lower surface of a silicon substrate 1701 is brought into tight contact with a metal electrode 1702, and an anodizing bath 1705 is placed on the silicon substrate 1701 such that the peripheral portion on the upper surface of the silicon substrate 1701 is sealed by, e.g., an O-ring 1704. The bath is filled with an HF solution 1703, and a counterelectrode 1706 is arranged in the bath so as to oppose the silicon substrate 1701. The silicon substrate 1701 is anodized by applying a DC voltage by using the counterelectrode 1706 as a negative electrode and the metal electrode 1702 as a positive electrode.

This method has two major drawbacks. One drawback is that the silicon substrate 1701 is contaminated with the metal because the lower surface of the silicon substrate 1701 is in direct contact with the metal. The other drawback is that a region to be anodized on the surface of the silicon substrate 1701 is only a portion contacting the HF solution, so porous silicon is formed only inside the O-ring 1704.

FIG. 18 is a view showing the arrangement of an anodizing apparatus (Japanese Patent Laid-Open No. 60-94737) developed to solve the above problems. In this anodizing apparatus, HF-resistant Teflon anodizing baths 1802a and 1802b (Teflon is a tradename of Du Pont de Nemours & Co. Inc., U.S.A) are so arranged as to sandwich a silicon substrate 1801. Platinum electrodes 1803a and 1803b are arranged in the anodizing baths 1802a and 1802b, respectively.

The anodizing baths 1802a and 1802b have grooves in side walls contacting the silicon substrate 1801, and O-rings 1804a and 1804b made from fluorine rubber are fitted in these grooves. The anodizing baths 1802a and 1802b and the silicon substrate 1801 are sealed by these O-rings 1804a and 1804b, respectively. The anodizing baths 1802a and 1802b thus sealed are filled with HF solutions 1805a and 1805b, respectively.

In these anodizing baths, as the silicon substrate does not directly contact the metal electrodes; the possibility of the silicon substrate being contaminated by the metal electrodes is low. However, the front and rear surfaces of the silicon substrate to be anodized are sealed by the O-rings. Accordingly, the problem that an unanodized portion remains in the peripheral region of the surfaces of the silicon substrate still remains unsolved. Also, since the silicon substrate to be processed is directly incorporated into and integrated with the anodizing baths, it is impossible to rapidly exchange the silicon substrates.

In consideration of the above problems, an anodizing apparatus which supports a beveling region of a silicon substrate was developed (Japanese Patent Laid-Open No. 5-198556). This anodizing apparatus can prevent contamination from a metal electrode and anodize the entire region of the surface of a silicon substrate. Also, this anodizing apparatus fixes a wafer to be processed in an anodizing bath in two steps in which the wafer is fixed by a holder and the holder is then fixed in the anodizing bath. This greatly improves the operability compared to the conventional apparatus in which a wafer is directly fixed in an anodizing bath to form a part of the anodizing bath.

The anodizing apparatus described in Japanese Patent Laid-Open No. 5-198556 is an extremely practical apparatus which produces almost no metal contamination and can anodize the entire region of the substrate surface.

It is, however, being desired to develop an anodizing apparatus with a higher productivity. For example, when it is necessary to process a large number of types of substrates different in a diameter (e.g., an inch size) or a shape (e.g., an orientation flat or a notch), the anodizing apparatus described in Japanese Patent Laid-Open No. 5-198556 must be equipped with dedicated holders for the individual substrates.

Additionally, in incorporating a substrate into a holder, it is necessary to first match the center of the wafer with the center of a seal surface, match a special-shape portion such as an orientation flat with a corresponding portion of the holder, and then fix the wafer by pushing the seal surface against the periphery of the wafer. Since a considerable press force is required to fix the wafer, screws, for example, are used in the fixation.

SUMMARY OF THE INVENTION

The present invention has been made in consideration of the above situation, and has as its object to increase the efficiency of anodization by improving a substrate supporting method.

An anodizing apparatus according to one embodiment of the present invention is an anodizing apparatus for anodizing a substrate in an electrolytic solution, comprising a pair of opposing electrodes, and a holding unit for holding a portion of one surface of a substrate by suction between the electrodes.

In the above anodizing apparatus, a main body of the holding unit preferably has an opening through which an electrolytic solution is brought into contact with a rear surface of the held substrate.

In the above anodizing apparatus, it is preferable that the holding unit comprise a substantially annular suction member for holding a substrate by suction, and the suction member be arranged along an inside of an outer peripheral portion of a substrate to be held.

In the above anodizing apparatus, the suction member preferably comprises two O-rings constituting a double structure and a suction hole for holding a substrate by suction by reducing a pressure in a space between the two O-rings.

In the above anodizing apparatus, the suction member preferably comprises a suction pad having a concave sectional shape and a suction hole for holding a substrate by suction by reducing a pressure in a space in a valley of the suction pad.

In the above anodizing apparatus, the suction member preferably comprises a suction pad having a U sectional shape and a suction hole for holding a substrate by suction by reducing a pressure in a space in a valley of the suction pad.

In the above anodizing apparatus, the suction member preferably comprises a suction pad having a flat contact portion to be brought into contact with a rear surface of a substrate to be held and a substantially annular groove in a surface of the contact portion, and a suction hole for holding a substrate by suction by reducing a pressure in a space in the groove of the suction pad.

In the above anodizing apparatus, the suction member is preferably brought into tight contact with a substrate to be held so as to prevent an electrolytic solution on a front surface of the substrate from moving to a rear surface of the substrate.

The above anodizing apparatus preferably comprises a plurality of the holding units.

A substrate holder according to another embodiment of the present invention is a substrate holder for holding a substrate to be anodized in an electrolytic solution, wherein a main body comprises a suction member for holding a portion of one surface of a substrate by suction, and an opening through which an electrolytic solution is brought into contact with a rear surface of the held substrate.

In the above substrate holder, the suction member is preferably arranged along an inside of an outer peripheral portion of the held substrate.

In the above substrate holder, the suction member preferably comprises two O-rings constituting a double structure and a suction hole for holding a substrate by suction by reducing a pressure in a space between the two O-rings.

In the above substrate holder, the suction member preferably comprises a suction pad having a concave sectional shape and a suction hole for holding a substrate by suction by reducing a pressure in a space in a valley of the suction pad.

In the above substrate holder, the suction member preferably comprises a suction pad having a U sectional shape and a suction hole for holding a substrate by suction by reducing a pressure in a space in a valley of the suction pad.

In the above substrate holder, the suction member preferably comprises a suction pad having a flat contact portion to be brought into contact with a rear surface of a substrate to be held and a substantially annular groove in a surface of the contact portion, and a suction hole for holding a substrate by suction by reducing a pressure in a space in the groove of the suction pad.

In the above substrate holder, the suction member is preferably brought into tight contact with a substrate to be held so as to prevent an electrolytic solution on a front surface of the substrate from moving to a rear surface of the substrate.

An anodizing system according to still another embodiment of the present invention comprises the above anodizing apparatus, a cleaning apparatus for cleaning an anodized substrate, a drying apparatus for drying the cleaned substrate, and a convey apparatus for conveying the substrate between the apparatuses.

In the above anodizing system, it is preferable that the drying apparatus comprise a receiving unit for receiving the cleaned substrate, and the anodizing apparatus, the cleaning apparatus, and the receiving unit be substantially arranged in a straight line.

In the above anodizing system, it is preferable that the drying apparatus comprise a receiving unit for receiving the cleaned substrate, the anodizing apparatus, the cleaning apparatus, and the receiving unit be substantially arranged in a straight line, and the convey apparatus convey the substrate such that surfaces of the substrate are parallel to a direction perpendicular to the straight line.

In the above anodizing system, the convey apparatus preferably comprises a first convey robot for conveying the substrate from the anodizing apparatus to the cleaning apparatus, and a second convey robot for conveying a carrier containing the substrate from the cleaning apparatus to the receiving unit of the drying apparatus.

In the above anodizing system, each of the first and second convey robots preferably has only a first driving shaft for moving the substrate or the carrier to a portion above each apparatus and a second driving shaft for moving the substrate or the carrier along the straight line, as driving shafts for conveying the substrate or the carrier.

The above anodizing system preferably further comprises a filter apparatus for purifying an electrolytic solution in the anodizing apparatus.

In the above anodizing system, the filter apparatus preferably comprises a tank for storing an electrolytic solution and a circulating mechanism for supplying the electrolytic solution stored in the tank into the anodizing apparatus and returning an electrolytic solution overflowing from the anodizing apparatus to the tank.

A semiconductor processing system according to still another embodiment of the present invention is a semiconductor processing system for processing a semiconductor substrate, comprising a cleaning apparatus for cleaning the semiconductor substrate, a drying apparatus for drying the semiconductor substrate cleaned by the cleaning apparatus, and a convey apparatus for conveying the semiconductor substrate from a preceding step of the cleaning to the cleaning apparatus and from the cleaning apparatus to the drying apparatus, wherein the drying apparatus comprises a receiving unit for receiving the cleaned semiconductor substrate, the cleaning apparatus and the receiving unit are substantially arranged in a straight line, and the convey apparatus conveys the semiconductor substrate such that surfaces of the semiconductor substrate are parallel to a direction perpendicular to the straight line.

In the above semiconductor processing system, the convey apparatus preferably comprises a first convey robot for conveying the substrate to the cleaning apparatus, and a second convey robot for conveying the substrate contained in a carrier from the cleaning apparatus to the receiving unit of the drying apparatus In the above semiconductor processing system, each of the first and second convey robots preferably has only a first driving shaft for moving the substrate or the carrier to a portion above each apparatus and a second driving shaft for moving the substrate or the carrier along the straight line, as driving shafts for conveying the substrate or the carrier.

A substrate fabrication method according to still another embodiment of the present invention comprises the steps of holding a portion of one surface of a substrate by suction between a pair of opposing electrodes, and anodizing the substrate by applying a voltage between the electrodes with an electrolytic solution being filled.

An anodizing apparatus according to still another embodiment of the present invention is an anodizing apparatus for anodizing a substrate in an electrolytic solution, comprising a pair of opposing electrodes, and a holding unit for holding one surface of a substrate by suction between the electrodes, wherein the holding unit comprises a plurality of substantially annular suction members for holding a substrate by suction, the suction members differing in size.

In the above anodizing apparatus, it is preferable that a main body of the holding unit have a substantially circular opening, the opening have at least one substantially annular intermediate surface between front and rear surfaces of the main body, the front surface of the main body and the intermediate surface be so arranged as to form a stepwise shape, and the front surface of the main body and the intermediate surface have the suction members differing in size.

In the above anodizing apparatus, each of the suction members preferably comprises two O-rings constituting a double structure and a suction hole for holding a substrate by suction by reducing a pressure in a space between the two O-rings.

In the above anodizing apparatus, each of the suction members preferably comprises a suction pad having a concave sectional shape and a suction hole for holding a substrate by suction by reducing a pressure in a space in a valley of the suction pad.

In the above anodizing apparatus, each of the suction members preferably comprises a suction pad having a U sectional shape and a suction hole for holding a substrate by suction by reducing a pressure in a space in a valley of the suction pad.

In the above anodizing apparatus, each of the suction members preferably comprises a suction pad having a flat contact portion to be brought into contact with a rear surface of a substrate to be held and a substantially annular groove in a surface of the contact portion, and a suction hole for holding a substrate by suction by reducing a pressure in a space in the groove of the suction pad.

The above anodizing apparatus preferably comprises a plurality of the holding units.

The above anodizing apparatus preferably further comprises a control unit for independently controlling substrate suction operations by the suction members.

In the above anodizing apparatus, a step difference of the stepwise shape formed by the front surface of the main body and the intermediate surface is preferably at least 5 mm.

A substrate holder according to still another embodiment of the present invention is a substrate holder for holding a substrate to be anodized in an electrolytic solution, comprising a main body having a plurality of substantially annular suction members for holding a substrate, the suction members differing in size.

In the above substrate holder, it is preferable that the main body have a substantially circular opening, the opening have at least one substantially annular intermediate surface between front and rear surfaces of the main body, the front surface of the main body and the intermediate surface be so arranged as to form a stepwise shape, and the front surface of the main body and the intermediate surface have the suction members differing in size.

In the above substrate holder, each of the suction members preferably comprises two O-rings constituting a double structure and a suction hole for holding a substrate by suction by reducing a pressure in a space between the two O-rings.

In the above substrate holder, each of the suction members preferably comprises a suction pad having a concave sectional shape and a suction hole for holding a substrate by suction by reducing a pressure in a space in a valley of the suction pad.

In the above substrate holder, each of the suction members preferably comprises a suction pad having a U sectional shape and a suction hole for holding a substrate by suction by reducing a pressure in a space in a valley of the suction pad.

In the above substrate holder, each of the suction members preferably comprises a suction pad having a flat contact portion to be brought into contact with a rear surface of a substrate to be held and a substantially annular groove in a surface of the contact portion, and a suction hole for holding a substrate by suction by reducing a pressure in a space in the groove of the suction pad.

In the above substrate holder, a step difference of the stepwise shape formed by the front surface of the main body and the intermediate surface is preferably at least 5 mm.

A porous substrate fabrication method according to still another embodiment of the present invention anodizes a substrate by using the above anodizing apparatus.

An anodizing system according to still another embodiment of the present invention comprises the above anodizing apparatus, a cleaning apparatus for cleaning an anodized substrate, a drying apparatus for drying the cleaned substrate, and a convey apparatus for conveying the substrate between the apparatuses.

In the above anodizing system, it is preferable that the drying apparatus comprise a receiving unit for receiving the cleaned substrate, and the anodizing apparatus, the cleaning apparatus, and the receiving unit be substantially arranged in a straight line.

In the above anodizing system, it is preferable that the drying apparatus comprise a receiving unit for receiving the cleaned substrate, the anodizing apparatus, the cleaning apparatus, and the receiving unit be substantially arranged in a straight line, and the convey apparatus convey the substrate such that surfaces of the substrate are parallel to a direction perpendicular to the straight line.

In the above anodizing system, the convey apparatus preferably comprises a first robot for conveying the substrate from the anodizing apparatus to the cleaning apparatus, and a second robot for conveying a carrier containing the substrate from the cleaning apparatus to the receiving unit of the drying apparatus.

In the above anodizing system, each of the first and second robots preferably has only a first driving shaft for moving the substrate or the carrier to a portion above each apparatus and a second driving shaft for moving the substrate or the carrier along the straight line, as driving shafts for conveying the substrate or the carrier.

The above anodizing system is suited to fabricate a substrate having a porous layer by anodizing the substrate.

A substrate according to still another embodiment of the present invention has a porous layer obtained by holding a portion of one surface of the substrate by suction between a pair of opposing electrodes, and anodizing the substrate by applying a voltage between the electrodes with an electrolytic solution being filled.

A semiconductor substrate fabrication method according to still another embodiment of the present invention is a method of fabricating a semiconductor substrate by using two substrates, comprising the steps of holding a portion of one surface of a semiconductor substrate by suction between a pair of opposing electrodes and anodizing the semiconductor substrate by applying a voltage between the electrodes with an electrolytic solution being filled, thereby forming a porous layer on one surface of the semiconductor substrate, forming a single-crystal silicon layer on the porous layer of the semiconductor substrate, adhering another substrate to the single-crystal silicon layer of the semiconductor substrate, and separating the two adhered substrates from the porous layer.

A substrate fabrication method according to still another embodiment of the present invention is a method of fabricating a substrate having a porous layer, comprising the steps of dipping a substrate into an anodizing bath filled with an electrolytic solution and holding a portion of one surface of the substrate by suction by a suction member between the electrodes, anodizing the substrate by applying a voltage between the electrodes to form a porous layer on one surface of the substrate, removing the substrate on which the porous layer is formed from the anodizing bath and dipping the substrate into a cleaning bath to clean the substrate, and removing the completely cleaned substrate from the cleaning bath and conveying the substrate to a drying apparatus to dry the substrate.

In the above substrate fabrication method, the anodizing bath, the cleaning bath, and the drying apparatus are preferably substantially arranged in a straight line when viewed from above, thereby conveying the substrate such that a substrate convey path from the anodizing bath to the cleaning bath and a substrate convey path from the cleaning bath to the drying apparatus are substantially arranged in a straight line when viewed from above.

It is preferable that the above substrate fabrication method further comprise the step of conveying the dried substrate from the drying apparatus to an unloader, and the substrate be conveyed from the cleaning bath to the drying apparatus and from the drying apparatus to the unloader by a single robot.

The above substrate fabrication method preferably further comprises the step of drying the robot after the robot conveys the substrate from the cleaning bath to the drying apparatus and before the robot conveys the substrate from the drying apparatus to the unloader.

In the above substrate fabrication method, the step of drying the robot is preferably performed on the straight line.

A substrate processing method according to still another embodiment of the present invention comprises the steps of dipping a substrate into a processing bath filled with a chemical processing solution and chemically processing the substrate, removing the chemically processed substrate from the processing bath and dipping the substrate into a cleaning bath to clean the substrate, and removing the completely cleaned substrate from the cleaning bath and conveying the substrate to a drying apparatus to dry the substrate, wherein the processing bath, the cleaning bath, and the drying apparatus are substantially arranged in a straight line when viewed from above, thereby conveying the substrate such that a substrate convey path from the processing bath to the cleaning bath and a substrate convey path from the cleaning bath to the drying apparatus are substantially arranged in a straight line when viewed from above, and that surfaces of the substrate point in a direction perpendicular to the straight line.

It is preferable that the above substrate processing method further comprise the step of conveying the dried substrate from the drying apparatus to an unloader, and the substrate be conveyed from the cleaning bath to the drying apparatus and from the drying apparatus to the unloader by a single robot.

The above substrate processing method preferably further comprises the step of drying the robot after the robot conveys the substrate from the cleaning bath to the drying apparatus and before the robot conveys the substrate from the drying apparatus to the unloader.

A substrate processing system according to still another embodiment of the present invention comprises a processing bath for chemically processing a substrate, a cleaning bath for cleaning the substrate chemically processed by the processing bath, a drying apparatus for drying the substrate cleaned by the cleaning bath, and a convey apparatus for conveying the substrate from the processing bath to the cleaning bath and from the cleaning bath to the drying apparatus, wherein the processing bath, the cleaning bath, and the drying apparatus are substantially arranged in a straight line when viewed from above, and the convey apparatus conveys the substrate such that surfaces of the substrate point in a direction perpendicular to the straight line.

In the above substrate processing system, the convey apparatus preferably comprises a first convey robot for conveying the substrate from the processing bath to the cleaning bath, and a second convey robot for conveying the substrate from the cleaning bath to the drying apparatus and from the drying apparatus to an unloader.

The above substrate processing system preferably further comprises a second drying apparatus for drying the second convey robot after the second convey robot conveys the substrate from the cleaning bath to the drying apparatus and before the second convey robot conveys the substrate from the drying apparatus to the unloader.

Further objects, features and advantages of the present invention will become apparent from the following detailed description of the embodiments of the present invention with reference to the accompanying drawings.

BRIEF DESCRIPTION OF THE DRAWINGS

FIG. 1 is a schematic sectional view showing the arrangement of an anodizing apparatus according to the first embodiment of the present invention;

FIG. 4 is a sectional view showing an example of an anodizing bath capable of holding a plurality of holders;

FIG. 20 is a schematic sectional view showing the arrangement of an anodizing apparatus according to the second embodiment of the present invention;

FIG. 33 is an enlarged view of the anodized silicon substrate of FIG. 1.—and

FIG. 34 is an enlarged view of the anodized silicon substrate of FIG. 20.

DETAILED DESCRIPTION OF THE PREFERRED EMBODIMENTS

Figure 2A:
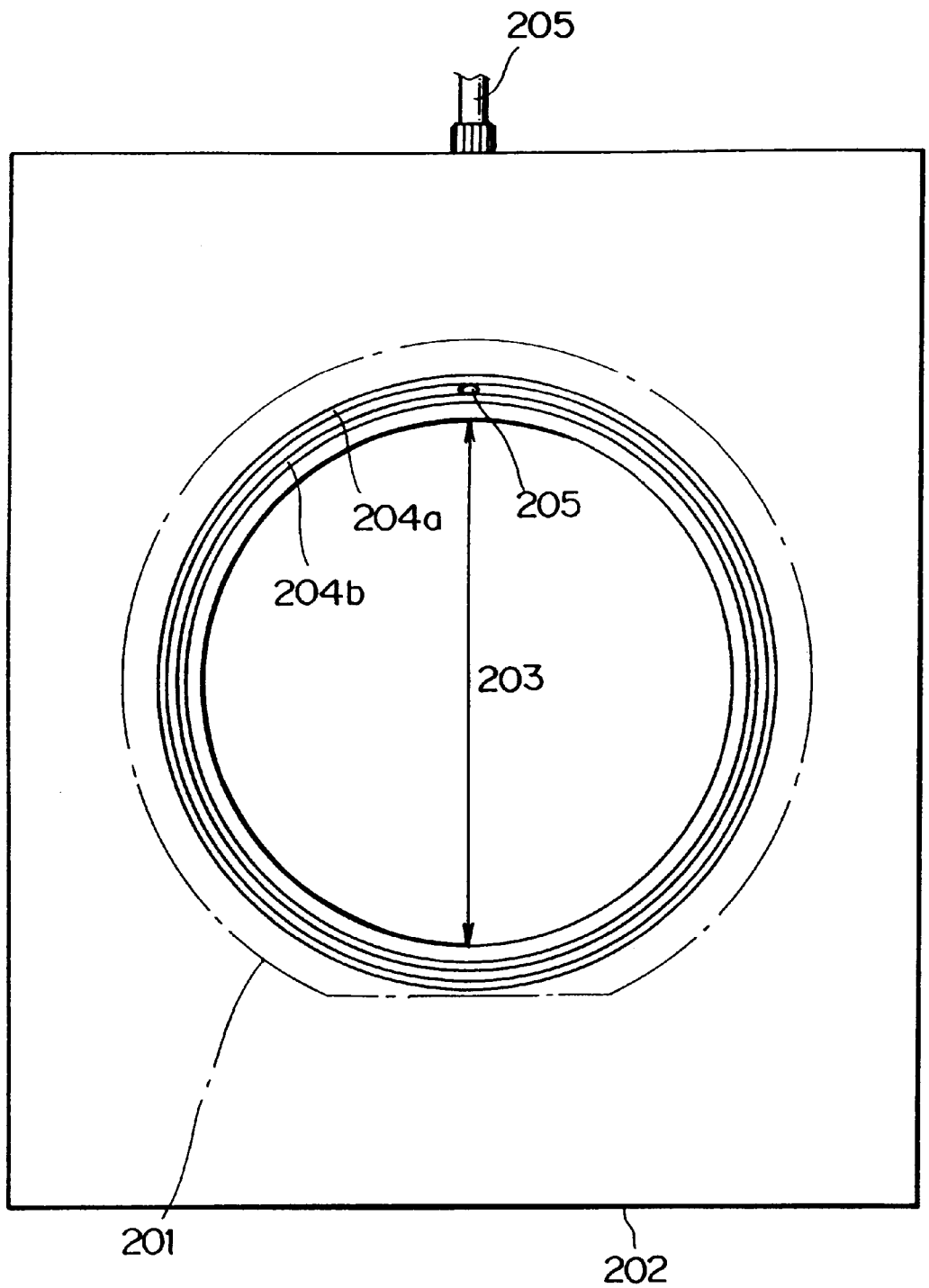
FIG. 2A is a front view of a holder according to the first arrangement of the first embodiment.

Making a silicon substrate porous, i.e., forming pores in a silicon substrate by using an anodization reaction is performed in, e.g., an HF solution. The existence of positive holes in silicon crystal is essential in this processing, and the mechanism of the reaction is estimated as follows.

First, positive holes in a silicon substrate given an electric field in an HF solution are induced on the surface on the side of a negative electrode. As a consequence, the density of Si—H bonds so existing as to compensate for unbending hands on the surface increases. F ions in the HF solution on the negative electrode side make a nucleophilic attack on the Si—H bonds to form Si—F bonds. This reaction produces $H_2$ molecules and at the same time emits one electron on the side of a positive electrode. Si—Si bonds near the surface are weakened by the polarization characteristic of the Si—F bonds. These weak Si—Si bonds are attacked by HF or $H_2O$, and Si atoms on the crystal surface change into $SiF_4$ and leave the crystal surfaces. Consequently, depressions are formed on the crystal surfaces, and a field distribution (field concentration) which preferentially attracts positive holes occurs in these depressions. This surface heterogeneity extends to allow the etching of silicon atoms to continuously progress along the electric field. Note that the solution used in the anodization is not restricted to an HF solution and can be some other electrolytic solution.

An anodizing apparatus according to each preferred embodiment of the present invention supports the rear surface of a substrate so as not to interfere with the direction of an electric field on an anodization reaction surface (the front surface of the substrate). Also, this anodizing apparatus supports a substrate by a method by which the entire region of the surface of the substrate is anodized. Furthermore, the anodizing apparatus has a mechanism for supporting the rear surface of a substrate by vacuum suction. This helps simplify an operation of supporting a substrate.

[First Embodiment]

FIG. 1 is a schematic sectional view showing the arrangement of an anodizing apparatus according to one embodiment of the present invention. Reference numeral 101 denotes a silicon substrate (e.g., a wafer). Generally, the existence of positive holes is important for anodization, so a p-type silicon substrate is suitable. However, an n-type silicon substrate can also be used by promoting the production of positive holes by the irradiation of light or the like.

Reference numeral 102 denotes a holder for supporting the silicon substrate. This holder 102 is made from an HF-resistant material such as an ethylene tetrafluoride resin (tradename: Teflon). An opening 103 which has a circular shape or a shape close to a circle (assuming a term "circle" also includes a shape close to a circle hereafter) having a diameter smaller than the diameter of a silicon substrate to be supported is formed in the holder 102.

A suction mechanism for supporting the silicon substrate 101 by suction is provided on one surface of the holder 102. Various forms are possible as this suction mechanism.

As this suction mechanism, it is preferable to form two grooves constituting a double structure along the opening 103 of the holder 102, fit O-rings 104 in these grooves, and reduce a pressure in the space between the two O-rings 104 by a pump 111 through a pressure reducing line 105, thereby holding the silicon substrate 101 by suction.

In another preferred suction mechanism, an annular suction pad whose section has a concave shape, a U shape, or some other shape is arranged along the opening 103. The silicon substrate 101 is held by suction by reducing a pressure in a hollow portion formed by an opening (e.g., a valley of the concave shape) of this suction pad and the silicon substrate 101 by the pump 111.

In still another preferred suction mechanism, a groove is formed in the suction surface of the holder 102 and the silicon substrate 101 is held by suction by reducing a pressure in this groove by the pump 111. In this mechanism, if the material of the holder 102 is too hard to deform, an HF solution 107 readily leaks between the front and rear surfaces of the silicon substrate 101 through the suction surface. Therefore, it is preferable that at least a portion of the holder 102 in contact with the silicon substrate 101 be made from, e.g., HF-resistant rubber. It is of course possible to form the entire holder 102 or the entire surfaces of the holder 12 by using, e.g., HF-resistant rubber.

The front and rear surfaces of the silicon substrate 101 are preferably completely separated by the suction mechanism as described above. However, this embodiment of the present invention does not necessarily require the complete separation. For example, it is possible to use a suction mechanism by which one or several portions of the silicon substrate 101 are supported and the silicon substrate and the holder are not completely sealed.

The shape of the opening 103 substantially matches the shape of a portion where the rear surface of the silicon substrate 101 comes in contact with the HF solution. The size of this opening 103 can be smaller than the silicon substrate 101 to some extent.

For example, the opening diameter can be smaller by about 60 mm than the diameter of the silicon substrate 101; i.e., it is possible to use an opening diameter by which a region where the silicon substrate 101 is not in contact with the HF solution 107 is about 30 mm from the edge of the silicon substrate 101. The present inventors have confirmed that even when an opening diameter like this is used, the thickness of an anodized portion of the silicon substrate 101 is substantially constant from the center to the edge.

Accordingly, when the diameter of the opening 103 of the holder 102 is 90 mm, for example, any of silicon substrates having diameters of 100 mm (4 in.), 125 mm (5 in.), and 150 mm (6 in.) can be processed. The distribution of anodized products is good in all silicon substrates with these diameters, and their qualities are equal. Note that wafers exceeding 6 in., e.g., of 8- and 12-in. wafers can also be processed by setting the diameter of the opening 103 under the above condition.

If the diameter of the opening 103 of the holder 102 is smaller by 60 mm or more than the diameter of a silicon substrate, an unpreferable distribution gradually occurs in a porous silicon film in the peripheral portion of the silicon substrate. However, a holder having an opening whose diameter is smaller than that can also be used depending upon the process margin after the anodization. The allowable difference between the diameter of the silicon substrate 101 and the diameter of the opening 103 also depends upon parameters such as the impurity concentration (resistivity) of the silicon substrate and the distance between the electrode and the silicon substrate.

Other components will be described below. Reference numerals 106a and 106b denote negative and positive electrodes, respectively, which are preferably formed by a chemically stable platinum material. Reference numeral 107 denotes an HF solution. Alcohol such as ethanol can be mixed in the HF solution 107 where necessary in order to immediately remove bubbles of, e.g., $H_2$ as a reaction product from the silicon substrate surface. Arrows 109 in FIG. 1 indicate the direction of an electric field. Reference numeral 110 denotes in FIG. 33 an enlarged section of the anodized silicon substrate 101, showing the state in which a porous film is formed from the silicon substrate surface.

In this preferred embodiment of the present invention, an anodizing apparatus suited to mass-production can be obtained by improving the substrate holding mechanism. For example, to fix a substrate to be processed to the holder, it is only necessary to push the rear surface of the substrate against the suction surface of the holder and hold the rear surface by suction. Also, by well decreasing the diameter of the suction mechanism of the holder compared to the diameter of a substrate, it is no longer necessary to limit the position of an orientation flat of a substrate to be held by suction. Additionally, the center of the substrate can be slightly deviated from the center of the holder. Furthermore, since the operation of holding a substrate is simplified, the anodization is easy to automate.

Preferred arrangements of this embodiment will be enumerated and described below.

[First Arrangement]

Figure 2B:
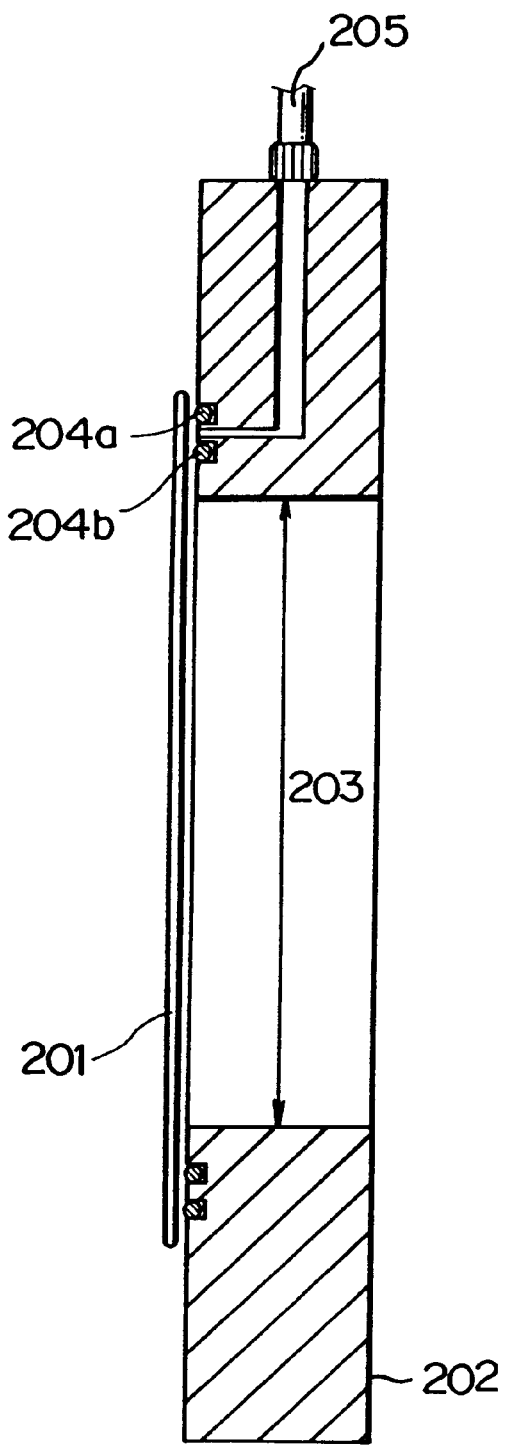
FIG. 2B is a sectional view of the holder according to the first arrangement of the first embodiment.

FIG. 2A is a front view of a holder according to the first arrangement of this embodiment. FIG. 2B is a longitudinal sectional view of the holder shown in FIG. 2A.

Reference numeral 201 denotes a 5-in. silicon substrate to be anodized; and 202, a holder made from an ethylene tetrafluoride resin (tradename: Teflon). An opening 203 with a diameter of 90 mm is forced in the center of the holder 202. Two circular grooves constituting a double structure are formed along the edge of the opening 203, and O-rings 204a and 204b made from perfluoroethylene based on a fluorine resin are fitted in these grooves. The inner diameter of the outer O-ring 204a is 117 mm, the inner diameter of the inter O-ring 204b is 108 mm, and the diameter of the section of each O-ring is 2.5 mm.

Between the outer O-ring 204a and the inter O-ring 204b, a suction hole 205 for reducing a pressure in the space defined by these two O-rings and the silicon substrate 201 is formed. To hold the silicon substrate 201 by suction, it is only necessary to reduce a pressure in the space between the O-rings by a pump (not shown) connected to the suction hole 205.

The diameter of the 5-in. silicon substrate 201 is 125 mm. Therefore, the position of an orientation flat can point in any direction as long as the center of the silicon substrate 201 and the center of the opening 203 substantially match with each other. Accordingly, it is unnecessary to take account of the position of an orientation flat when the silicon substrate 201 is to be held by suction by the holder 202.

Also, a silicon substrate whose diameter is larger than 5 in. can be set on the holder 202, and a porous layer similar to that of a 5-in. silicon substrate can be formed. If this is the case, however, a power supply must be so adjusted that the density of a current supplied during the anodization is substantially the same as that in the case of a 5-in. substrate.

Figure 3:
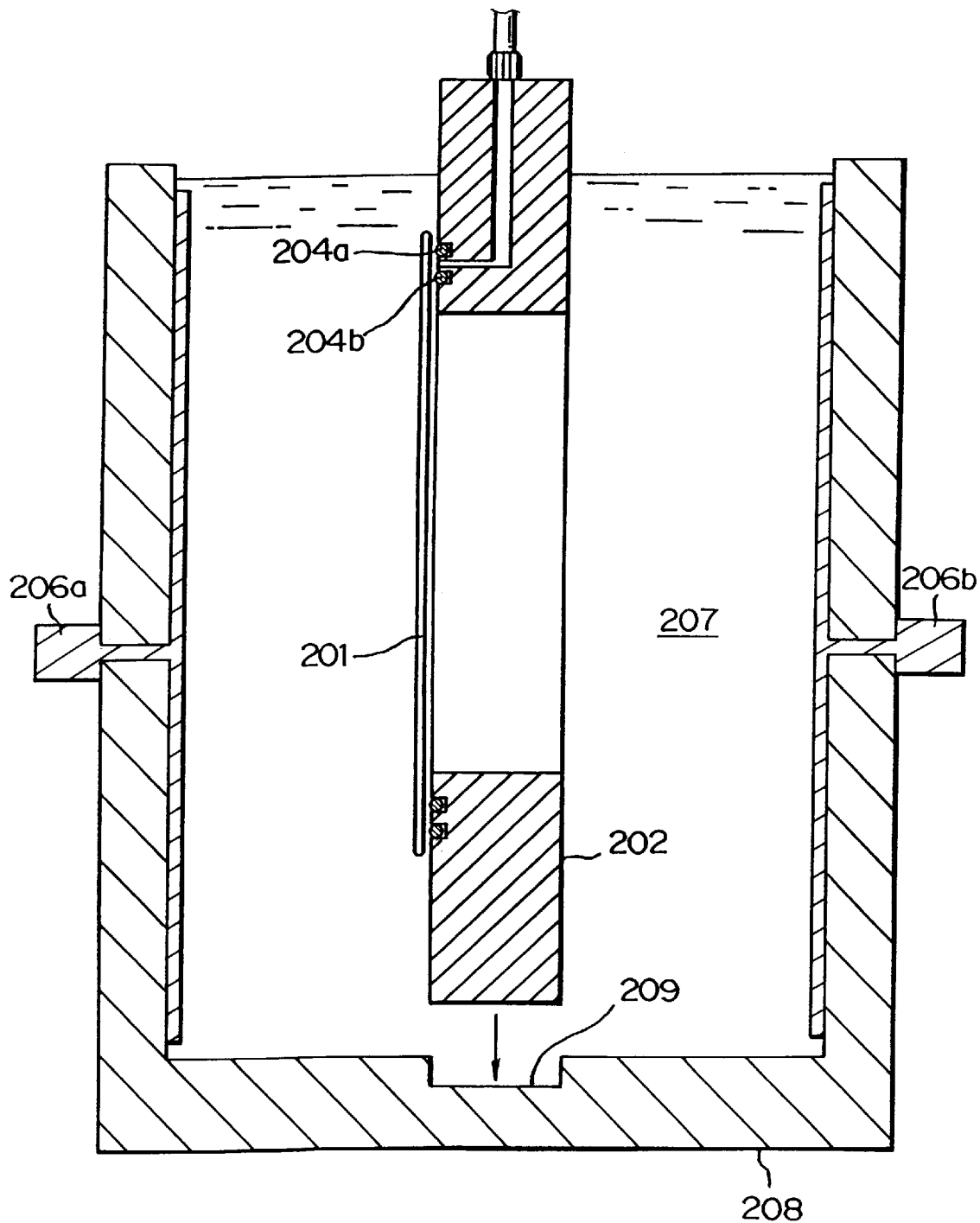
FIG. 3 is a view showing the way the holder is set in an anodizing bath.

In actually anodizing the silicon substrate 201, the holder 202 holding the silicon substrate 201 by suction is set in an anodizing bath. FIG. 3 is a view showing the way the holder 202 is set in an anodizing bath.

An anodizing bath 208 is made from an ethylene tetrafluoride resin like the holder 202. Platinum electrodes 206a and 206b are attached to the two sides of the anodizing bath 208. In the middle of the anodizing bath 208, a holder groove 209 for holding the holder 202 is formed. When the holder 202 holding the silicon substrate 201 by suction is fitted in this holder groove 209, the anodizing bath 208 is divided into right and left portions, and the HF solution 207 filled in the bath is separated.

In this state, a DC voltage is applied by using the platinum electrode 206a as a negative electrode and the platinum electrode 206b as a positive electrode. This anodizes the entire region of the front surface of the silicon substrate 201 and a portion (to be referred to as a rear surface peripheral portion hereinafter) of its rear surface outside the outer O-ring 204a. Consequently, a porous silicon layer can be formed over the entire front surface and the rear surface peripheral portion of the silicon substrate 201.

FIG. 4 is a sectional view showing an example of an anodizing bath capable of holding a plurality of holders 202. As shown in FIG. 4, a plurality of holders 202 can be held by forming a plurality of holder grooves 209 in an anodizing bath 208'. This further improves the productivity. Note that the holders are arranged in series in this example of an anodizing bath, but the holders can also be arranged parallel or in a matrix manner.

[Second Arrangement]

Figure 5A:
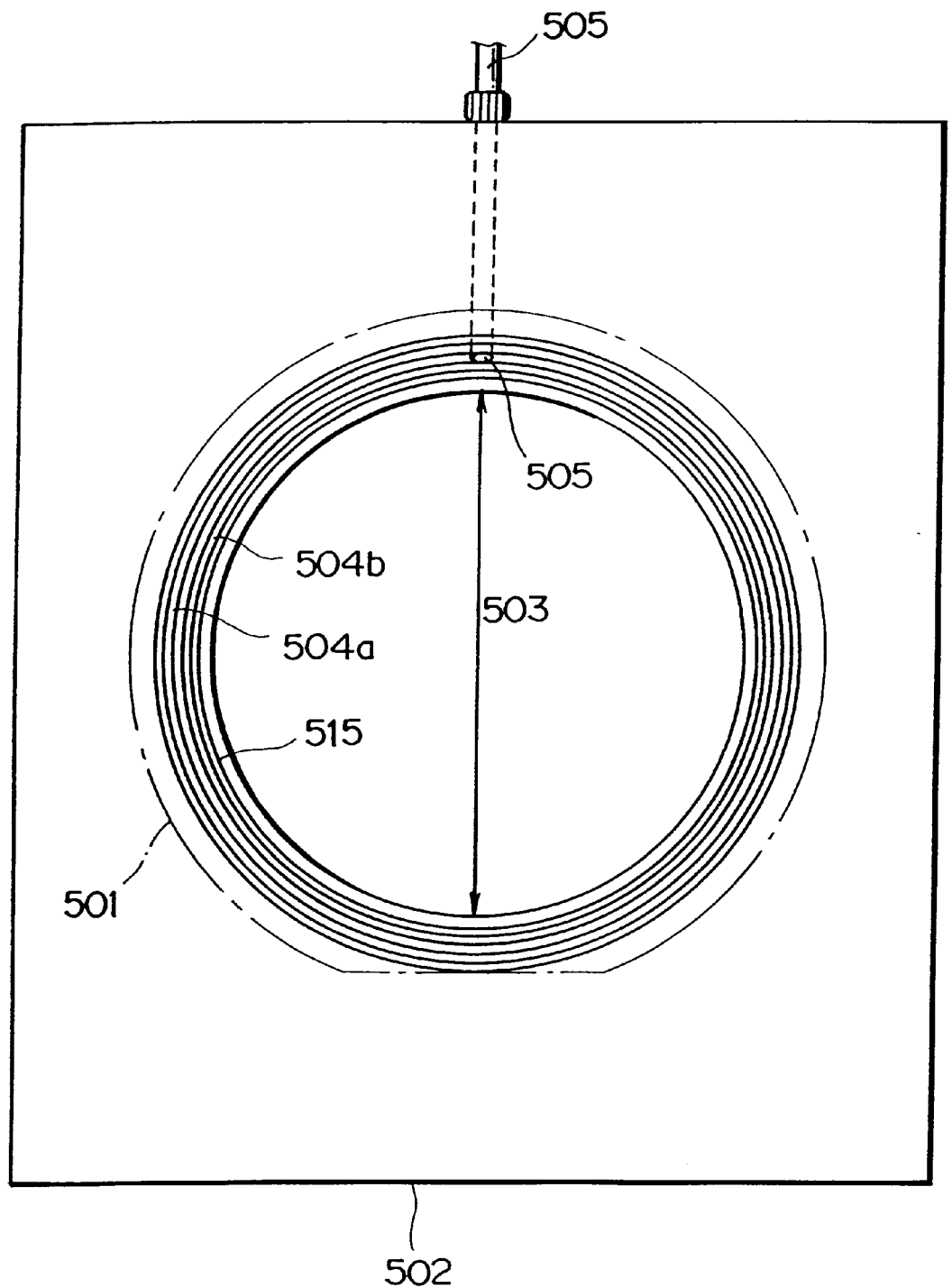
FIG. 5A is a front view of a holder according to the second arrangement of the first embodiment.
Figure 5B:
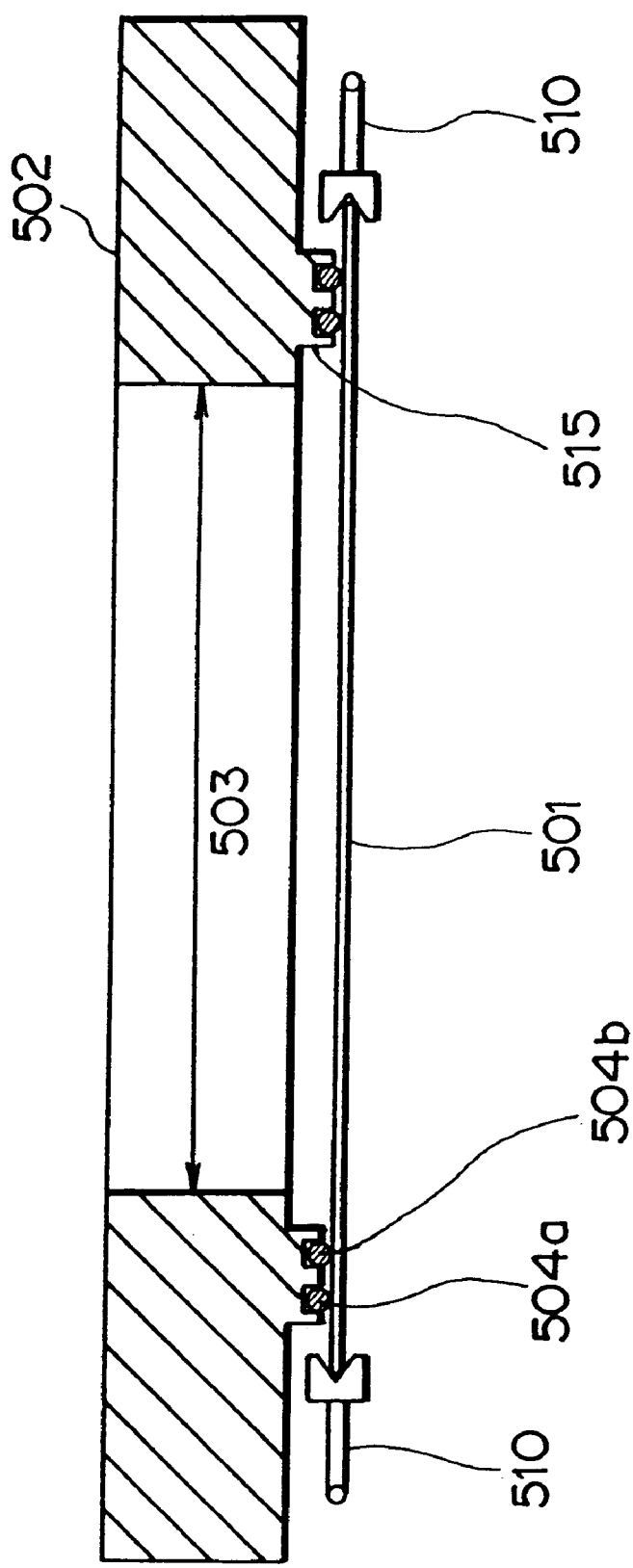
FIG. 5B is a sectional view of the holder according to the second arrangement of the first embodiment.
Figure 6:
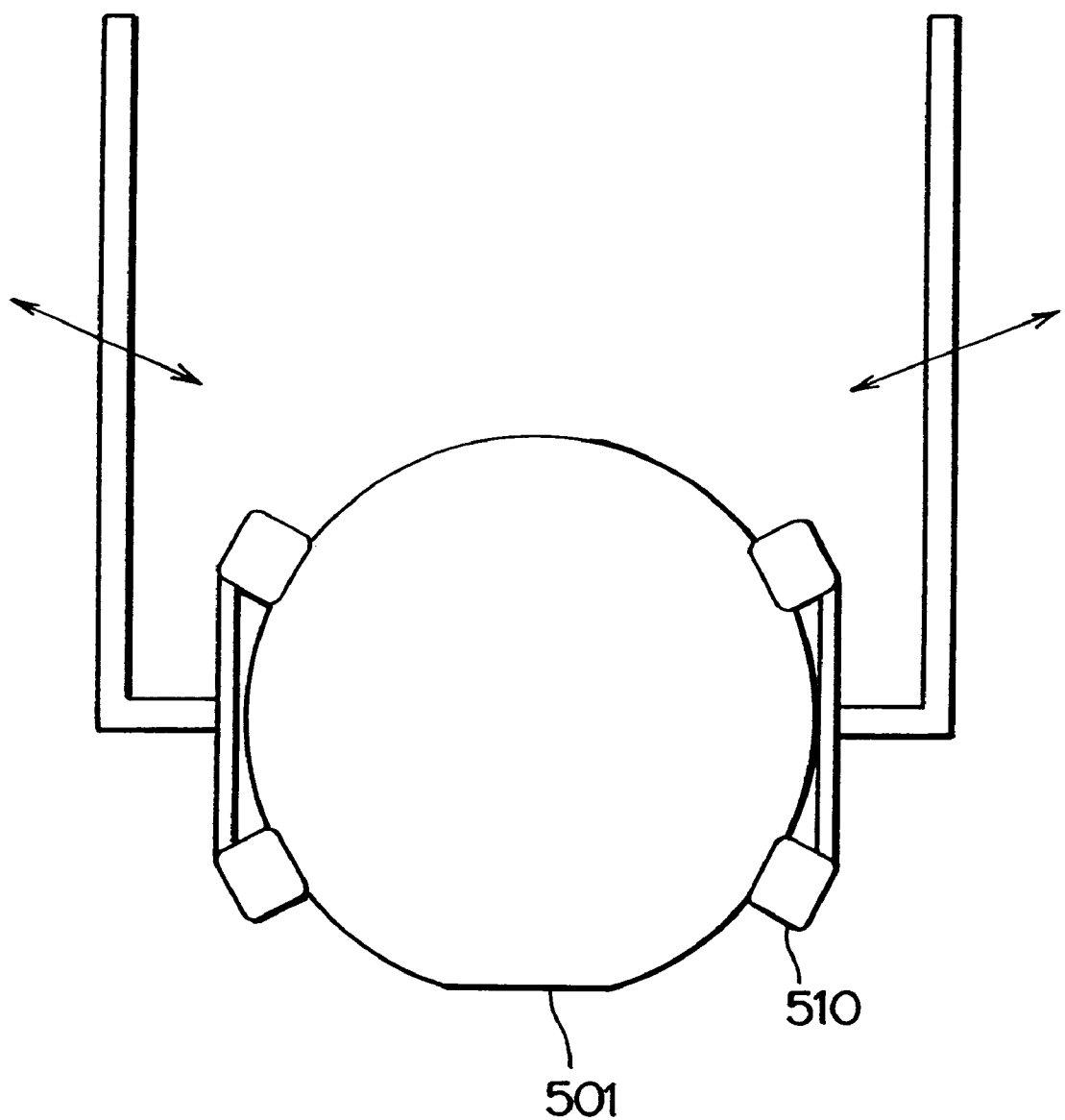
FIG. 6 is a view schematically showing a wafer convey robot for setting a silicon substrate on the holder.

FIG. 5A is a front view of a holder according to the second arrangement of this embodiment. FIG. 5B is a cross-sectional view of the holder shown in FIG. 5A. FIG. 6 is a view schematically showing a wafer convey robot for setting a silicon substrate on the holder.

Reference numeral 501 denotes a 5-in. silicon substrate to be anodized; and 502, a holder made from an ethylene tetrafluoride resin. An opening 503 with a diameter of 90 mm is formed in the center of the holder 502. An annular projecting portion 515 is so formed on the holder 502 as to project from its major surface by about 4 mm. Two circular grooves constituting a double structure are formed in this projecting portion 515, and O-rings 504a and 504b made from perfluoroethylene based on a fluorine resin are fitted in these grooves. The inner diameter of the outer O-ring 504a is 117 mm, the inner diameter of the inter O-ring 504b is 108 mm, and the diameter of the section of each O-ring is 2.5 mm.

Between the outer O-ring 504a and the inter O-ring 504b, a suction hole 505 for reducing a pressure in the space defined by these two O-rings and the silicon substrate 501 is formed. To hold the silicon substrate 501 by suction, it is only necessary to reduce a pressure in the space between the O-rings by a pump (not shown) connected to the suction hole 505.

The projecting portion 515 is formed to help automatically perform operations of setting and removing the silicon substrate 501 onto and from the holder 502 by using a wafer convey robot. A clamp unit 510 of the wafer convey robot grips the silicon substrate 501 by clamping it, so the clamp unit 510 has a considerable width. Therefore, the projecting portion 515 is necessary to set and remove the silicon substrate 501 clamped by the clamp unit 510 onto and from the holder 502. Note that the height of the projection of the projecting portion 515 can be determined on the basis of, e.g., the structure and dimensions of the clamp unit 510.

The formation of the projecting portion 515 allows easy automation by the wafer convey robot. Even when an anodizing bath and a holder are integrated, a silicon substrate can be easily attached and detached by the wafer convey robot.

Figure 7:
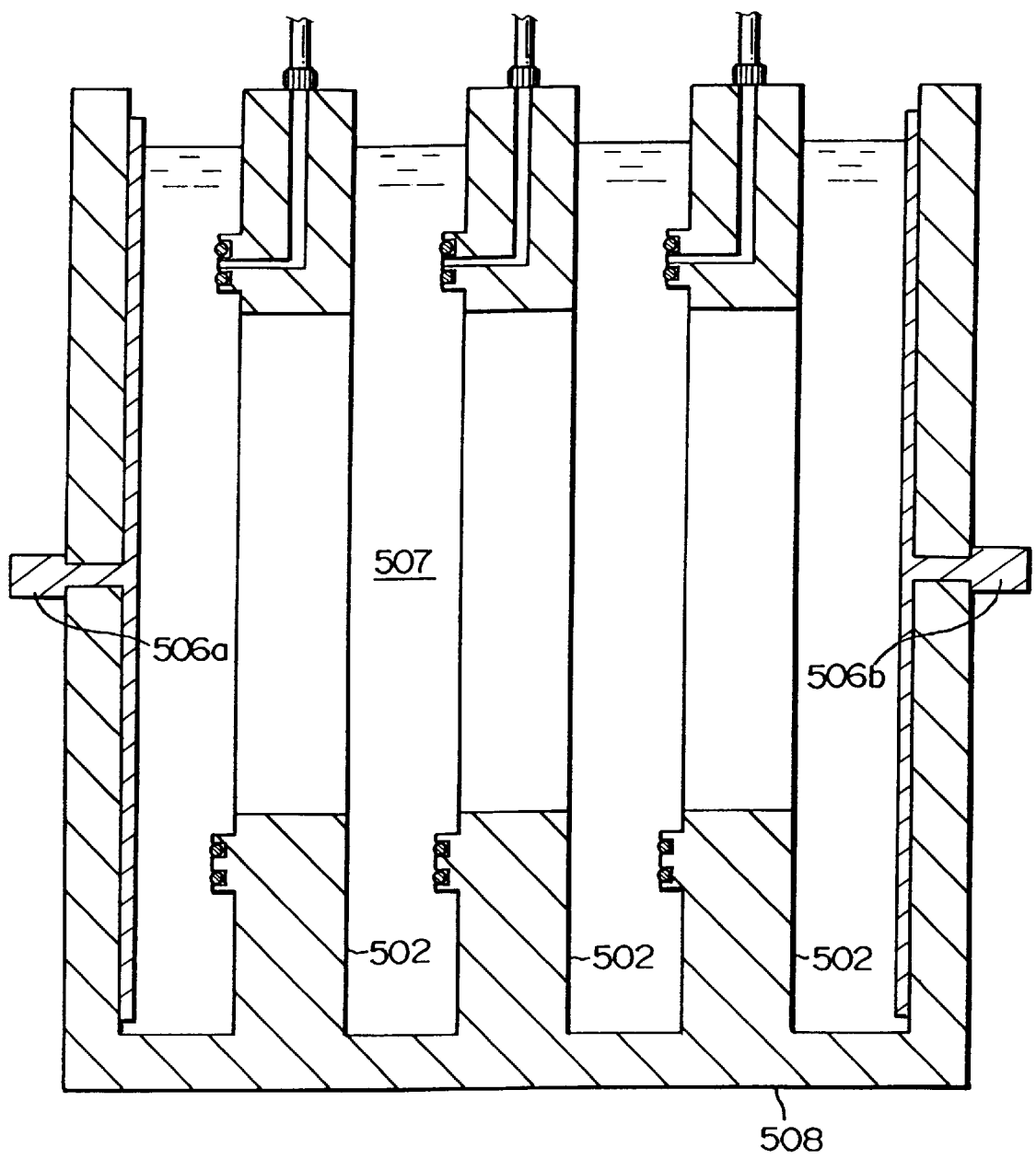
FIG. 7 is a sectional view showing the structure of an anodizing bath integrated with holders.

FIG. 7 is a sectional view showing the structure of an anodizing bath integrated with holders. Reference numeral 508 denotes the main body of the anodizing bath integrated with a plurality of holders 502; and 506a and 506b, platinum electrodes. Integrating the anodizing bath with the holders in this manner decreases the possibility of an HF solution 507 leaking (from positive to negative) before and after compartments partitioned by these holders 502. The result is an effect of suppressing a phenomenon in which the distribution of a porous layer thickness becomes nonuniform due to a solution leak (current leak).

Note that the holders are arranged in series in this example of an anodizing bath, but the holders can also be arranged parallel or in a matrix manner.

Silicon substrates are set in the anodizing bath shown in FIG. 7, and a DC voltage is applied by using the platinum electrode 206a as a negative electrode and the platinum electrode 206b as a positive electrode. This anodizes the entire region of the front surface and the rear surface peripheral portion of each silicon substrate. Consequently, a porous silicon layer can be formed over the entire front surface and the rear surface peripheral portion of the silicon substrate 501.

[Third Arrangement]

Figure 8:
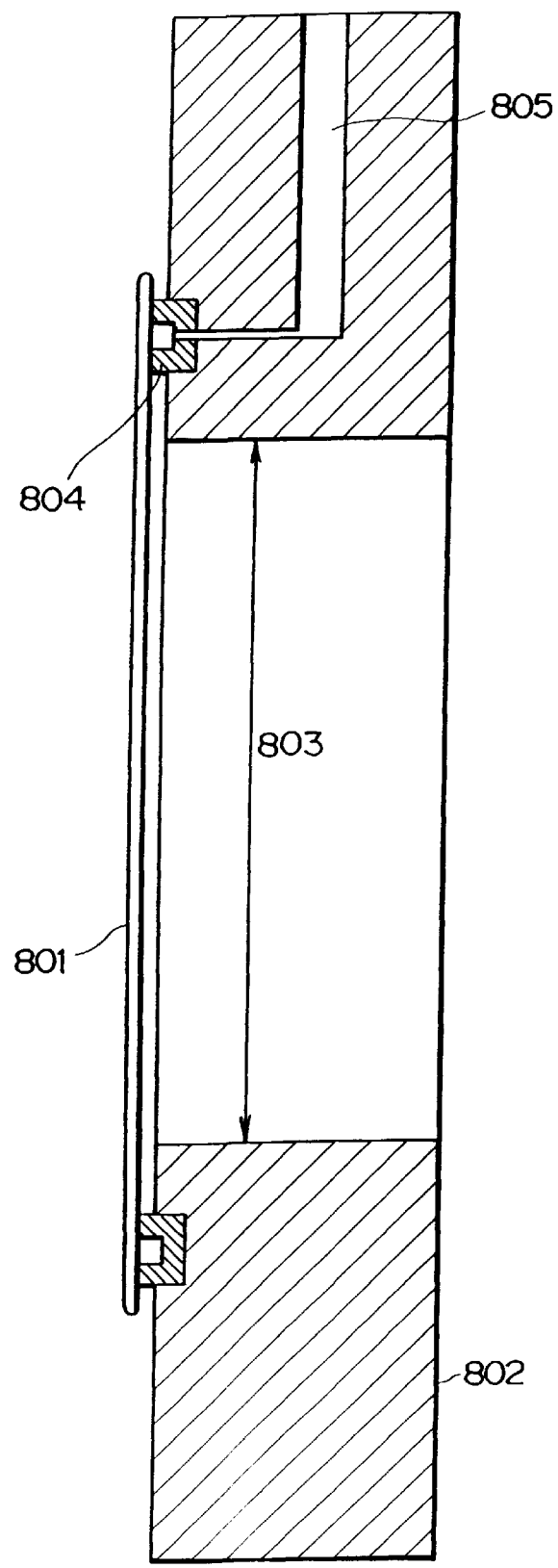
FIG. 8 is a sectional view of a holder according to the third arrangement of the first embodiment.

FIG. 8 is a sectional view of a holer according to the third arrangement of this embodiment. This holder can be used in combination with, e.g., the anodizing bath 208 or 208' according to the first arrangement.

Reference numeral 801 denotes a silicon substrate to be anodized; and 802, a holder made from an ethylene tetrafluoride resin. An opening 803 is formed in the center of the holder 802. A circular groove is formed along the edge of the opening 803, and a suction pad 804 made from perfluoroethylene and having a concave section is fitted in this groove. A hole connecting to a suction hole 805 is formed in the suction pad 804.

Note that the concave suction pad 804 can also be adhered to the surface of the holder 802 without forming any groove in the holder 802. Note also that the concave suction pad 804 can be formed such that the surface (suction surface) of the suction pad 804 in contact with the silicon substrate 801 and the surface of the holder 801 are separated by a predetermined distance (e.g., 4 mm). This facilitates automating the attaching and detaching using the wafer convey robot as described above.

The silicon substrate 801 is held by suction by the holder 802 when a pressure in the interior of the concave suction pad 804 is reduced by a pump (not shown) through the suction hole 805. When this suction pad 804 is used, the volume of the reduced pressure portion can be increased more easily than when the double O-ring described previously is used. Also, since the degree of freedom of the portion in contact with the silicon substrate 801 increases, the degree of freedom of a point at which the silicon substrate 801 is held by suction can be increased.

[Fourth Arrangement]

Figure 9:
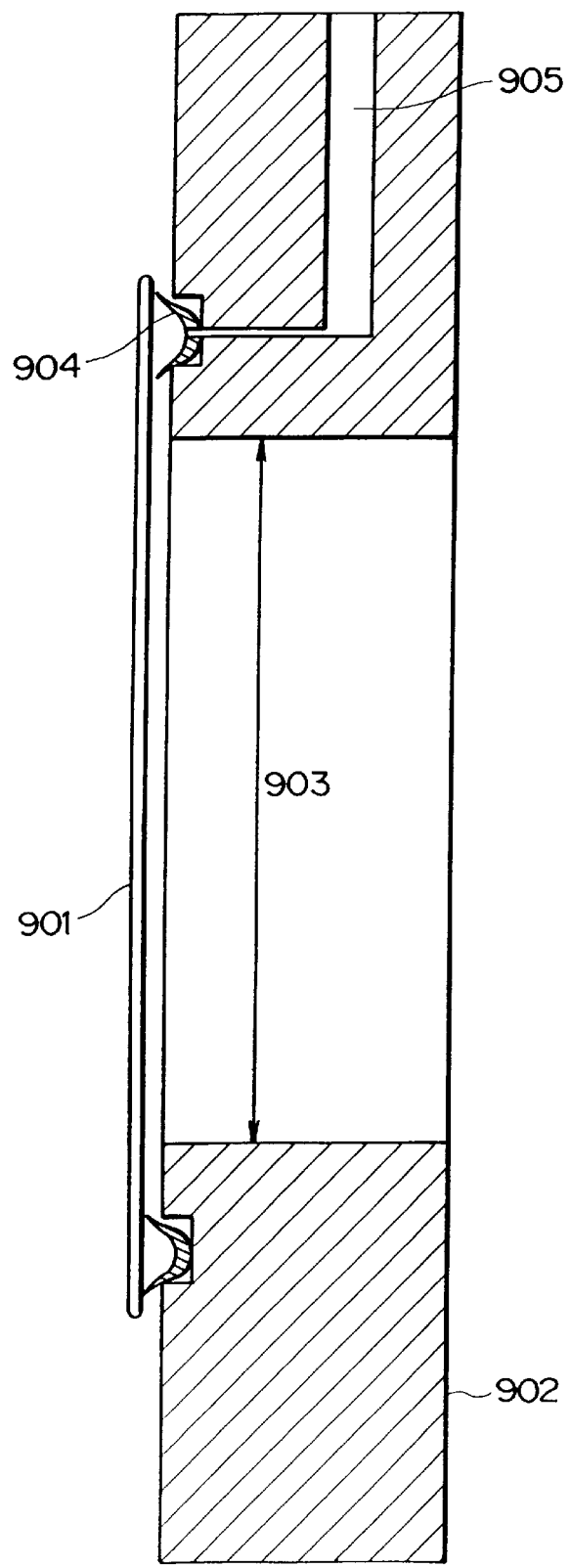
FIG. 9 is a sectional view of a holder according to the fourth arrangement of the first embodiment.

FIG. 9 is a sectional view of a holder according to the fourth arrangement of this embodiment. This holder can be used in combination with, e.g., the anodizing bath 208 or 208' according to the first arrangement.

Reference numeral 901 denotes a silicon substrate to be anodized; and 902, a holder made from an ethylene tetrafluoride resin. An opening 903 is formed in the center of the holder 902. A circular groove is formed along the edge of the opening 903, and a suction pad 904 made from perfluoroethylene and having a U-shaped section is fitted in this groove. The thickness of this suction pad 904 gradually decreases toward a portion in contact with the silicon substrate 901. A hole connecting to a suction hole 905 is formed in the suction pad 904.

Note that the U-shaped suction pad 904 can also be adhered to the surface of the holder 902 without forming any groove in the holder 902. Note also that the U-shaped suction pad 904 can be formed such that the surface (suction surface) of the suction pad 904 in contact with the silicon substrate 901 and the surface of the holder 901 are separated by a predetermined distance (e.g., 4 mm). This facilitates automating the attaching and detaching using the wafer convey robot as described above.

As described above, the suction pad 904 is so formed that the sectional shape is a U shape and the thickness gradually decreases toward the distal end portion. This further improves the degree of freedom in holding the silicon substrate 901 by suction.

[Fifth Arrangement]

Figure 10:
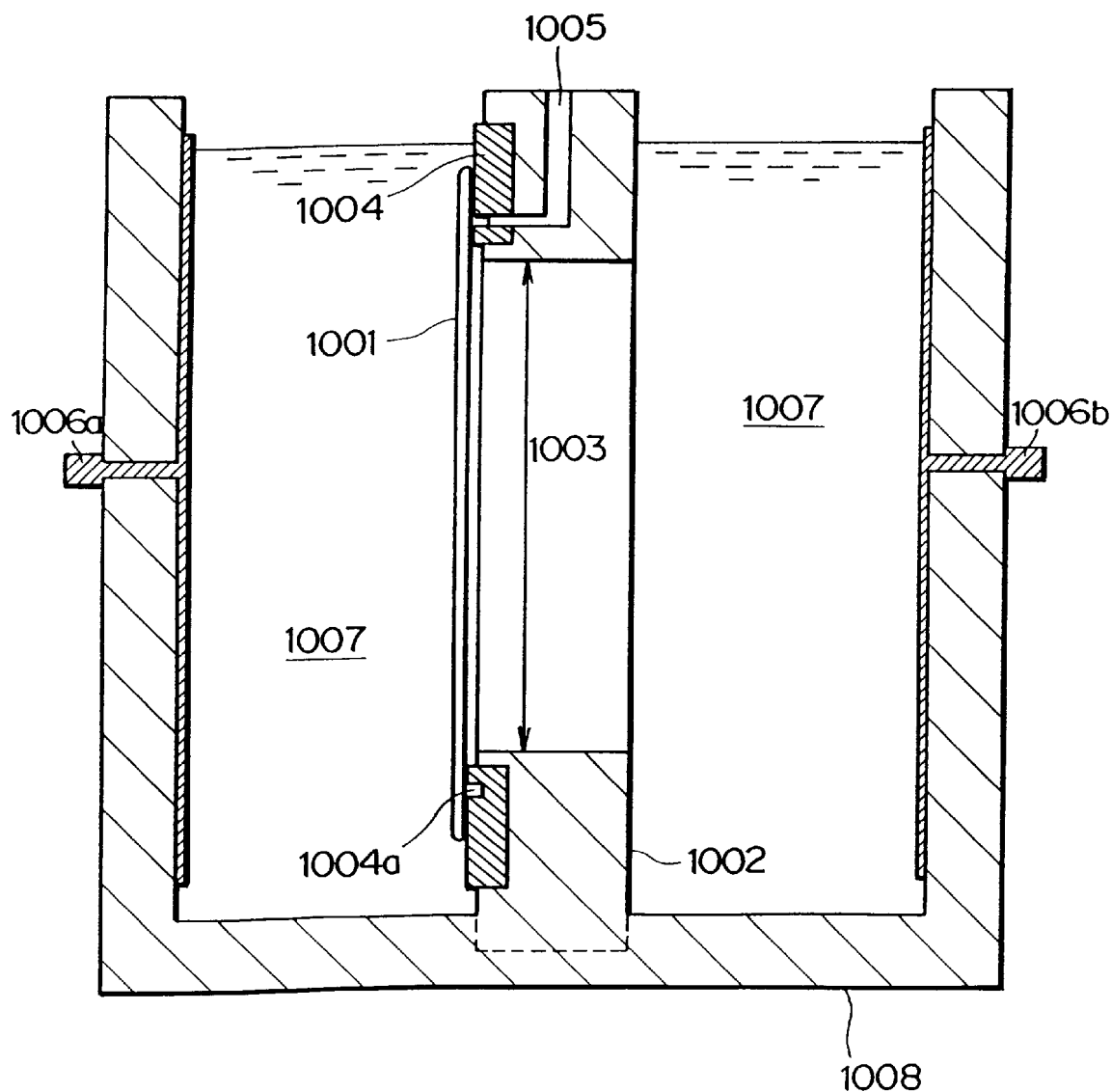
FIG. 10 is a schematic sectional view of a holder and an anodizing bath according to the fifth arrangement of the first embodiment.

FIG. 10 is a schematic sectional view of a holder and an anodizing bath according to the fifth arrangement of this embodiment. Reference numeral 1001 denotes a silicon substrate to be anodized; 1002, a holder made from an ethylene tetrafluoride resin; and 1008, an anodizing bath which is also made from an ethylene tetrafluoride resin. Although the holder 1002 and the anodizing bath 1008 are integrated in FIG. 10, they can also be separated. Also, the anodizing bath 1008 can include a plurality of holders 1002.

An opening 1003 is formed in the center of the holder 1002. A circular groove is formed along this opening 1003, and a suction pad 1004 made from perfluoroethylene based on a fluorine resin is fitted in the groove. This suction pad 1004 has a flat suction surface so that the suction pad 1004 is in surface contact with the silicon substrate 1001 to be held by suction. A circular groove 1004a is formed and connected to a suction hole 1005. To hold the silicon substrate 1001 by suction, a pressure in the space in the groove 1004a is reduced by a pump (not shown) through the suction hole 1005.

When anodization is performed by applying a DC voltage by using a platinum electrode 1006a as a negative electrode and a platinum electrode 1006b as a positive electrode while the silicon substrate 1001 is held by suction, only the front surface of the silicon substrate 1001 is anodized, and its rear surface is left unanodized. This is so because the suction pad 1004 is brought into tight contact with the rear surface of the silicon substrate 1001, so the rear surface does not contact an HF solution 1007. That is, when anodization is performed by using this anodizing apparatus, only the front surface of the silicon substrate 1001 is made porous, and no porous layer is formed on the rear surface. Accordingly, an effective region (e.g., a region usable when an SOI substrate is to be formed) can be enlarged.

An example of a wafer convey robot for automatically attaching and detaching the silicon substrate 1001 to and from the holder 1002 will be described below. When the holder according to this arrangement is used, a wafer convey robot such as shown in FIG. 6 is difficult to use because the clamp unit 510 abuts against the holder 1002 or the suction pad 1004.

Figure 11:
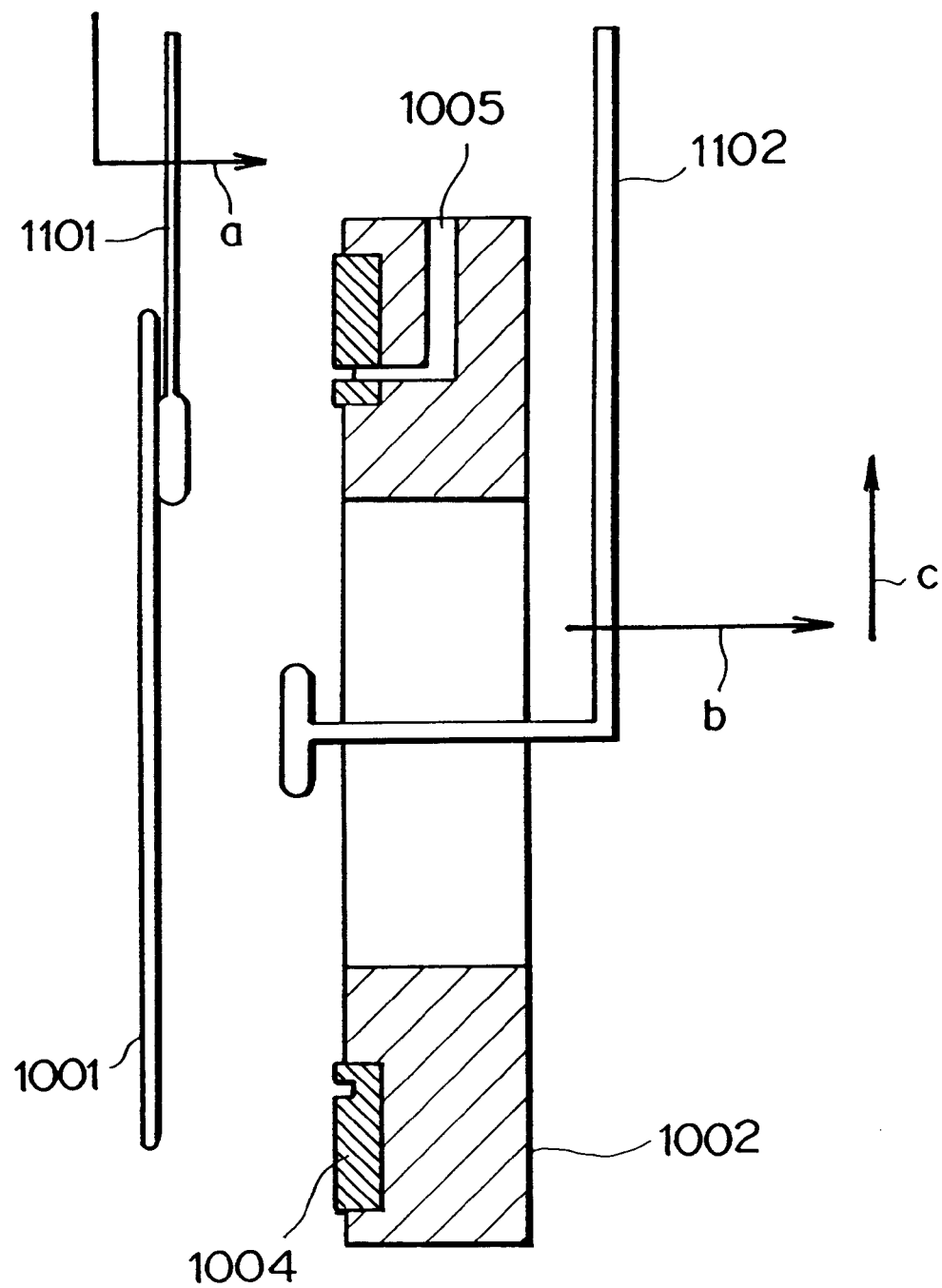
FIG. 11 is a view schematically showing the structure of a single wafer convey robot suited to the holder according to the fifth arrangement of the first embodiment.

FIG. 11 is a view schematically showing the arrangement of a single wafer convey robot suitable for this arrangement. This wafer convey robot is made by combining two wafer convey robots 1101 and 1102.

The first robot 1101 holds the rear surface of the silicon substrate 1001 by vacuum suction. As indicated by an arrow a, the first robot 1101 conveys the silicon substrate 1001 to the vicinity of the front surface of the holder 1002 and transfers the silicon substrate 1001 to the second convey robot 1102. When the second convey robot 1102 holds the silicon substrate 1001 by vacuum suction, the first convey robot 1101 once moves up in FIG. 11 and then moves away from the anodizing bath in the opposite direction to the arrow a.

After holding the rear surface of the silicon substrate 1001 by vacuum suction, the second convey robot 1102 conveys the silicon substrate 1001 as indicated by an arrow b. The silicon substrate 1001 is brought into contact with the suction pad 1004 and held by suction by the suction pad 1004. Thereafter, the second convey robot 1102 further moves in the direction of the arrow b and then moves up as indicated by an arrow c to move away from the anodizing bath.

Prior to conveying the silicon substrate 1001, the second convey robot 1102 moves in the opposite directions to the arrows c and b to the position (shown in FIG. 11) where the second convey robot 1102 holds the silicon substrate 1001 by vacuum suction.

The use of the wafer convey robot which performs the operation as described above makes the automation of anodization feasible even when a holder having a flat suction pad is used.

Note that a convey robot having a clamp unit as shown in FIG. 6 is also usable as the first convey robot.

[Sixth Arrangement]

The holders according to the first to fifth arrangements described above hold a silicon substrate by suction by using a suction unit such as a double circular O-ring or a suction pad formed along an opening. The advantages of structures like this are that the structures are simple and a silicon substrate and a holder can be substantially completely sealed.

Figure 12A:
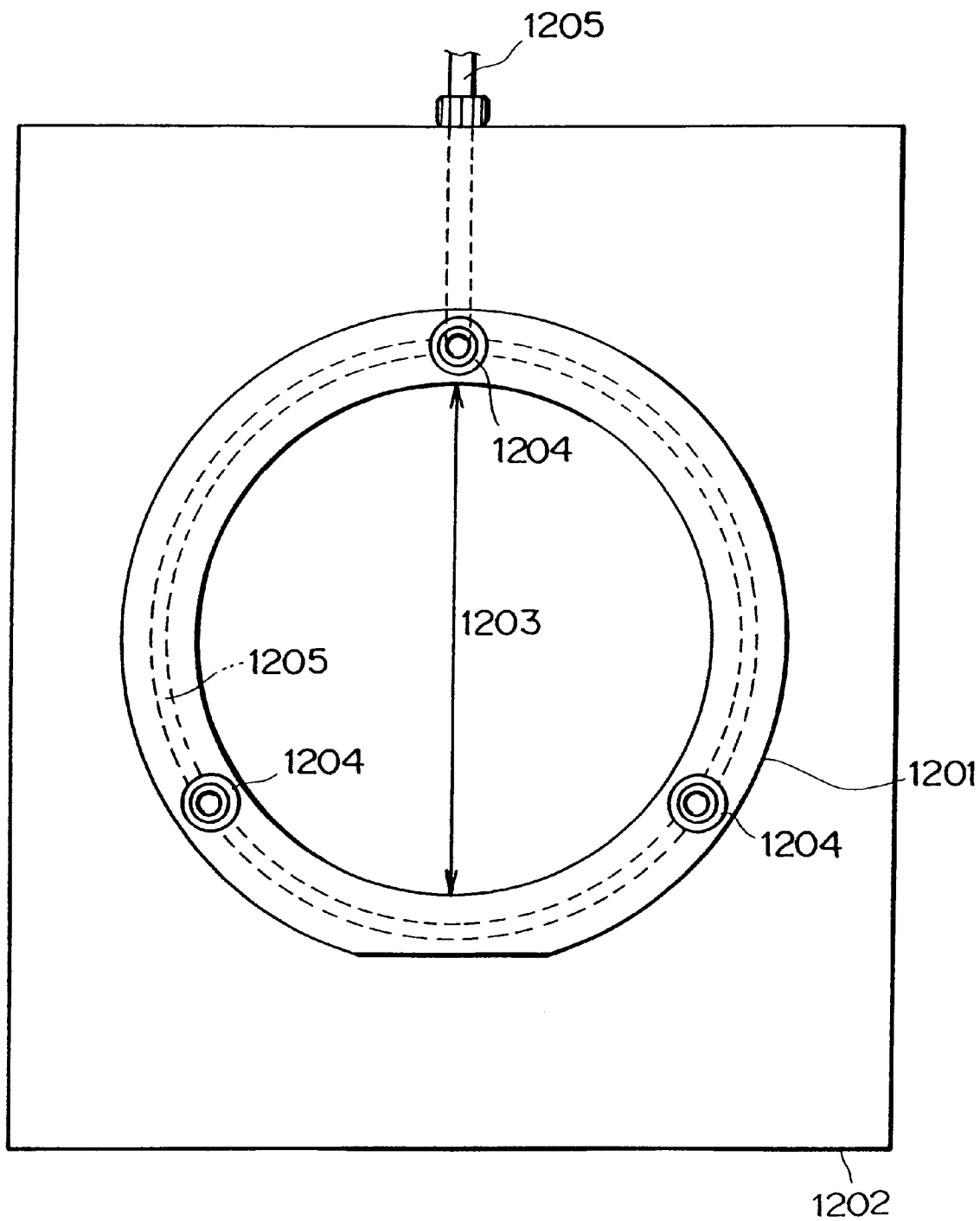
FIG. 12A is a front view of a holder according to the sixth arrangement of the first embodiment.

The present invention, however, does not exclude mechanisms other than an annular suction mechanism arranged along an opening. FIG. 12A is a front view of a holder according to the sixth arrangement of the present invention. This holder 1202 has a plurality of separate O-rings 1204. A silicon substrate 1201 is held by suction by reducing pressures in the spaces surrounded by these O-rings by a pump (not shown) through a suction hole 1205.

Figure 12B:
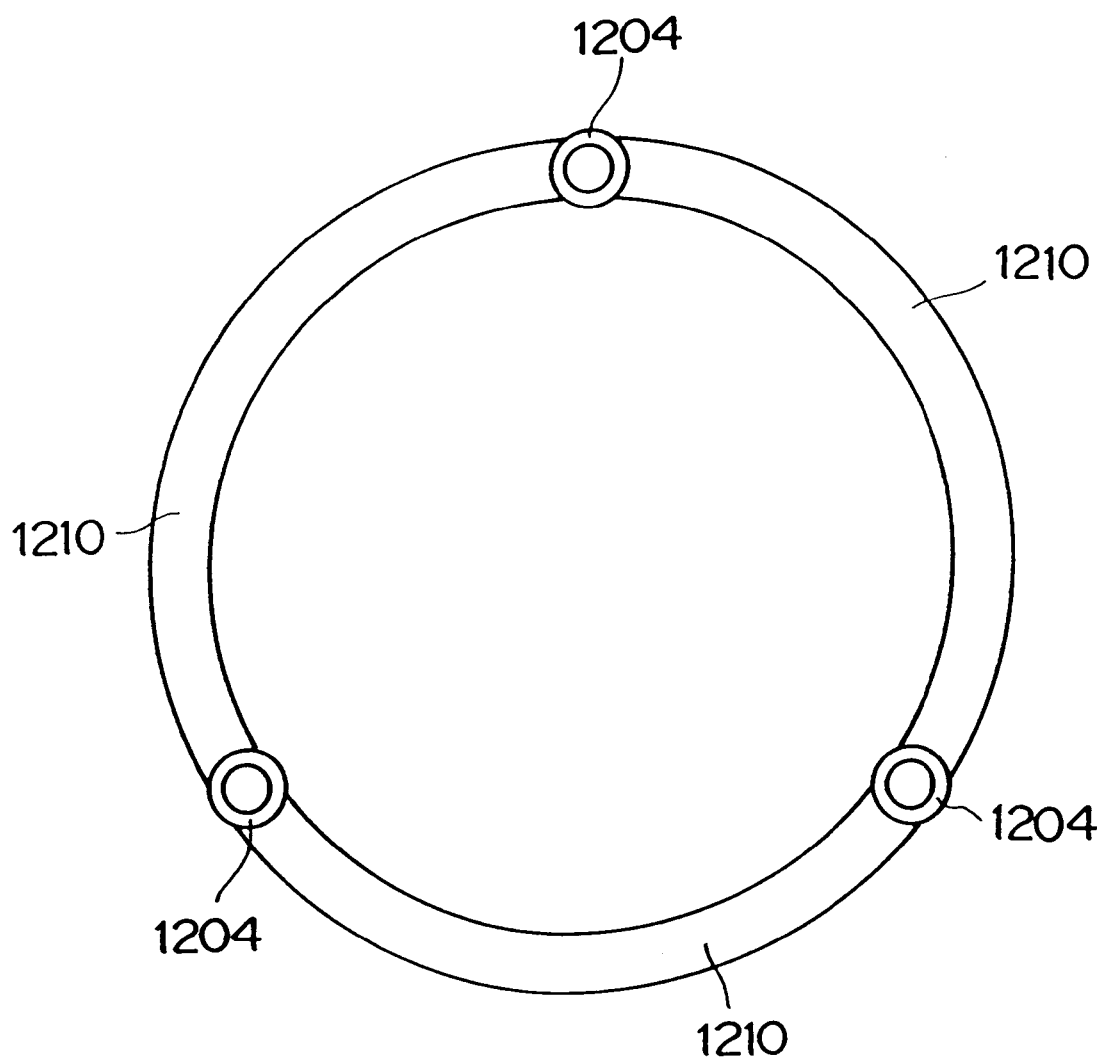
FIG. 12B is a view showing the construction of a suction unit of the holder according to the sixth arrangement of the first embodiment.

In the arrangement shown in FIG. 12A, an HF solution moves between the front and rear surfaces of a silicon substrate through portions where the O-rings 1204 are not formed. As shown in FIG. 12B, therefore, it is preferable to form seal members 1210 for sealing the portions where the O-rings 1204 are not formed. The seal members 1210 are preferably made from, e.g., perfluoroethylene based on a fluorine resin.

[Seventh Arrangement]

Figure 13:
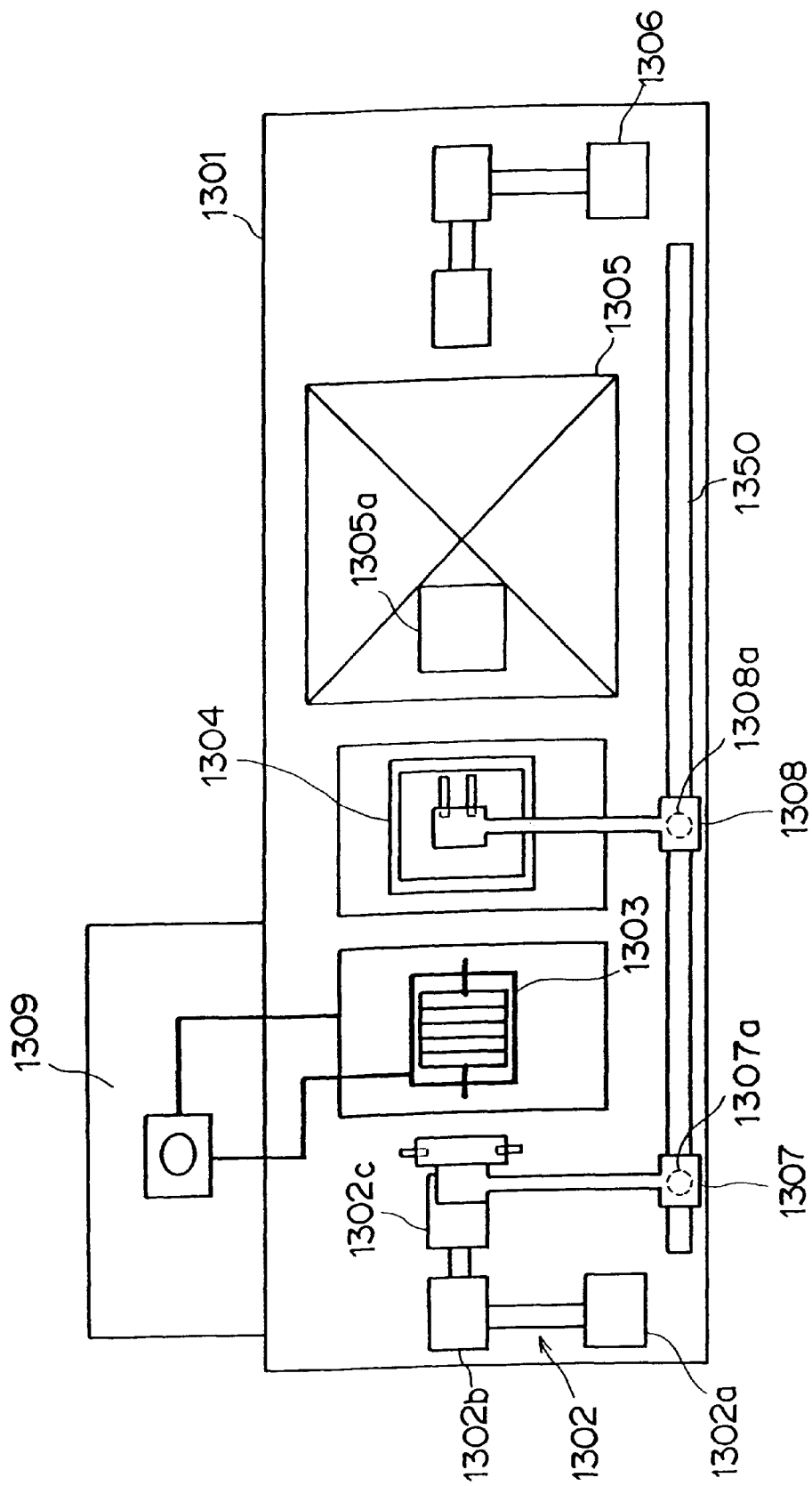
FIG. 13 is a schematic plan view showing one arrangement of an automatic anodizing apparatus according to the first embodiment.

FIG. 13 is a schematic plan view of an automatic anodizing apparatus. Reference numeral 1301 denotes an automatic anodizing apparatus main body. The operation of this anodizing apparatus is controlled by, e.g., a computer. A loader 1302 has a function of moving a wafer carrier placed on the loader 1302 to a position where a single wafer convey robot 1307 can grasp a wafer. The wafer convey robot 1307 has a function of clamping the edge of a wafer as shown in FIG. 6. To this end, a holder of an anodizing bath 1303 has, e.g., a projecting portion as shown in FIGS. 5A and 5B, which prevents a clamp unit 510 of the wafer convey robot 1307 from contacting the major surface of the holder. The anodizing bath 1303 is integrated with holders as shown in FIG. 7. In this constitution, twenty-five holders are arranged in series. Accordingly, the anodizing bath 1303 has the ability to simultaneously process twenty-five wafers.

Figure 14:
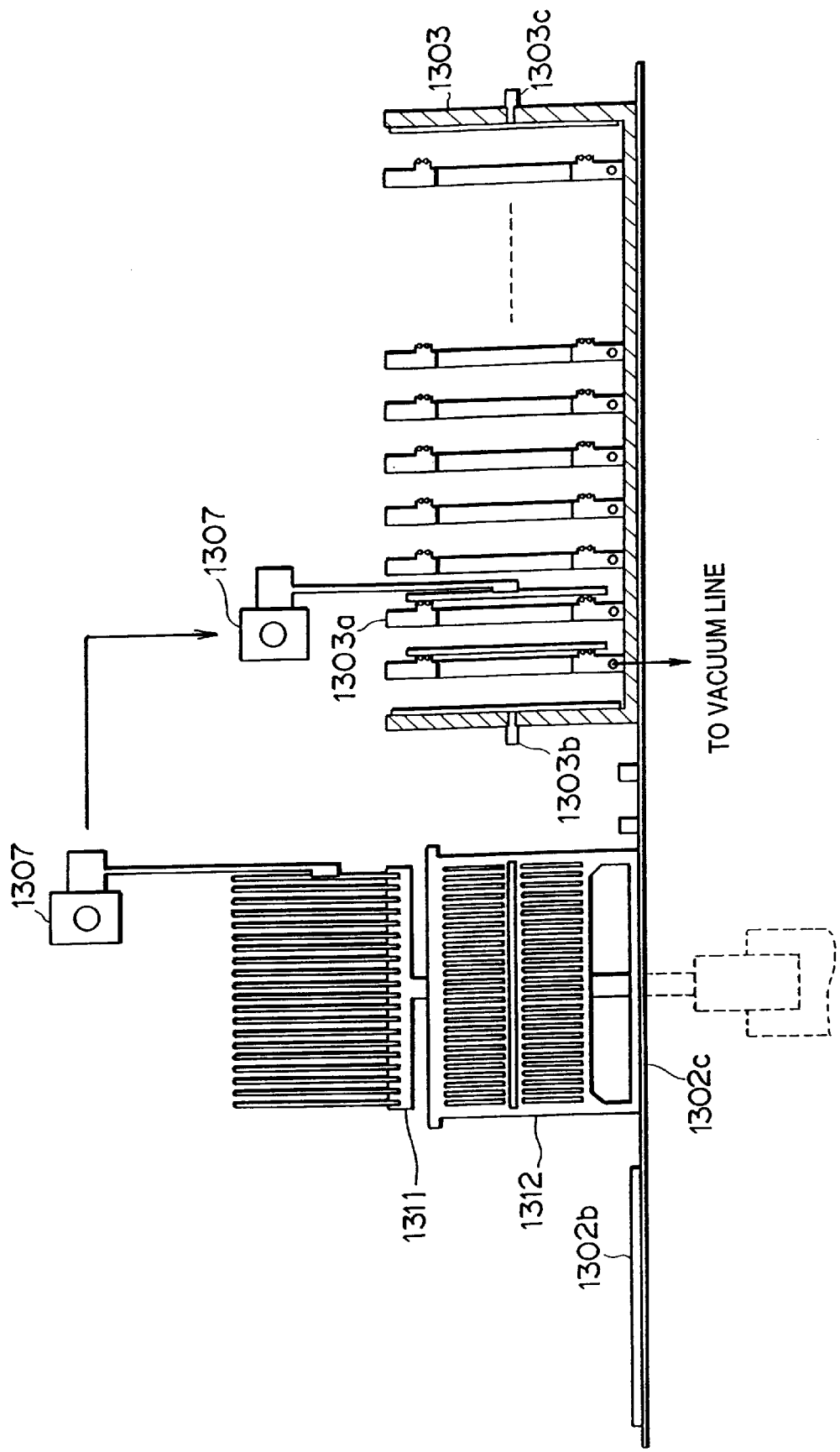
FIG. 14 is a view for explaining the procedure of setting wafers stored in a wafer carrier into an anodizing bath.

FIG. 14 is a view for explaining the procedure of setting wafers stored in a wafer carrier into the anodizing bath 1303. When an operator places a wafer carrier 1312 on a stage 1302a of the loader 1302, the wafer carrier 1312 is automatically conveyed to a stage 1302b and then to a stage 1302c under the control of the computer. Subsequently, a board 1311 with grooves for holding wafers ascends from below the wafer carrier 1312 on the stage 1302c through a window (opening) in the lower portion of the wafer carrier 1312. Consequently, all wafers stored in the wafer carrier 1312 are held by the grooves of the board 1311 and moved up from the wafer carrier 1312 (the state shown in FIG. 14).

In this state, the wafer convey robot 1307 clamps the wafers one after another from the endmost one and conveys each wafer into the anodizing bath 1303. When the wafer is conveyed to a position where the wafer is in contact with the wafer suction surface of a holder 1303a in the anodizing bath 1303, the valve of a vacuum line of the holder 1303a is opened to hold the wafer by suction. When the wafer is held by suction, the wafer convey robot 1307 releases the wafer and sets the next wafer in the next holder following the same procedure. In this manner, all the wafers on the board 1311 are set in the wafer holders 1303a of the anodizing bath 1303.

Anodization is then performed by applying a DC voltage between platinum electrodes 1303b and 1303c formed at the two ends of the anodizing bath 1303.

Figure 15A:
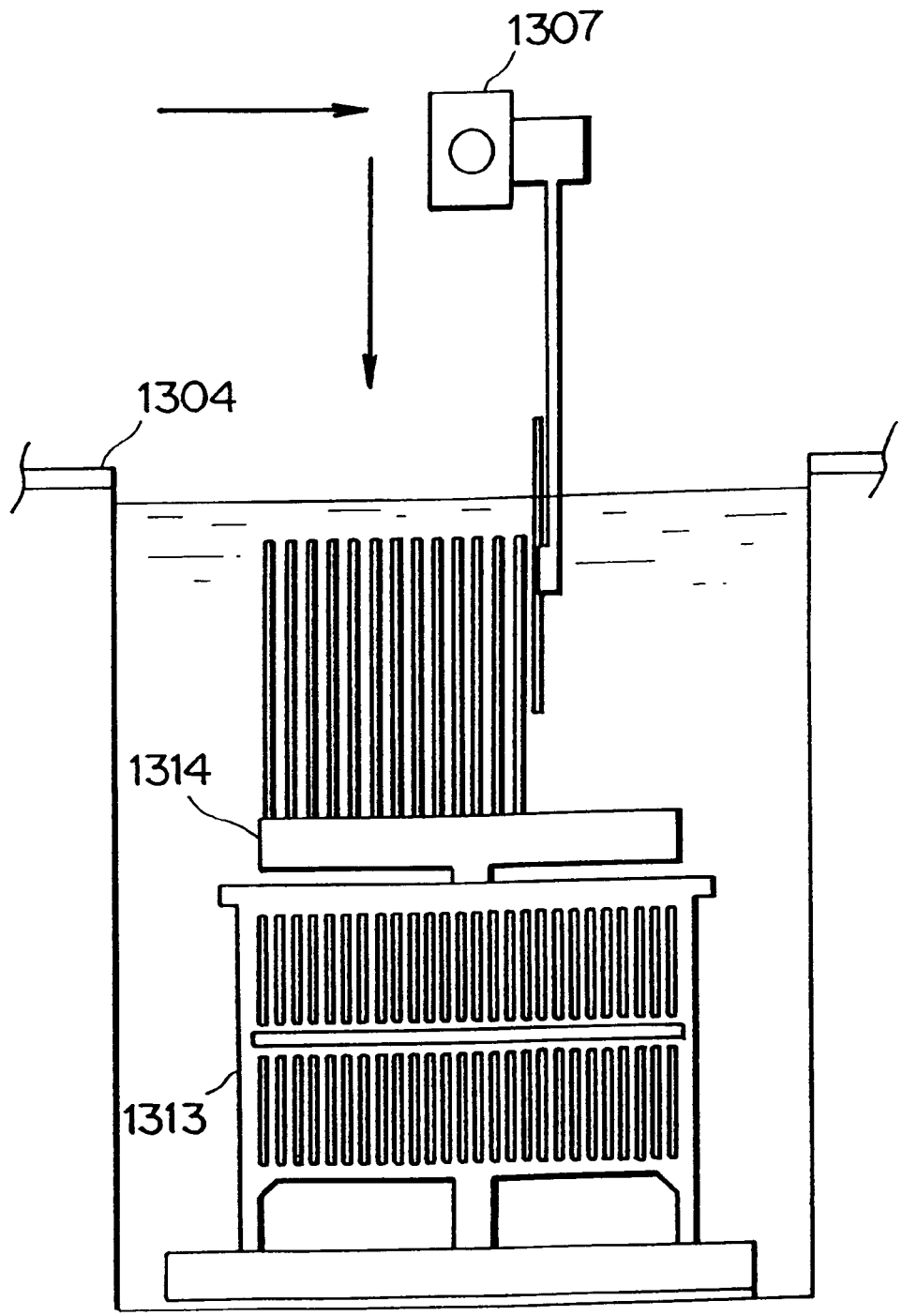
FIG. 15A is a view for explaining the procedure of conveying completely anodized wafers to a washing bath and washing the wafers.
Figure 15B:
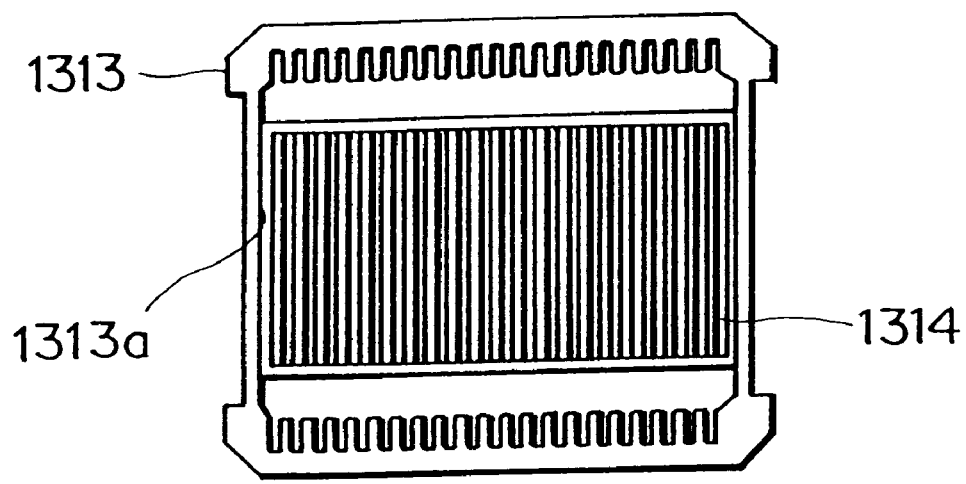
FIG. 15B is a plan view showing the layout of a board and a wafer carrier in the washing bath.
Figure 15C:
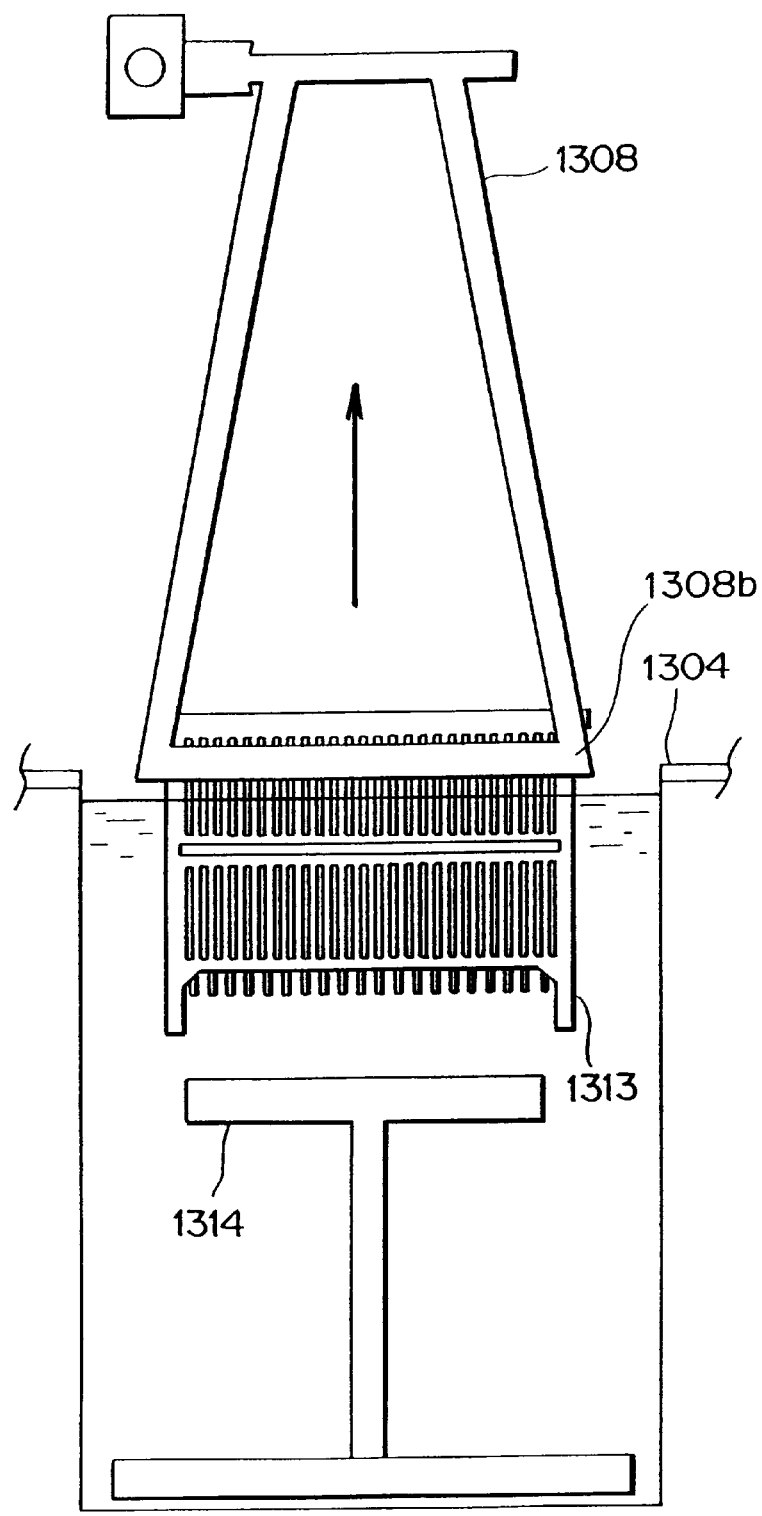
FIG. 15C is a view for explaining the procedure of storing completely washed wafers into a wafer carrier and removing the wafers from the washing bath.

Subsequently, the completely anodized wafers are washed with pure water. FIG. 15A is a view for explaining the procedure of conveying the completely anodized wafers to a washing bath and washing these wafers. FIG. 15B is a plan view showing the layout of a board and a wafer carrier in the washing bath shown in FIG. 15A. FIG. 15C is a view for explaining the procedure of storing the completely washed wafers in a wafer carrier and removing the wafers from the washing bath.

The wafer convey robot 1307 picks up the completely anodized wafers one by one from the anodizing bath 1303 and conveys each wafer in directions indicated by arrows in FIG. 15A. That is, the wafer is first moved to a position above a washing bath 1304 and then dipped into pure water in the washing bath 1304. A board 1314 having twenty-five wafer holding grooves is fixed in the washing bath 1304, and the wafers are set one by one in these grooves.

A wafer carrier 1313 is dipped in the washing bath 1304 in advance. This wafer carrier 1313 has a shape capable of receiving all wafers held in the grooves of the board 1314 by scooping up the wafers when the wafer carrier 1313 is moved up. Also, the wafer carrier 1313 has an opening 1313a which allows the board 1314 to pass through it when the wafer carrier 1313 scoops up the wafers on the board 1314.

When the wafers are completely washed, as shown in FIG. 15C, a carrier convey robot 1308 raises the wafer carrier 1313, stores all the wafers on the board 1314 into the wafer carrier 1313, and conveys the wafer carrier 1313 to a carrier receiving unit 1305a on a spin dryer 1305. The wafer carrier 1313 is placed on this carrier receiving unit 1305a such that the wafer surfaces point in a direction perpendicular to the moving direction of the carrier convey robot 1308. This state is suited to rotate the wafer carrier 1313 about its axis on the spin dryer 1305.

The wafers dried by the spin dryer 1305 are conveyed, while being kept stored in the wafer carrier 1313, to the stage of an unloader 1306 by the carrier convey robot 1308. By a series of these operations, twenty-five porous wafers are obtained.

In this apparatus, the wafer convey robot 1307 moves vertically along a vertical shaft 1307a and moves horizontally along a horizontal shaft 1350. The carrier convey robot 1308 moves vertically along a vertical shaft 1308a and moves horizontally along the horizontal shaft 1350.

In this automatic anodizing apparatus, the anodizing bath 1303, the washing bath 1304, and the carrier receiving unit 1305a of the spin dryer 1305 are substantially linearly arranged on a plan view, and the wafer surfaces are pointed in a direction perpendicular to the moving direction of the wafer convey robot 1307 and the carrier convey robot 1308. This improves the efficiency of wafer convey between the individual steps (anodization, washing, and drying) and increases the productivity. Additionally, the arrangement can be simplified because the robots are moved only in the two directions as described above.

An HF solution circulation filtration system will be described below. A filter unit 1309 in the circulation filtration system shown in FIG. 13 has a function of circulating and filtering an HF solution overflowing from the anodizing bath 1303 and returning the HF solution to the anodizing bath 1303. This circulation filtration system has a function of removing particles and the like produced in the anodizing bath 1303 and a function of efficiently removing fine bubbles which are produced by an anodization reaction and keep sticking to the wafer surfaces.

Figure 16:
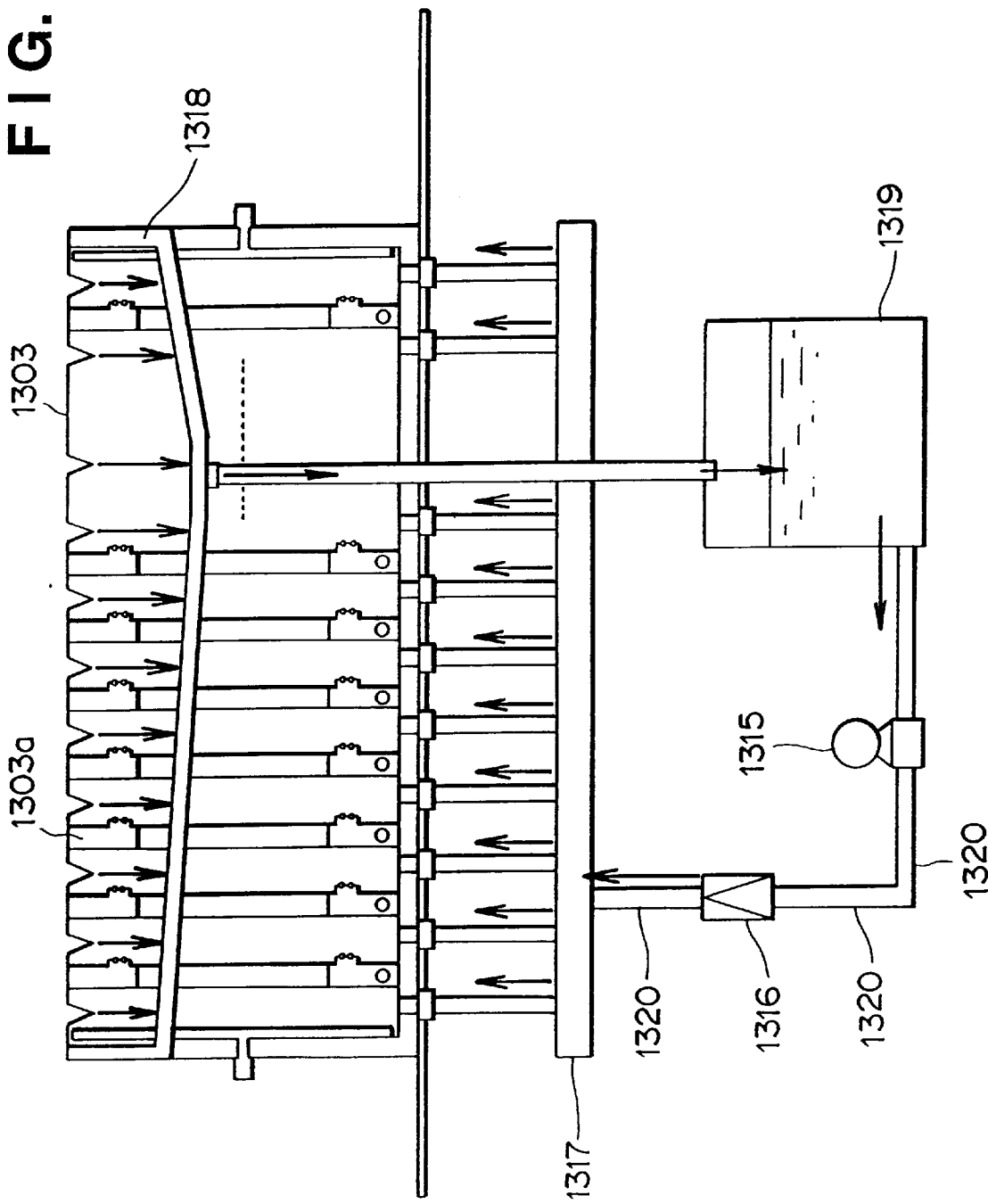
FIG. 16 is a schematic view showing a practical arrangement of a circulation filtration system.
Figure 17:
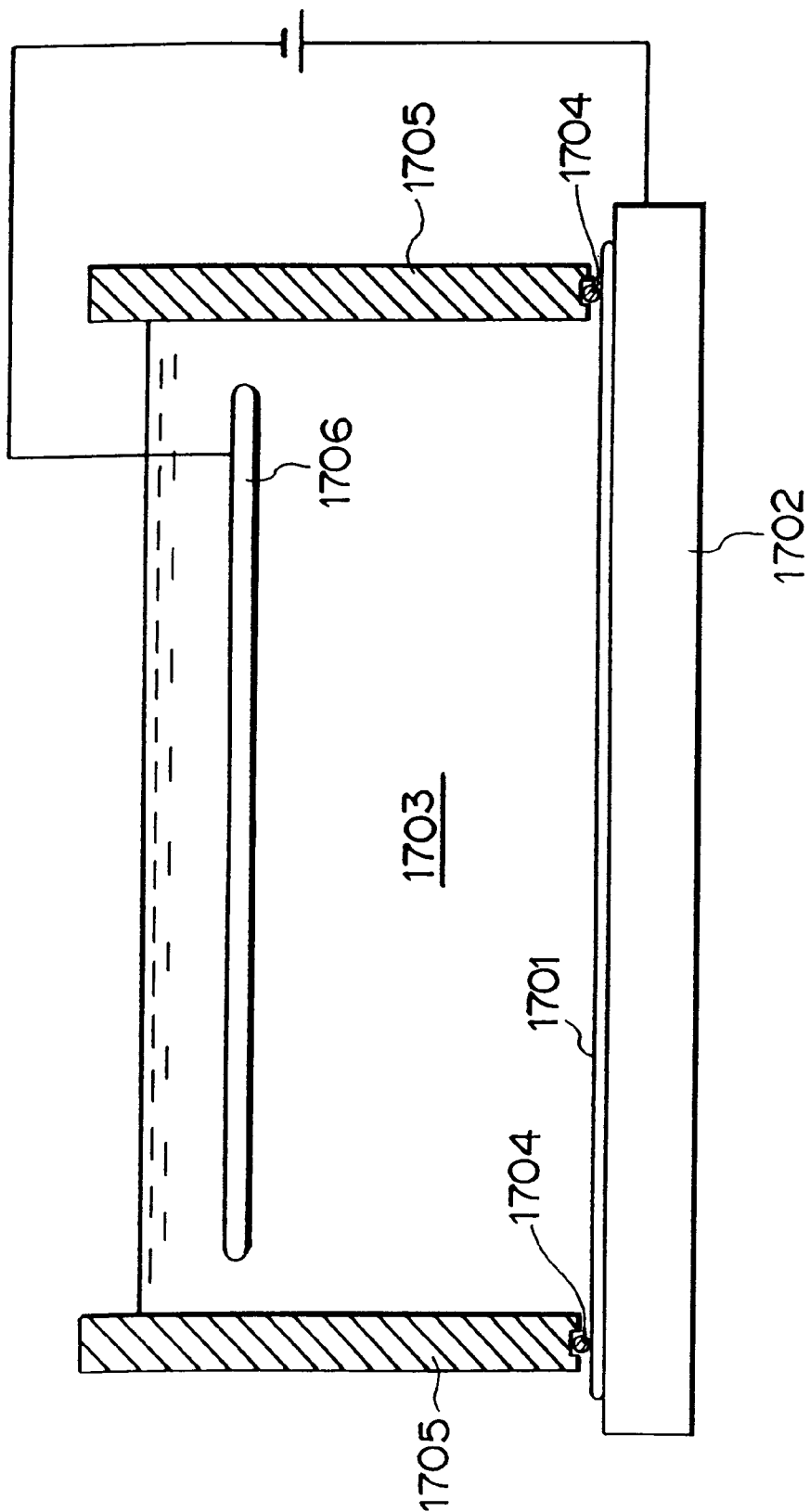
FIG. 17 is a view showing the arrangement of a conventional anodizing apparatus.
Figure 18:
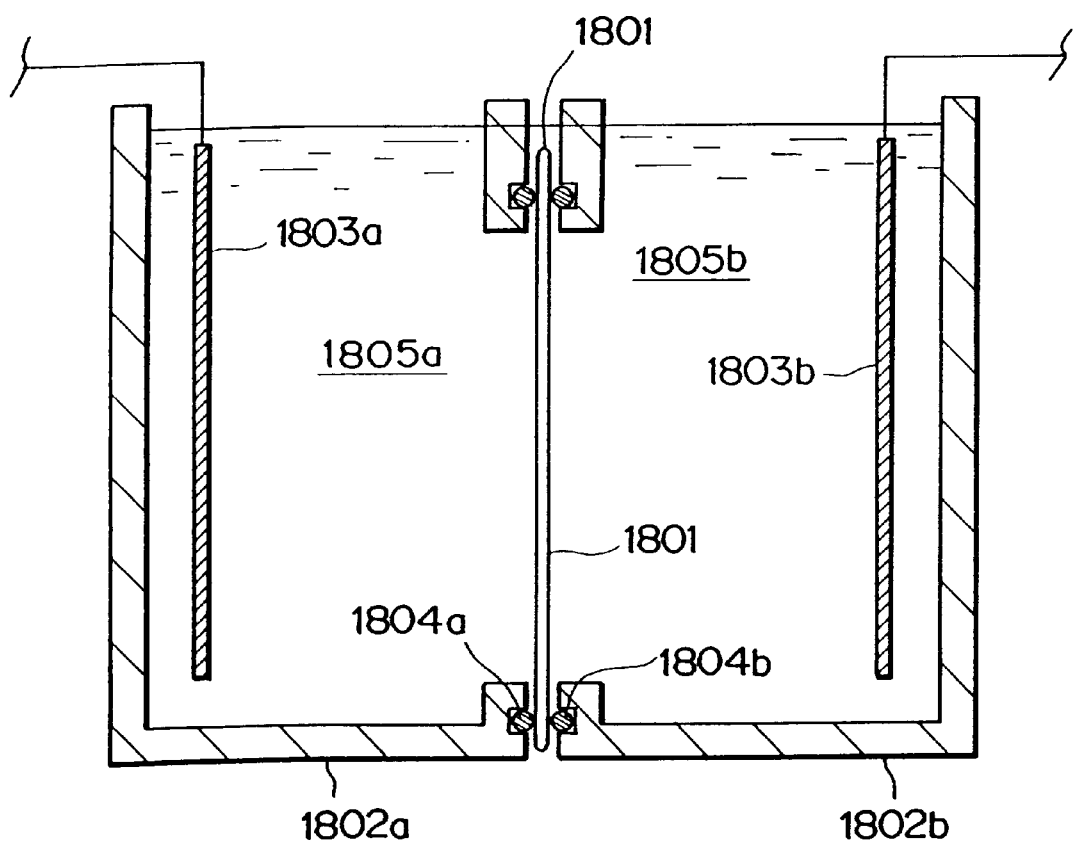
FIG. 18 is a view showing the arrangement of a conventional anodizing apparatus.

FIG. 16 is a schematic view showing a practical arrangement of the circulation filtration system. An HF solution is first stored in a storage tank 1319. The HF solution in the storage tank 1319 is then pushed upward by a pump 1315 through a transfer pipe i320. A filter 1316 is provided midway along the transfer pipe 1320 and removes particles from the HF solution. The HF solution passing through the filter 1316 is distributed to twenty-six lines by a manifold (distributer) 1317 and supplied from the lower portion of the anodizing bath 1303 to compartments partitioned by the twenty-five holders 1303a. An HF solution overflowing from each compartment of the anodizing bath 1303 is once received by an overflow bath 1318 and returned to the storage tank 1319.

[Eighth Arrangement]

Figure 19:
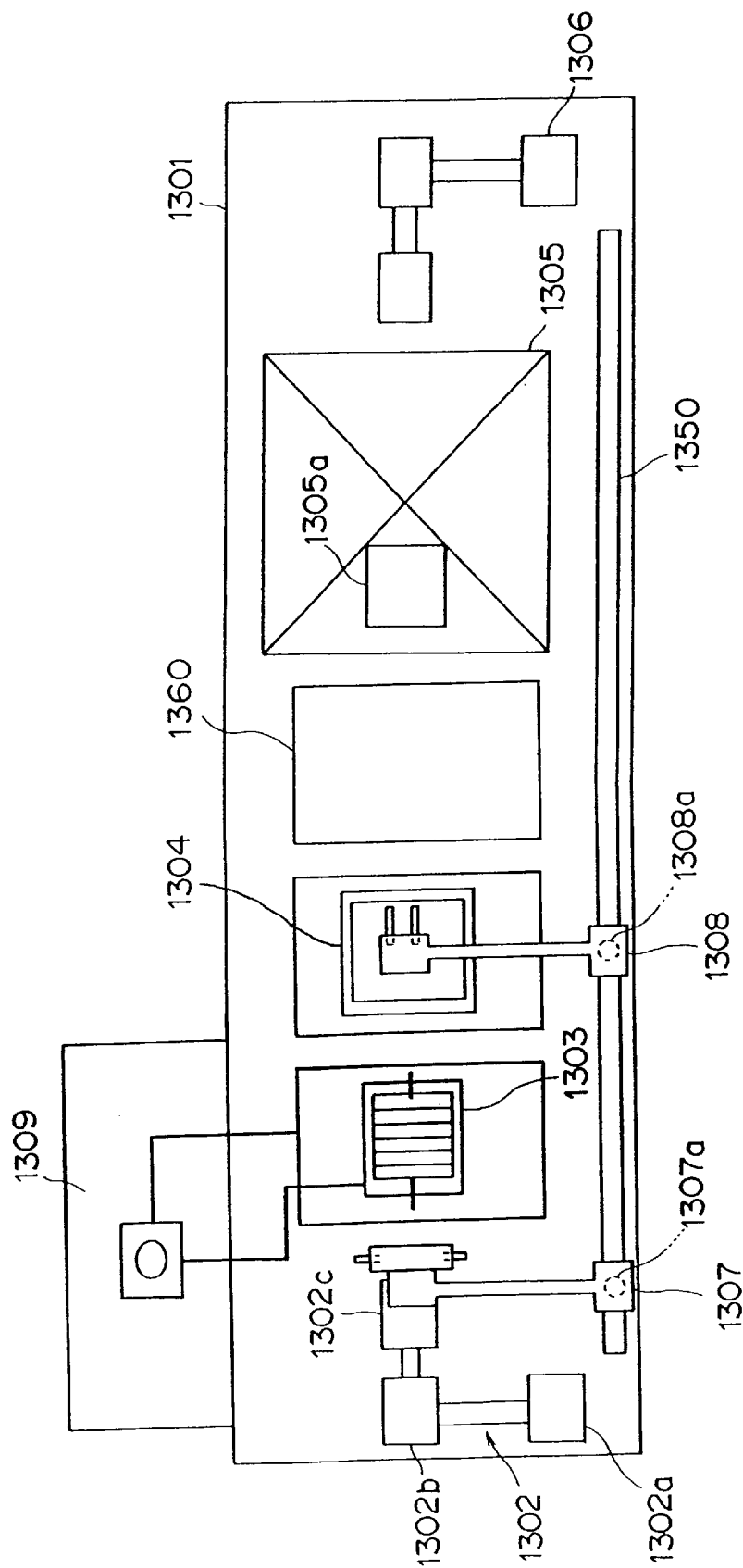
FIG. 19 is a schematic plan view showing another arrangement of the automatic anodizing apparatus according to the first embodiment.

This arrangement is made by improving the automatic anodizing apparatus according to the seventh arrangement. FIG. 19 is a schematic plan view of an improved automatic anodizing apparatus according to this arrangement. The automatic anodizing apparatus according to this arrangement has a dryer 1360 for drying an arm 1308b of a carrier convey robot 1308 after completely washed wafers are stored in a wafer carrier 1313 and conveyed from a washing bath 1304 to a carrier receiving unit 1305a on a spin dryer 1305 by the carrier convey robot 1308.

As a method of drying the arm 1308b, a method of spraying nitrogen gas or some other gas on the arm 1308b is preferable.

The wafer process procedure of the automatic anodizing apparatus according to this arrangement will be described below by comparing it with the wafer process procedure of the automatic anodizing apparatus according to the seventh arrangement.

Following the same procedure as in the automatic anodizing apparatus according to the seventh arrangement, wafers completely washed in the washing bath 1304 are stored in the wafer carrier 1313 and conveyed to the carrier receiving unit 1305a on the spin dryer 1305 by the carrier convey robot 1308.

During the convey, pure water for washing is attached to the arm 1308b of the carrier convey robot 1308. Accordingly, if the wafer carrier 1313 completely dried by the spin dryer 1305 is conveyed to an unloader 1306 by the carrier convey robot 1308 to which the pure water is attached, the pure water can be attached to the dried wafers again.

In the automatic anodizing apparatus according to this arrangement, therefore, after the wafer carrier 1313 is conveyed from the washing bath 1304 to the spin dryer 1305, the carrier convey robot 1308 is so moved as to position the arm 1308b on the dryer 1360. The dryer 1360 dries the arm 1308b by spraying, e.g., nitrogen gas on the arm 1308b.

After the arm 1308b is dried by the dryer 1360 and the wafers and the wafer carrier 1313 are dried by the spin dryer 1305, the convey robot 1308 grips the wafer carrier 1313 with the arm 1308b and conveys the wafer carrier 1313 to the stage of the unloader 1306.

In the embodiment described above, the efficiency of anodization can be increased by improving the substrate supporting method.

More specifically, the above embodiment uses an anodizing apparatus with a structure in which, when the front surface of a semiconductor substrate is to be made porous, the rear surface of the semiconductor substrate is held by suction by a seal member which has a circular shape or a shape close to a circle, a portion of the rear surface of the semiconductor substrate in an inside region of the seal member is brought into contact with a positive electrolytic solution, and the surface of the semiconductor substrate is brought into contact with a negative electrolytic solution. Consequently, the whole surface region of the semiconductor substrate can be anodized.

Also, in the above embodiment, semiconductor substrates can be set in the anodizing apparatus with an extremely simple operation. As a consequence, it is possible to obtain an automatic anodizing apparatus which realizes multi-wafer batch processing which has been difficult to perform.

[Second Embodiment]

FIG. 20 is a schematic sectional view showing the arrangement of an anodizing apparatus according to another embodiment of the present invention. Reference numeral 2101 denotes a silicon substrate (e.g., a wafer). Generally, the existence of positive holes is important for anodization, so a p-type silicon substrate is suitable. However, an n-type silicon substrate can also be used by promoting the production of positive holes by the irradiation of light or the like.

Reference numeral 2102 denotes a holder for supporting a silicon substrate. This holder 2102 is made from an HF-resistant material such as an ethylene tetrafluoride resin (tradename: Teflon). An opening 2103 which has a circular shape or a shape close to a circle having a diameter smaller than the diameter of a silicon substrate to be supported is formed in the holder 2102.

A suction mechanism for supporting the silicon substrate 2101 by suction is provided on one surface of the holder 2102. Various forms are possible as this suction mechanism.

As this suction mechanism, a suction pad 2105 having a rectangular sectional shape and an annular shape as a whole is used in FIG. 20. A groove is formed in a surface, which holds the silicon substrate 2101 by suction, of this suction pad 2105. The silicon substrate 2101 can be held by suction by the suction pad 2105 by reducing a pressure in the space in this groove by a pump 2120 through a suction hole 2110 and a pressure reducing line 2121. The suction hole 2110 can also be connected to several portions of the groove of the suction pad 2105. The material of the suction pad 2105 is preferably, e.g., HF-resistant rubber.

In another preferred suction mechanism, two grooves constituting a double structure are formed along the opening 2103 of the holder 2102, and O-rings are fitted in these grooves. The silicon substrate 2101 is held by suction by reducing a pressure in the space between the two O-rings by the pump 2120 through the suction hole 2110 and the pressure reducing line 2121.

In still another preferred suction mechanism, an annular suction pad whose section has a concave shape, a U shape, or some other shape is arranged along the opening 2103. The silicon substrate 2101 is held by suction by reducing a pressure in a hollow portion formed by an opening (e.g., a valley of the concave shape) of this suction pad and the silicon substrate 2101 by the pump 2120.

In still another preferred suction mechanism, a groove is formed in the suction surface of the holder 2102, and the silicon substrate is held by suction by reducing a pressure in this groove by the pump 2120.

The front and rear surfaces of the silicon substrate 2101 are preferably completely separated by the suction mechanism as described above. However, this embodiment of the present invention does not necessarily require the complete separation. For example, it is possible to use a suction mechanism by which one or several portions of the silicon substrate 2101 are supported and the silicon substrate and the holder are not completely sealed.

The shape of the opening 2103 substantially matches the shape of a portion where the rear surface of the silicon substrate 2101 comes in contact with an HF solution 2115. The size of this opening 2103 can be smaller than the silicon substrate 2101 to some extent.

For example, the opening diameter can be smaller by about 60 mm than the diameter of the silicon substrate 2101; i.e., it is possible to use an opening diameter by which a region where the silicon substrate 2101 is not in contact with the HF solution 2115 is about 30 mm from the edge of the silicon substrate 2101. The present inventors have confirmed that even when an opening diameter like this is used,. the thickness of an anodized portion of the silicon substrate 2101 is substantially constant from the center to the edge.

Accordingly, when the diameter of the opening 2103 of the holder 2102 is 90 mm, for example, any of silicon substrates having diameters of 100 mm (4 in.), 125 mm (5 in.), and 150 mm (6 in.) can be processed. The distribution of anodized products is good in all silicon substrates with these diameters, and their qualities are equal.

In holding a silicon substrate having a diameter of 100 mm (4 in.) by suction, however, the diameter of the opening 2103 is preferably 90 mm or less when a margin for completely sealing an orientation flat and a margin for permitting a difference during suction are taken into consideration.

If the diameter of the opening 2103 is decreased to 90 mm or less, however, it is difficult to form a uniform porous film when a silicon substrate 150 mm (6 in.) in diameter is held by suction by the suction pad 2105 and anodized.

Furthermore, when a silicon substrate 200 mm (8 in.) in diameter is held by suction by the suction pad 2105 and anodized, the difference between the diameters of the silicon substrate and the opening 2103 largely exceeds 60 mm. This makes a uniform porous film more difficult to form.

In this embodiment, a suction pad 2108 is formed to well anodize a silicon substrate having a diameter larger by a predetermined value than the diameter of the opening 2103. This suction pad 2108 has essentially the same construction as the suction pad 2105 except for the diameter. The suction pad 2108 can hold a silicon substrate by suction by reducing pressure in a groove by the pump 2120 through a suction hole 2111 and a pressure reducing line 2122.

A step difference is formed between a holder surface 2107 on which the suction pad 2108 is formed and an intermediate surface 2104 on which the suction pad 2105 is formed. Even when a silicon substrate having a large diameter (e.g., 200 mm) is to be anodized, this step difference can greatly increase an area in which the HF solution 2115 is brought into contact with the rear surface of the silicon substrate. Consequently, the formed porous film can be made uniform.

To obtain a porous film with a good distribution, the step difference between the suction surface 2104 and the suction surface 2107 is preferably 5 mm or more. Even if this step difference is less than 5 mm, however, a porous film with a good distribution can be obtained by providing a means for removing $H_2$ gas produced during the processing and sufficiently supplying the HF solution 2115 to the rear surface of a silicon substrate held by suction by the suction pad 2108. One preferred example is to form a plurality of holes in the intermediate surface 2104 so that the holes extend through the holder 2102 and remove $H_2$ gas from the rear surface of a silicon substrate through these holes. If this is the case, these holes are preferably closed when a silicon substrate is held by suction by the suction pad 2105 and anodized.

Other components will be described below. Reference numerals 2109a and 2109b denote negative and positive electrodes, respectively, which are preferably formed by a chemically stable platinum material. Reference numerals 2112 and 2113 denote stop valves provided in the pressure reducing lines 2121 and 2122, respectively. The suction of a silicon substrate can be controlled by controlling these stop valves 2112 and 2113. Reference numeral 2114 denotes a manifold; and 2115, an HF solution. Alcohol such as ethanol can be mixed in the HF solution 2115 where necessary in order to immediately remove bubbles of, e.g., $H_2$ as a reaction product from the silicon substrate surface. Arrows 2117 in FIG. 20 indicate the direction of an electric field. Reference numeral 2118 denotes in FIG. 34 an enlarged section of the anodized silicon substrate 2101, showing the state in which a porous film is formed from the silicon substrate surface.

Note that the apparatus includes the two suction surfaces in the embodiment shown in FIG. 20. However, the apparatus can also include three or more suction surfaces, in which case silicon substrates with more various sizes can be processed.

In this preferred embodiment of the present invention, it is possible to provide an anodizing apparatus suited to mass-production and processing of substrates having various sizes.

More specifically, to fix a substrate to be processed to the holder, it is only necessary to press the rear surface of the substrate against the suction surface of the holder and hold the rear surface by suction. This facilitates the handling of a substrate.

Also, an optimum suction mechanism can be selected to fix a substrate to be processed to the holder, in accordance with the size of the substrate. Therefore, a uniform porous film can be formed regardless of the size of a substrate. For example, by providing only one holder, it is possible to appropriately process substrates whose sizes range from 4 in. or less to a 12 in. or more.

Furthermore, by well decreasing the diameter of each suction mechanism of the holder compared to the diameter of a substrate, it is no longer necessary to limit the position of the orientation flat of a substrate to be held by suction. Additionally, the center of the substrate can slightly deviate from the center of the holder.

Also, since the operation of holding a substrate is simplified, the anodization is easy to automate.

Preferred arrangements of this embodiment will be enumerated and described below.

[First Arrangement]

Figure 21A:
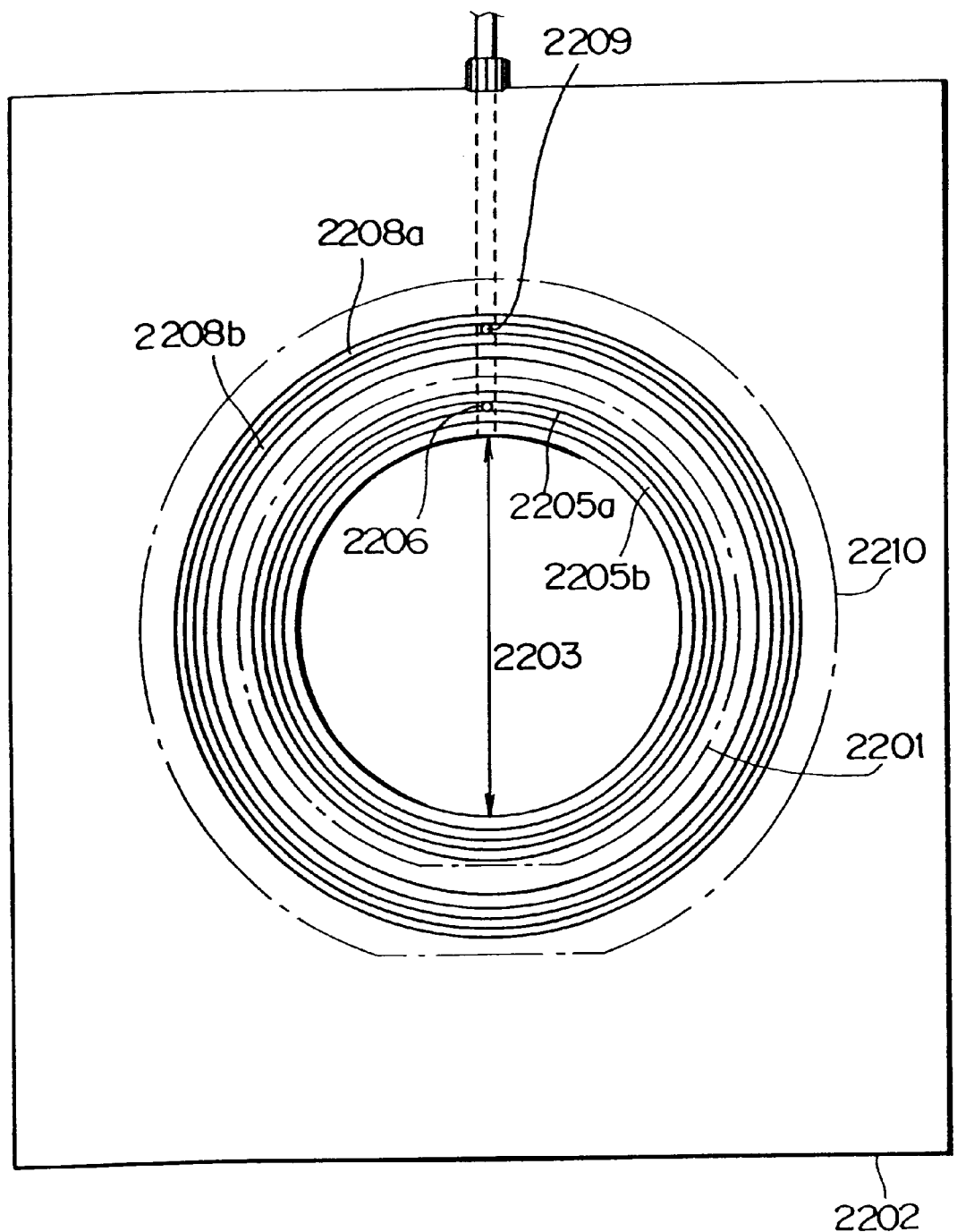
FIG. 21A is a front view of a holder according to the first arrangement of the second embodiment.
Figure 21B:
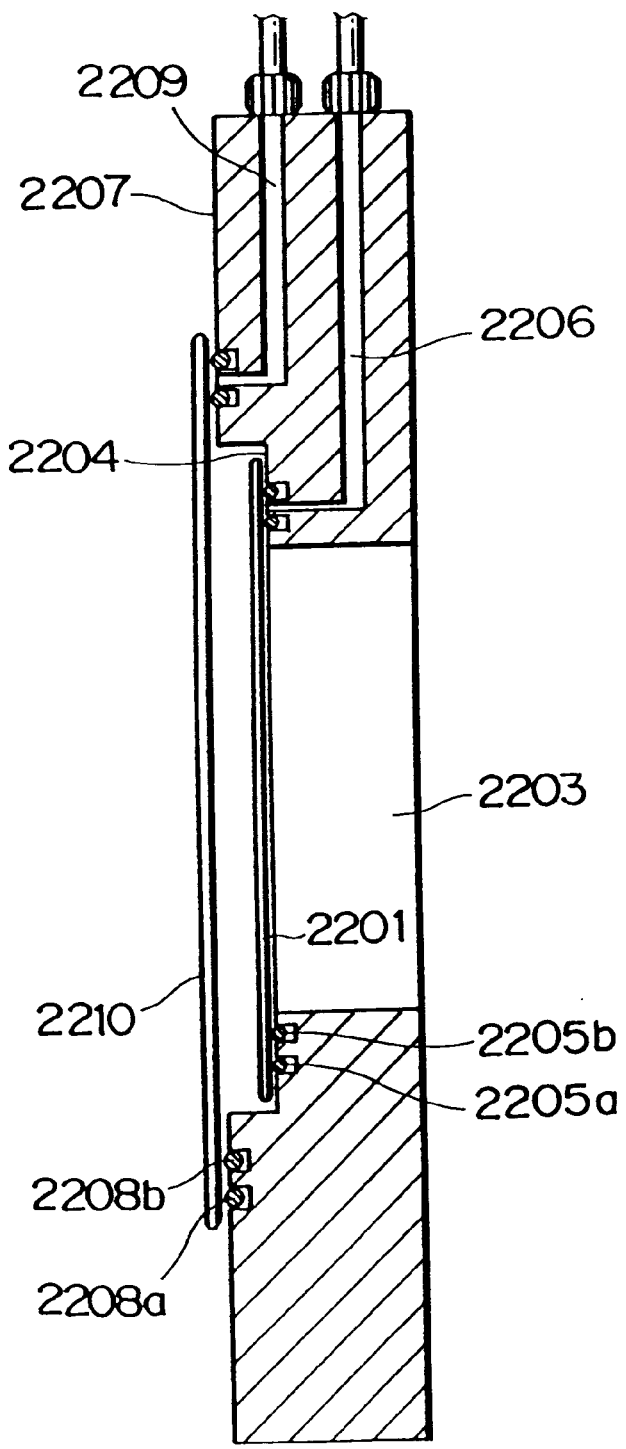
FIG. 21B is a sectional view of the holder according to the first arrangement of the second embodiment.

FIG. 21A is a front view of a holder according to the first arrangement of this embodiment. FIG. 21B is a longitudinal sectional view of the holder shown in FIG. 21A.

Reference numeral 2201 denotes a 4- or 5-in. silicon substrate to be anodized; and 2202, a holder made from an ethylene tetrafluoride resin (tradename: Teflon). An opening 2203 with a diameter of 75 mm is formed in the center of the holder 2202. This holder 2202 has an intermediate surface 2204 for holding the 4-in. silicon substrate 2201 by suction and a holder surface 2207 for holding a silicon substrate 2210 of 6 in. or more by suction. The intermediate surface 2204 is so formed as to form a step difference in a direction from the holder surface 2207 toward the opening 2203.

This step difference is preferably 5 mm or more to remove $H_2$ gas produced during the anodization of the silicon substrate 2210 and well supply an HF solution to the rear surface of the silicon substrate 2210. Also, the outer periphery of the intermediate surface 2204 is preferably concentric with the opening 2203. In this arrangement the outer diameter of the intermediate surface 2104 is 130 mm.

Two circular grooves constituting a double structure are formed in the intermediate surface 2204 along the edge of the opening 2203. O-rings 2205a and 2205b made from perfluoroethylene based on a fluorine resin are fitted in these grooves. The inner diameter of the outer O-ring 2205a is 92 mm, the inner diameter of the inter O-ring 2205b is 79 mm, and the diameter of the section of each O-ring is 2.5 mm.

Between the outer O-ring 2205a and the inter O-ring 2205b, a suction hole 2206 for reducing a pressure in the space defined by these two O-rings and the silicon substrate 2201 is formed. This suction hole 2206 extends toward the upper portion of the holder 2202. To hold the silicon substrate 2201 by suction, it is only necessary to reduce a pressure in the space between the O-rings by a pump (not shown) connected to the suction hole 2206 through a pressure reducing line.

The diameter of the 4-in. silicon substrate 2201 is 100 mm. Therefore, the position of an orientation flat can point in any direction as long as the center of the silicon substrate 2201 and the center of the opening 2203 substantially match with each other. Accordingly, it is unnecessary to take account of the position of an orientation flat when the silicon substrate 2201 is held by suction by the holder 2202. This similarly applies to the 5-inch silicon substrate 2201.

Additionally, two circular grooves constituting a double structure are formed in the holder surface 2207 along the outer periphery of the intermediate surface 2204. O-rings 2208a and 2208b made from perfluoroethylene based on a fluorine resin are fitted in these grooves. The inner diameter of the outer O-ring 2208a is 141 mm, the inner diameter of the inter O-ring 2208b is 133 mm, and the diameter of the section of each O-ring is 2.5 mm.

Between the outer O-ring 2208a and the inter O-ring 2208b, a suction hole 2209 for reducing a pressure in the space defined by these two O-rings and the silicon substrate 2210 is formed. This suction hole 2209 extends toward the upper portion of the holder 2202. To hold the silicon substrate 2210 by suction, it is only necessary to reduce a pressure in the space between the O-rings by a pump (not shown) connected to the suction hole 2209 through a pressure reducing line.

The diameter of the 6-in. silicon substrate 2210 is 150 mm. Therefore, the position of an orientation flat can point in any direction as long as the center of the silicon substrate 2210 and the center of the opening 2203 substantially match with each other. Accordingly, it is unnecessary to take account of the position of an orientation flat when the silicon substrate 2210 is held by suction by the holder 2202. This similarly applies to the silicon substrate 2210 larger than 6 in.

This holder 2202 can be used for both the 4-in. (or 5-in.) silicon substrate 2201 and the silicon substrate 2210 of 6 in. or more. These two types of silicon substrates are, of course, not simultaneously held by suction and anodized; i.e., only one type of substrate is processed at once.

Note that the dimensions of the individual parts of the holder 2202 can be properly changed in accordance with the size of a silicon substrate to be processed.

Figure 22:
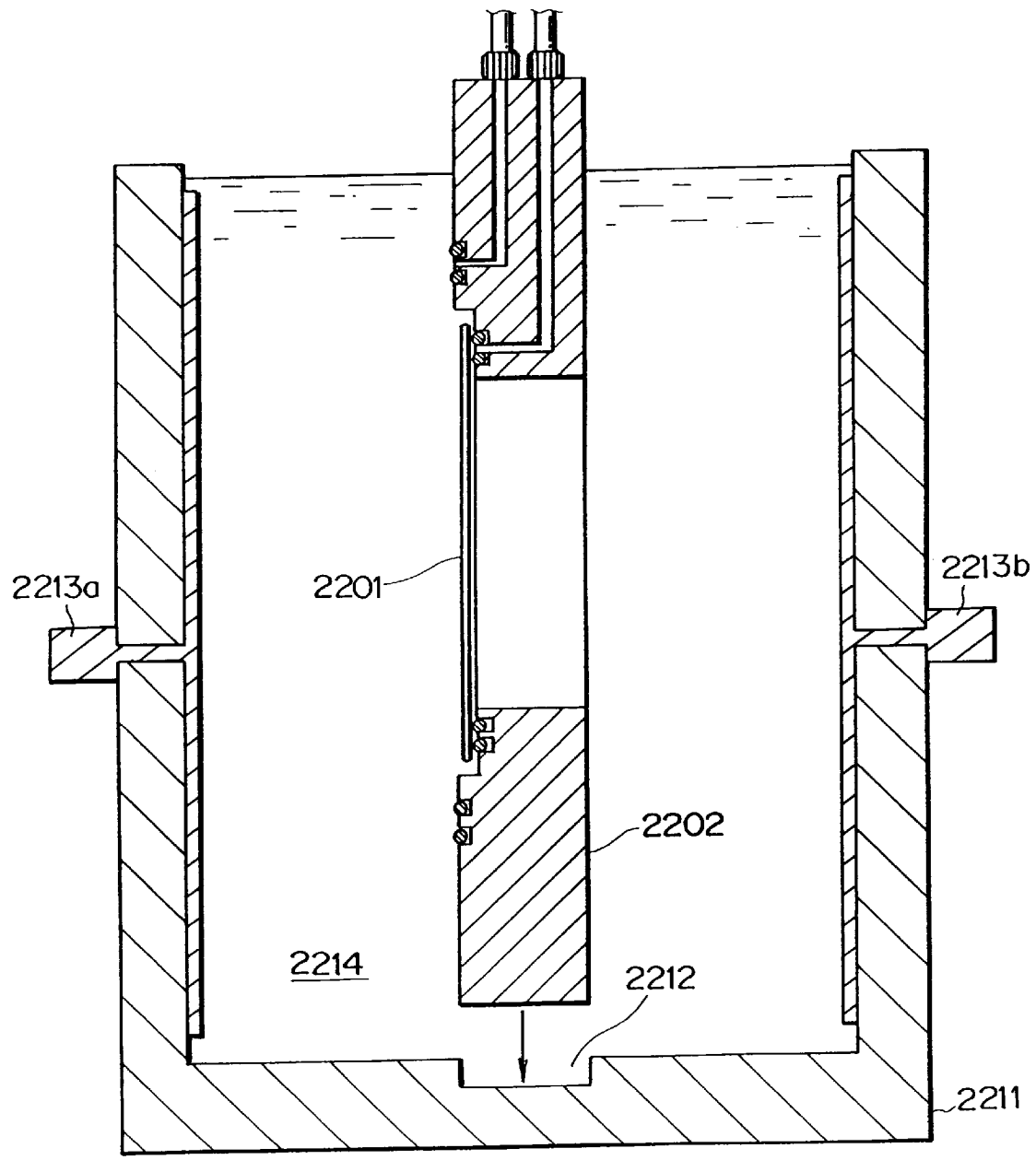
FIG. 22 is a view showing the way the holder is set in an anodizing bath.

In actually anodizing a silicon substrate, the holder 2202 holding the silicon substrate by suction is set in an anodizing bath. FIG. 22 is a view showing the way the holder 2202 is set in an anodizing bath. Note that the holder 2202 and an anodizing bath 2211 can also be integrated.

The anodizing bath 2211 is made from an ethylene tetrafluoride resin like the holder 2202. Platinum electrodes 2213a and 2213b are attached to the two sides of the anodizing bath 2211. In the middle of the anodizing bath 2211, a holder groove 2212 for holding the holder 2202 is formed. When the holder 2202 holding a silicon substrate by suction is fitted in this holder groove 2212, the anodizing bath 2211 is divided into right and left portions, and an HF solution 2214 filled in the bath is separated.

In this state, a DC voltage is applied by using the platinum electrode 2213a as a negative electrode and the platinum electrode 2213b as a positive electrode. This anodizes the entire region of the front surface of the silicon substrate and a portion (a rear surface peripheral portion) of its rear surface outside the outer O-ring 2205a. Consequently, a porous silicon layer can be formed over the entire front surface and the rear surface peripheral portion of the silicon substrate.

Figure 23:
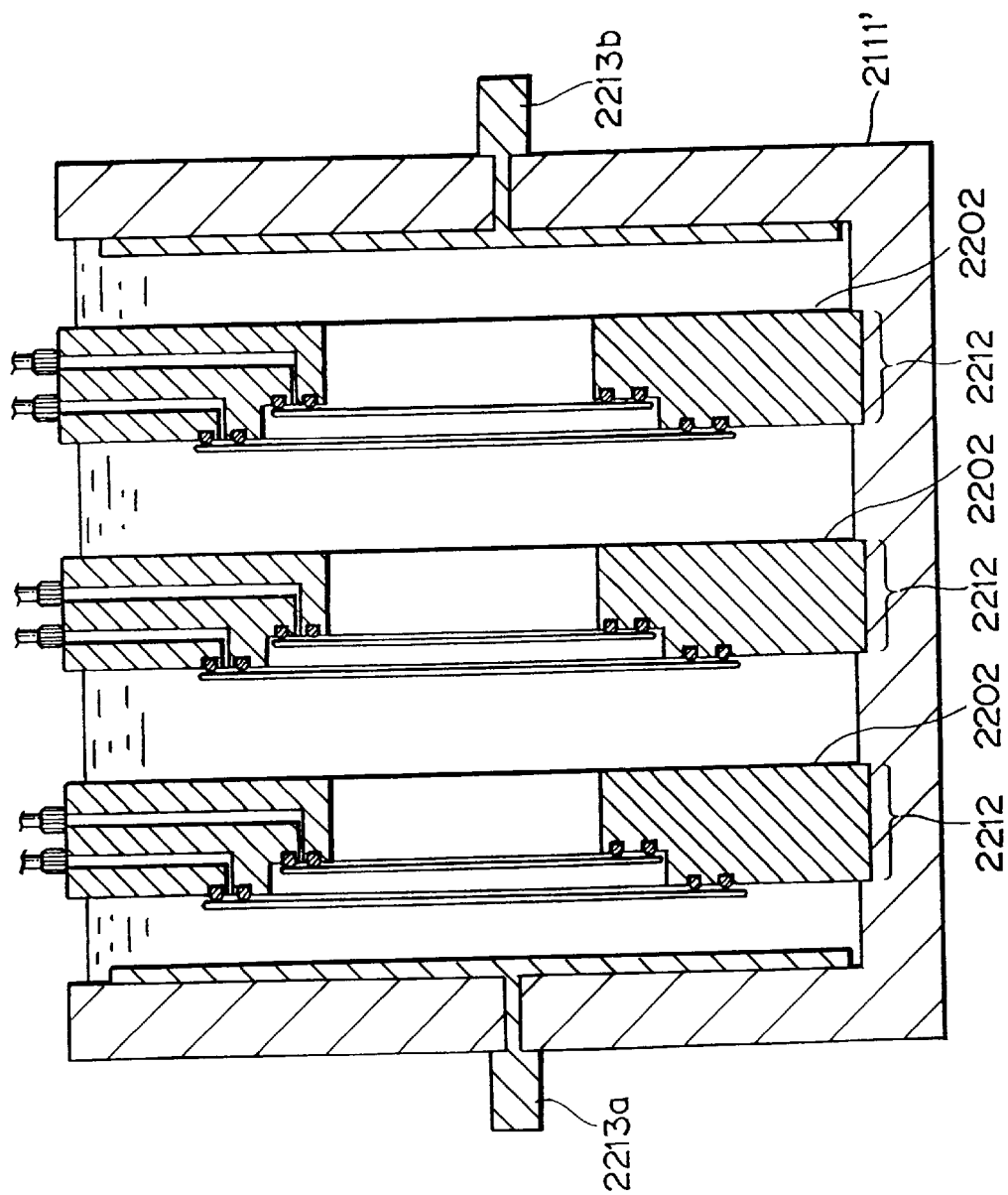
FIG. 23 is a sectional view showing an example of an anodizing bath capable of holding a plurality of holders.

FIG. 23 is a sectional view showing an example of an anodizing bath capable of holding a plurality of holders 2202. As shown in FIG. 23, a plurality of holders 2202 can be held by forming a plurality of holder grooves 2212 in an anodizing bath 2211'. This further improves the productivity. Note that the holders are arranged in series in this example of an anodizing bath, but the holders can also be arranged parallel or in a matrix manner. Note also that the holders 2202 and the anodizing bath 2211' can be integrated.

An example of a wafer convey robot for automatically attaching and detaching a silicon substrate to and from the holder 2202 will be described below.

Figure 24:
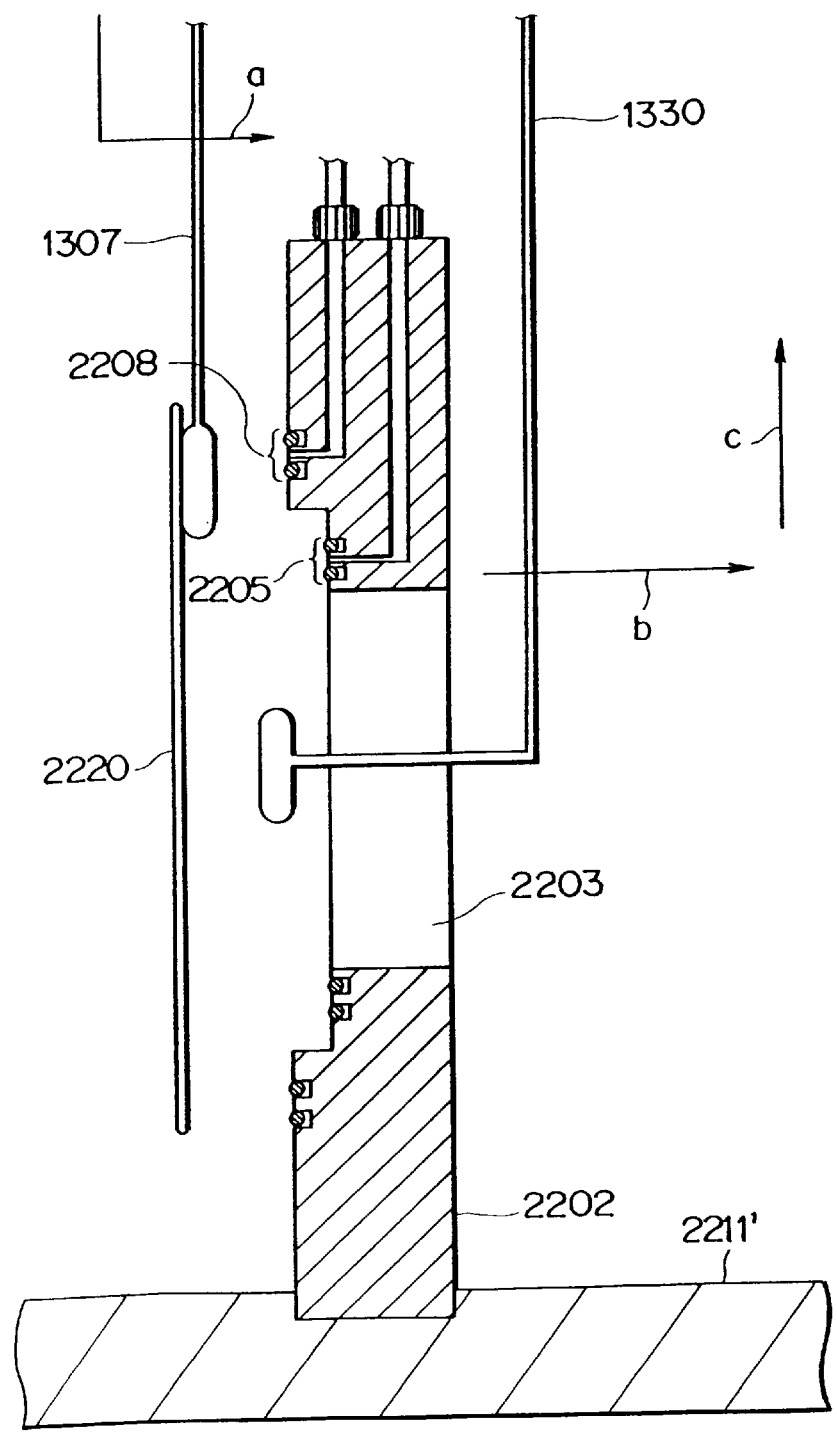
FIG. 24 is a view schematically showing the structure of a single wafer convey robot.

FIG. 24 is a view schematically showing the arrangement of a single wafer convey robot suitable for this arrangement. This wafer convey robot is made by combining two wafer convey robots 1307 and 1330.

The first wafer convey robot 1307 holds the rear surface of a silicon substrate 2220 by vacuum suction. As indicated by an arrow a, the first wafer convey robot 1307 conveys the silicon substrate 2220 to the vicinity of the front surface of the holder 2202 and transfers the silicon substrate 2220 to the second convey robot 1330. When the second wafer convey robot 1330 holds the silicon substrate 2220 by vacuum suction, the first wafer convey robot 1307 once moves up and then moves away from the anodizing bath 2211' in the opposite direction to the arrow a.

After holding the rear surface of the silicon substrate 2220 by vacuum suction, the second convey robot 1330 conveys the silicon substrate 2220 as indicated by an arrow b. This operation of the second convey robot 1330 changes in accordance with the size of the silicon substrate 2220. That is, when the size of the silicon substrate 2220 is 4 in. (or 5 in.), the second convey robot 1330 conveys the silicon substrate 2220 to the position of the O-rings 2205. On the other hand, when the size of the silicon substrate 2220 is 6 in. (or more), the second wafer convey robot 1330 conveys the silicon substrate 2220 to the position of the O-rings 2208.

When the silicon substrate 2220 is conveyed to the position where it is brought into contact with the O-ring 2205 or 2208 and held by suction by this O-ring 2205 or 2208, the second wafer convey robot 1330 releases the silicon substrate 2220. Thereafter, the second wafer convey robot 1330 further moves in the direction of the arrow b and then moves up as indicated by an arrow c to move away from the anodizing bath 2211'.

Prior to conveying the silicon substrate 2220, the second wafer convey robot 1330 moves in the opposite directions to the arrows c and b to the position (shown in FIG. 24) where the second wafer convey robot 1330 holds the silicon substrate 2220 by vacuum suction.

The use of the wafer convey robot which performs the operation as described above makes the automation of anodization feasible.

[Second Arrangement]

Figure 25:
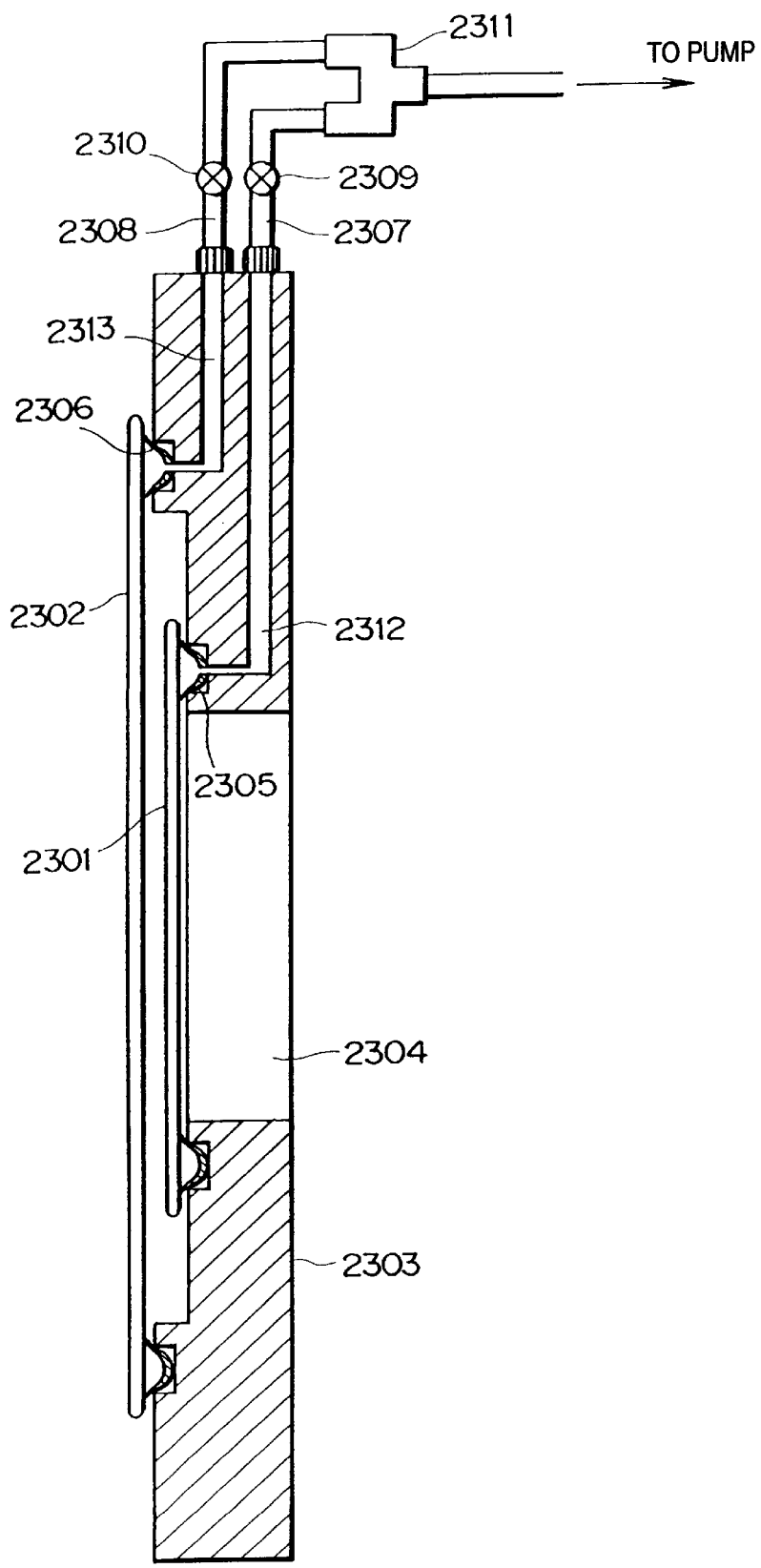
FIG. 25 is a sectional view of a holder according to the second arrangement of the second embodiment.

FIG. 25 is a sectional view of a holder according to the second arrangement of this embodiment. This holder 2303 can be used in combination with, e.g., the anodizing bath 2211 or 2211' according to the first arrangement. Also, the single wafer convey robot shown in FIG. 24 is suited to attach and detach a silicon substrate.

The holder 2303 according to this arrangement is obtained by replacing the double O-rings in the holder according to the first arrangement with other suction mechanisms. That is, the holder 2303 includes a suction mechanism for holding a 4-in. (or 5-in.) silicon substrate 2301 by suction and a suction mechanism for holding a silicon substrate 2302 of 6 in. or more by suction.

In this arrangement suction pads 2305 and 2306 each having a U sectional shape and an annular shape as a whole are used as the silicon substrate suction mechanisms.

Suction holes 2312 and 2313 communicating with pressure reducing lines 2307 and 2308 are formed in portions of the suction pads 2305 and 2306, respectively. Stop valves 2309 and 2310 are provided at the end portions of the pressure reducing lines 2307 and 2308, respectively. A manifold 2311 is provided after these stop valves and unites the two pressure reducing lines into a single line. To hold the silicon substrates 2301 and 2302, it is only necessary to open the stop valves 2309 and 2310, respectively.

When suction pads having a U-shaped section are used as suction mechanisms as in this arrangement, the degree of freedom of portions in contact with silicon substrates is increased compared to the first arrangement. This obviates the need to accurately convey silicon substrates to the contact portions.

[Third Arrangement]

Figure 26:
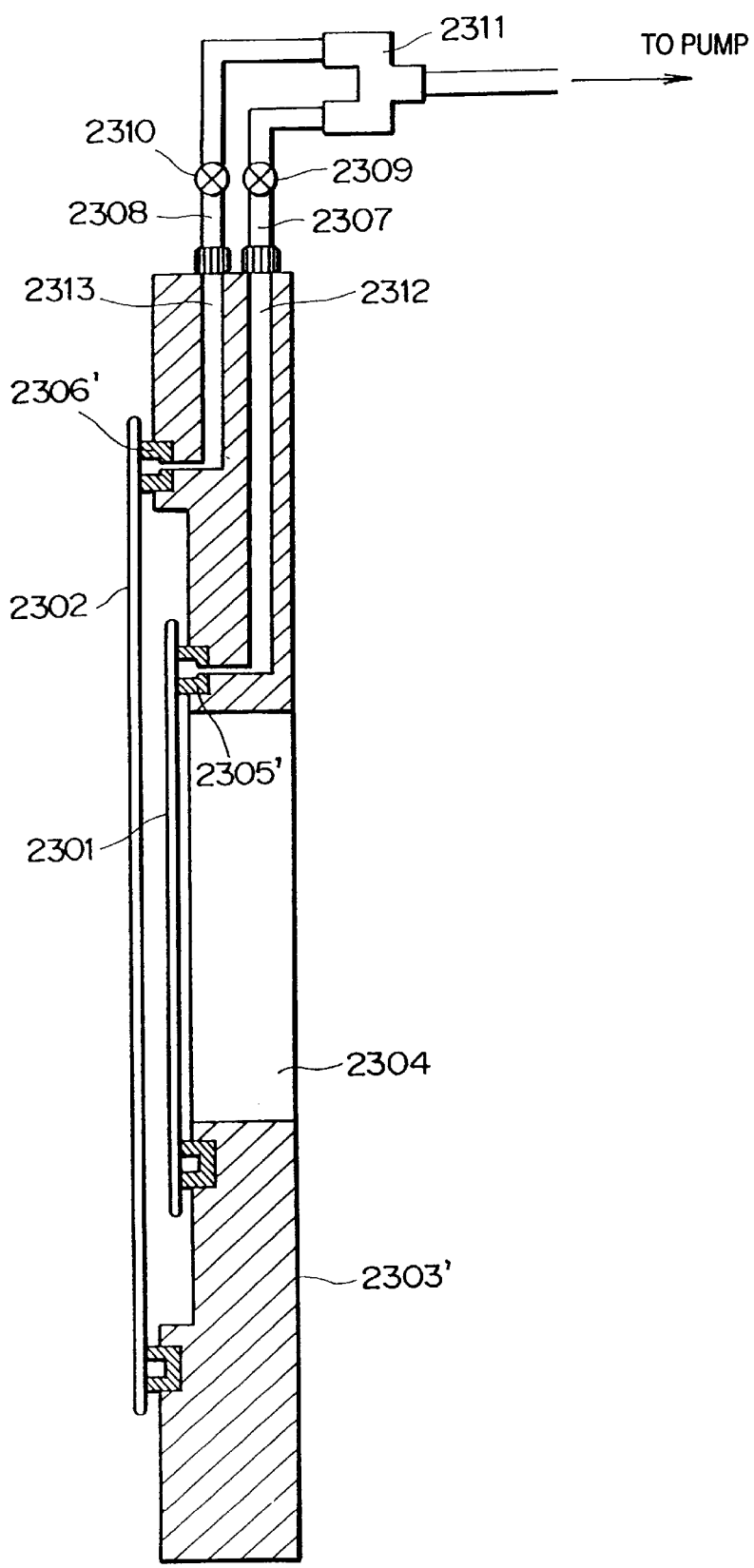
FIG. 26 is a sectional view of a holder according to the third arrangement of the second embodiment.

FIG. 26 is a sectional view of a holder according to the third arrangement of this embodiment. This holder 2303' can be used in combination with, e.g., the anodizing bath 2211 or 2211' according to the first arrangement. Also, the single wafer convey robot shown in FIG. 24 is suited to attach and detach a silicon substrate.

The holder 2303' according to this arrangement is obtained by replacing the suction pads 2305 and 2306 in the holder according to the first arrangement with other suction mechanisms, i.e., suction pads 2305' and 2306' having a concave section, respectively. Note that the same reference numerals as in FIG. 25 denote the same parts, and a detailed description thereof will be omitted.

When suction pads having a concave section are used as suction mechanisms as in this arrangement, the degree of freedom of portions in contact with silicon substrates is increased as in the second arrangement. This obviates the need to accurately convey silicon substrates to the contact portions.

[Fourth Arrangement]

Figure 27:
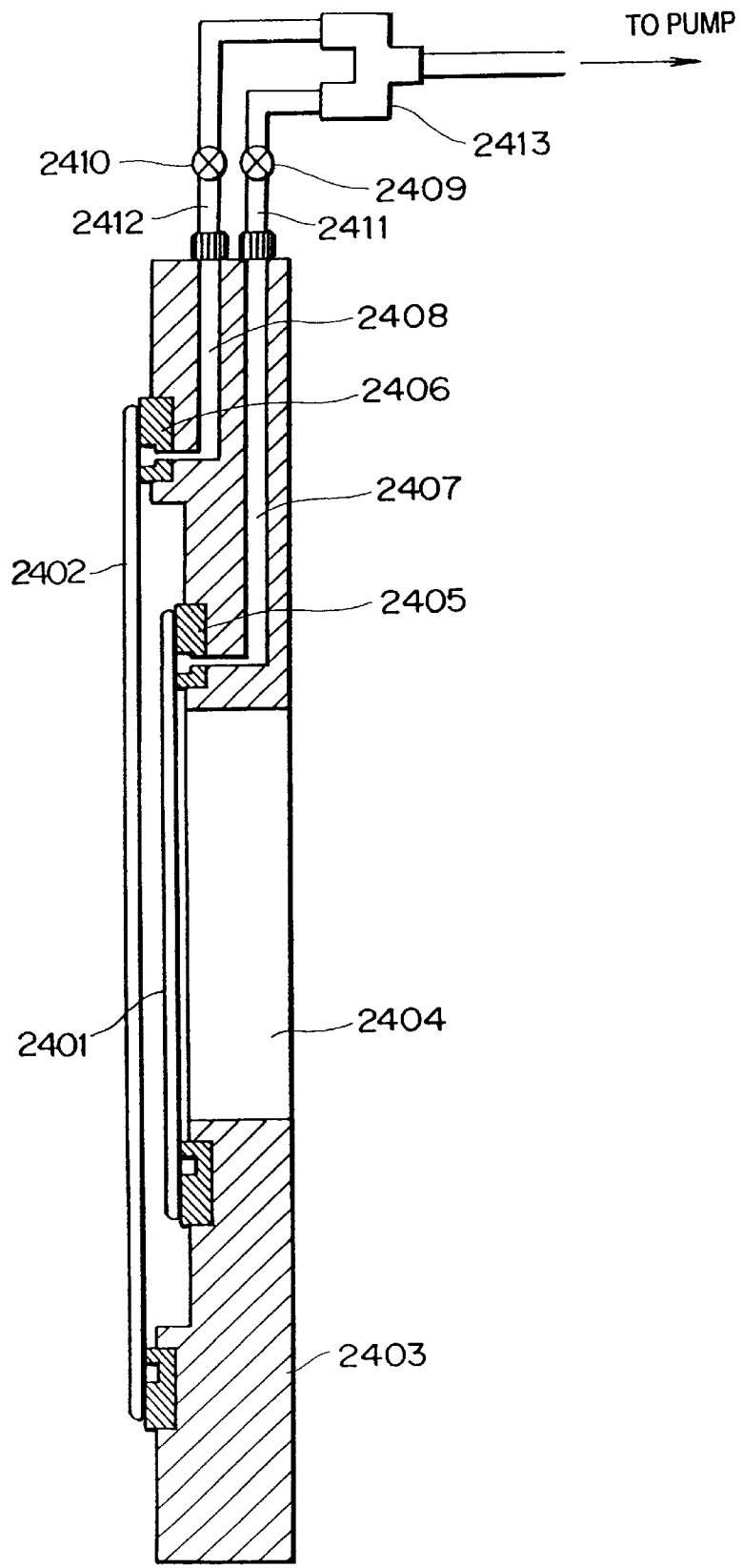
FIG. 27 is a sectional view of a holder according to the fourth arrangement of the second embodiment.

FIG. 27 is a sectional view of a holder according to the fourth arrangement of this embodiment. This holder 2403 can be used in combination with, e.g., the anodizing bath 2211 or 2211' according to the first arrangement. Also, the single wafer convey robot shown in FIG. 24 is suited to attach and detach a silicon substrate.

The holder 2403 according to this constitution is obtained by replacing the double O-ring in the holder according to the first arrangement with other suction mechanisms. That is, the holder 2403 includes a suction mechanism for holding a 4-in. (or 5-in.) silicon substrate 2401 by suction and a suction mechanism for holding a silicon substrate 2402 of 6 in. or more by suction.

In this arrangement, suction pads 2405 and 2406 each having a rectangular sectional shape and an annular shape as a whole are used as the silicon substrate suction mechanisms.

Grooves for holding the silicon substrates 2401 and 2402 by suction are formed in these suction pads 2405 and 2406. Suction holes 2407 and 2408 communicating with pressure reducing lines 2411 and 2412 are formed in these grooves. Stop valves 2409 and 2410 are provided at the end portions of the pressure reducing lines 2411 and 2412, respectively.

A manifold 2413 is provided after these stop valves and unites the two pressure reducing lines into a single line. To hold the silicon substrates 2401 and 2402, it is only necessary to open the stop valves 2409 and 2410, respectively.

When a silicon substrate is anodized by using the holder 2403 according to this arrangement in combination with the anodizing bath 2211 or 2211', only the front surface of the silicon substrate is anodized while its rear surface is left unanodized. This is so because the suction pad 2405 or 2406 is brought into tight contact with the rear surface of the silicon substrate 2401 or 2402, so an HF solution on the front surface of the silicon substrate does not move to the rear surface of the silicon substrate. That is, when anodization is performed by using this holder 2403, only the front surface of a silicon substrate is made porous, and no porous layer is formed on its rear surface. Accordingly, an effective region (i.e., a region usable when an SOI substrate is to be formed) can be enlarged.

[Fifth Arrangement]

Figure 28:
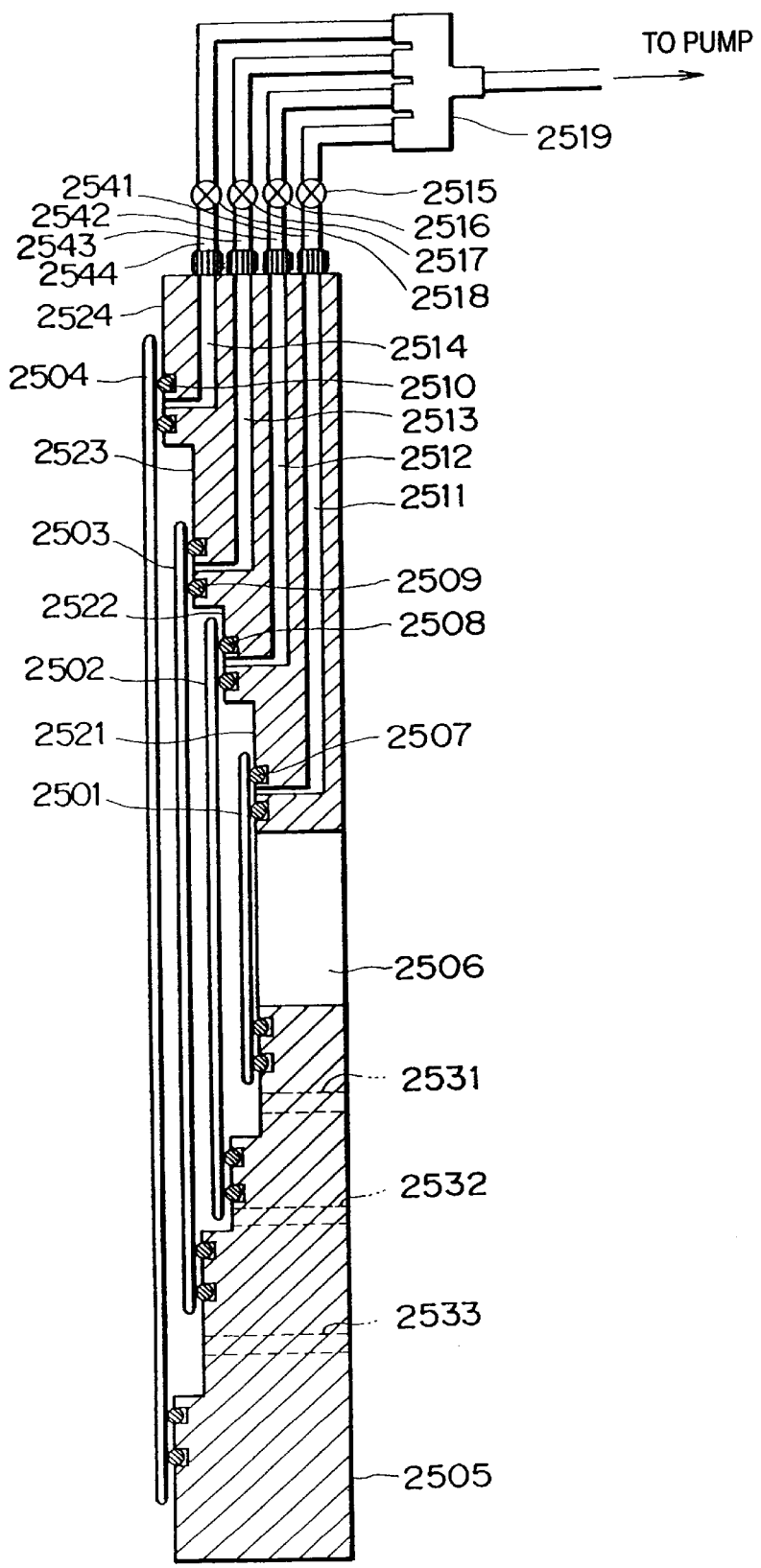
FIG. 28 is a schematic sectional view of a holder according to the fifth arrangement of the second embodiment.

FIG. 28 is a sectional view of a holder according to the fifth arrangement of this embodiment. This holder 2505 can be used in combination with, e.g., the anodizing bath 2211 or 2211' according to the first arrangement. Also, the single wafer convey robot shown in FIG. 24 is suited to attach and detach a silicon substrate.

The holder 2505 according to this arrangement includes a plurality of suction mechanisms to process silicon substrates with various sizes. That is, a stepwise hole is formed in a holder main body to extend from the front surface to the rear surface of the holder main body, and the holder 2505 has a silicon substrate suction mechanism on each step (intermediate surface) of this holder main body.

Reference numeral 2505 denotes a holder for supporting a silicon substrate. The holder 2505 is made from a HF-resistant material such as an ethylene tetrafluoride resin (tradename: Teflon). The holder 2505 includes, from the front surface to the rear surface, suction mechanisms for a 12-in. substrate, an 8-in. substrate, a 6-in. substrate, and a 5-in. substrate (and a 4-in. substrate) on a holder surface 2524, an intermediate surface 2523, an intermediate surface 2522, and an intermediate surface 2521, respectively. Note that the number of steps (suction mechanisms) can be increased to hold a silicon substrate exceeding 12 in., or an unnecessary intermediate surface can be omitted.

In the arrangement shown in FIG. 28, double O-rings 2507, 2508, 2509, and 2510 are used as the suction mechanisms. However, it is also effective to use suction mechanisms such as in the second to fourth arrangements described above.

In this arrangement, the outer diameter of the intermediate surface 2523 for an 8-in. substrate is 280 mm, the outer diameter of the intermediate surface 2522 for a 6-in. substrate is 180 mm, the outer diameter of the intermediate surface 2521 for a 4-in. substrate (and a 5-in. substrate) is 130 mm, and the diameter of an opening 2506 is 75 mm. However, other dimensions can also be used.

To obtain a porous film with a good distribution for silicon substrates of these sizes, the step difference between the adjacent suction surfaces is preferably 5 mm or more. Even if this step difference is less than 5 mm, however, a porous film with a good distribution can be obtained by providing a means for removing $H_2$ gas produced during the processing and sufficiently supplying the HF solution to the rear surface of a silicon substrate to be processed. One preferred example is to form a plurality of holes 2531 to 2533 in the suction surfaces 2521 to 2523 so that the holes extend through the holder 2505 and remove $H_2$ gas from the rear surfaces of silicon substrates through these holes. If this is the case, these holes are preferably closed in accordance with the size of a silicon substrate to be processed to prevent an HF solution from moving between the front and rear surfaces of the silicon substrate. For example, when a silicon substrate 2503 is to be processed, the presence of the hole 2533 is unpreferred, so it is preferable to close this hole 2533. Another preferred example is to enlarge the space on the rear surface side of a silicon substrate by recessing the intermediate surfaces, except for the portions for supporting the O-rings as the suction mechanisms, toward the rear surface side.

Suction holes 2511 to 2514 for reducing pressures in the spaces between the double O-rings 2507 to 2510, respectively, are formed for these O-rings and connected to pressure reducing lines 2541 to 2544, respectively, in the upper portion of the holder 2505. The pressure reducing lines 2541 to 2544 are connected to stop valves 2515 to 2518, respectively, and then connected to a manifold 2519. The manifold 2519 unites the four pressure reducing lines into a single line. To hold the silicon substrates 2501 to 2504, it is only necessary to open the stop vales 2515 to 2518, respectively.

In this arrangement, silicon substrates with various sizes can be processed because a plurality of suction mechanisms are provided.

Note that when anodization is performed by using an anodizing bath having a plurality of holders in the above various embodiments, silicon substrates with different sizes can be simultaneously processed. If this is the case, the stop valves of the individual holders are independently controlled in accordance with the sizes of the silicon substrates to be processed. For example, when a 4-in. silicon substrate and a 6-in. silicon substrate are to be simultaneously processed, the 4-in. silicon substrate is attached and detached by controlling a 4-in. stop valve for a holder for processing a 4-in. silicon substrate. Analogously, the 6-in. silicon substrate is attached and detached by controlling a 6-in. stop valve for a holder for processing a 6-in. silicon substrate.

[Sixth Arrangement]

Figure 29:
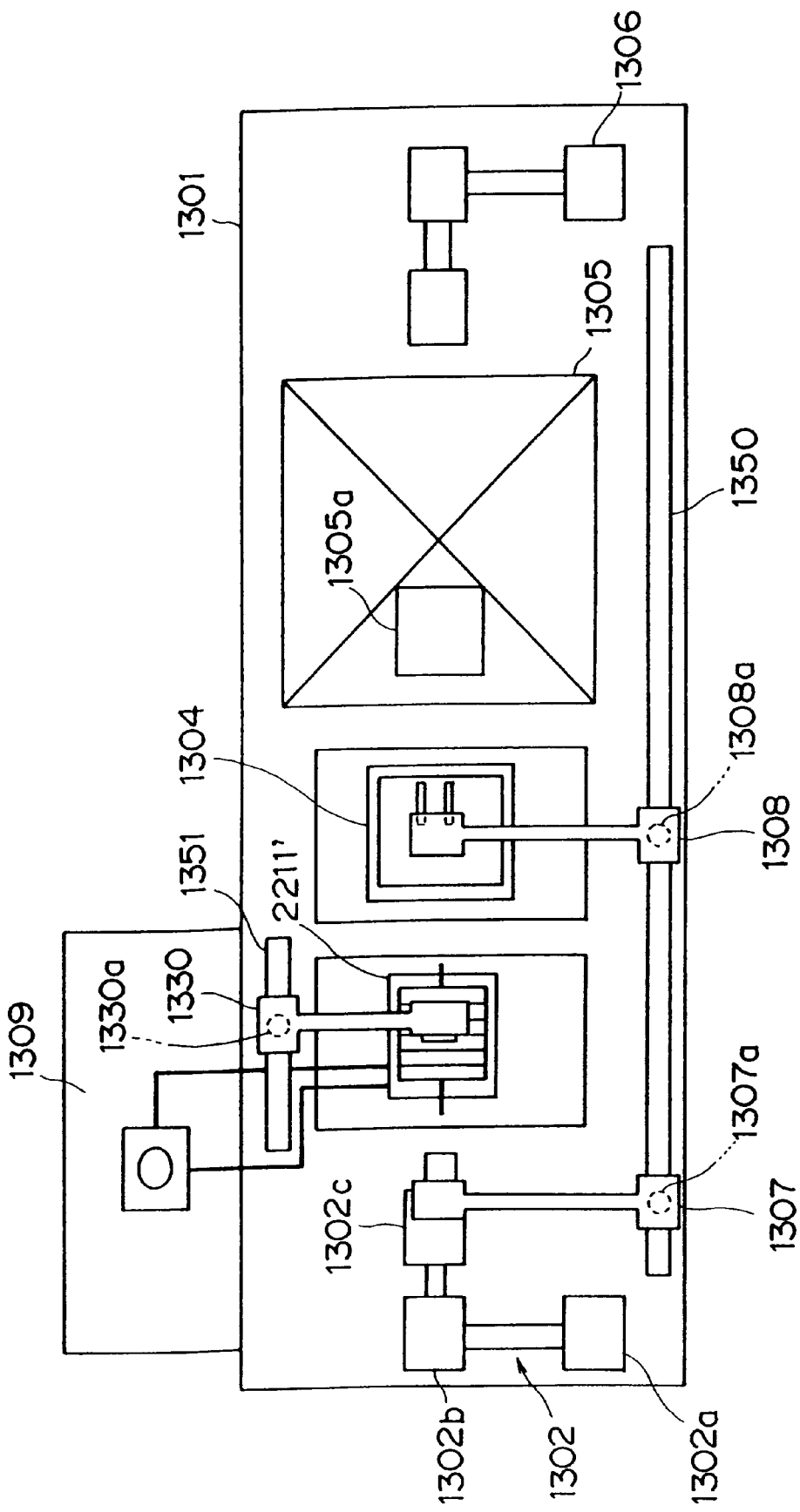
FIG. 29 is a schematic plan view showing one arrangement of an automatic anodizing apparatus according to the second embodiment.

This arrangement provides an automatic anodizing bath including the anodizing bath 2111', the first wafer convey robot 1307, and the second wafer convey robot 1330 according to the first arrangement. FIG. 29 is a schematic plan view of the automatic anodizing apparatus. In this arrangement, the anodizing bath 2211' includes twenty-five holders 2202 and has the ability to simultaneously process twenty-five wafers.

Reference numeral 1301 denotes the main body of the automatic anodizing apparatus. The operation of this anodizing apparatus is controlled by, e.g., a computer. A loader 1302 has a function of moving a wafer carrier placed on the loader 1302 to a position where the first wafer convey robot 1307 can hold a wafer by suction.

Figure 30:
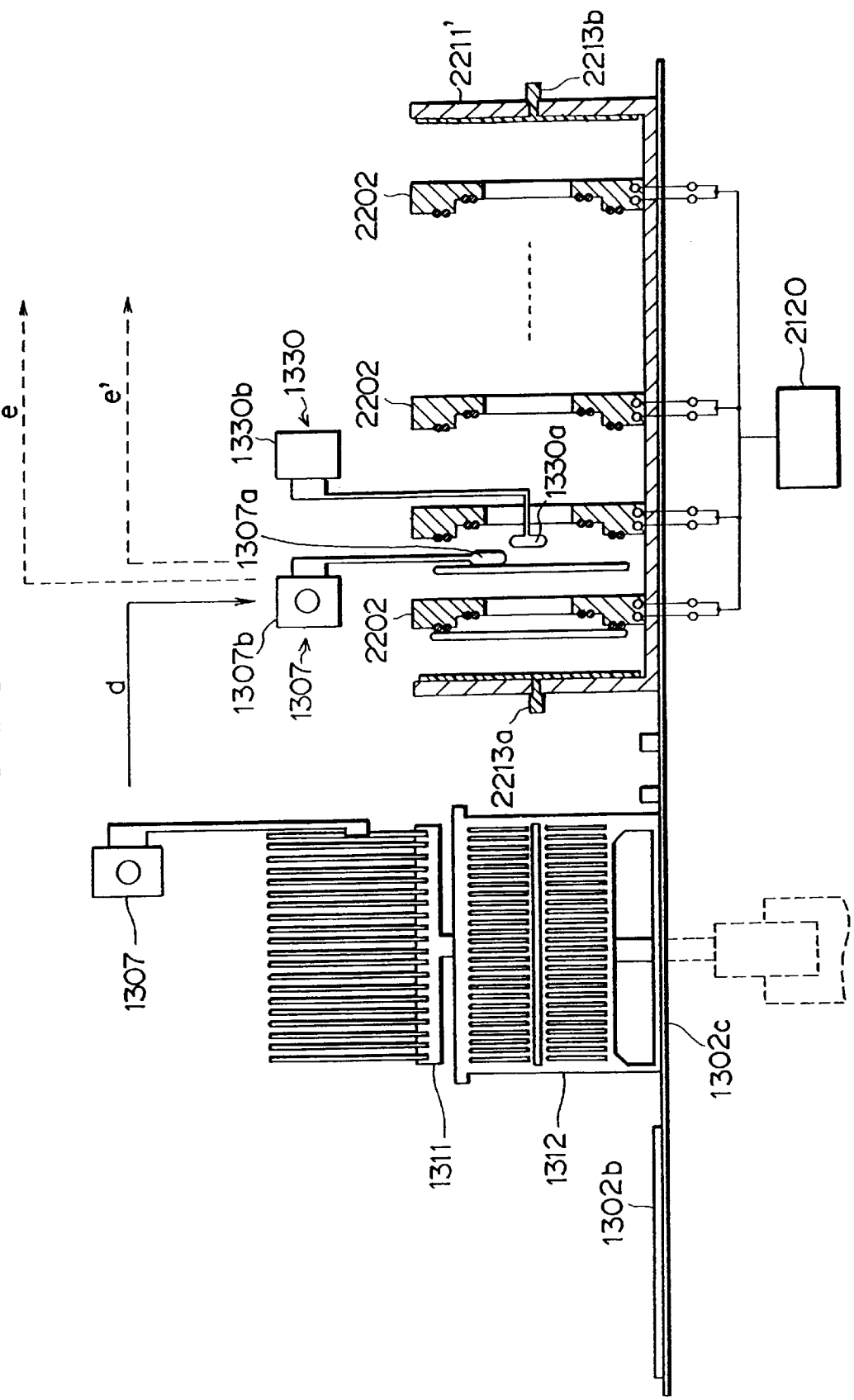
FIG. 30 is a view for explaining the procedure of setting wafers stored in a wafer carrier into an anodizing bath.

FIG. 30 is a view for explaining the procedure of setting wafers stored in a wafer carrier into the anodizing bath 2211'. When an operator places a wafer carrier 1312 on a stage 1302a of the loader 1302, the wafer carrier 1312 is automatically conveyed to a stage 1302b and then to a stage 1302c under the control of a computer. Subsequently, a board 1311 with grooves for holding wafers ascends from below the wafer carrier 1312 on the stage 1302c through a window (opening) in the lower portion of the wafer carrier 1312. Consequently, all wafers stored in the wafer carrier 1312 are held by the grooves of the board 1311 and moved up from the wafer carrier 1312 (the state shown in FIG. 30).

In this state, the wafer convey robot 1307 clamps the wafers one after another from the endmost one and, as indicated by an arrow d, conveys each wafer to the front surface of a corresponding holder 2202 in the anodizing bath 2211'. At this time, the second wafer convey robot 1330 has already moved to a wafer receiving position and is waiting in this position. Therefore, the second wafer convey robot 1330 holds the conveyed wafer by suction and conveys the wafer to a position where the wafer is in contact with O-rings of the corresponding holder.

In this state, the wafer can be held by suction by opening a corresponding stop valve under the computer control. When the wafer is thus held by suction, the second wafer convey robot 1330 releases the wafer and prepares to set the next wafer.

By repeating the above procedure, all the wafers on the board 1311 are set in the wafer holders 2202 of the anodizing bath 2211'.

Anodization is then performed under the computer control by applying a DC voltage between platinum electrodes 2213a and 2213b formed at the two ends of the anodizing bath 2211'.

Subsequently, the completely anodized wafers are washed with pure water. FIG. 15A is a view for explaining the procedure of conveying the completely anodized wafers to a washing bath and washing these wafers. FIG. 15B is a plan view showing the layout of a board and a wafer carrier in the washing bath shown in FIG. 15A. FIG. 15C is a view for explaining the procedure of storing the completely washed wafers in a wafer carrier and removing the wafers from the washing bath.

The completely anodized wafers are separated from the O-rings and transferred to the first wafer convey robot 1307 by the second wafer convey robot 1330. The first wafer convey robot 1307 conveys, across the second wafer convey robot 1330 as indicated by an arrow e (FIG. 30), the wafers to a portion above a washing bath 1304 and dips the wafers into pure water in the washing bath 1304. A board 1314 having twenty-five wafer holding grooves is fixed in the washing bath 1304, and the wafers are set one by one in these grooves.

A wafer carrier 1313 is previously dipped in the washing bath 1304. This wafer carrier 1313 has a shape capable of receiving all wafers held in the grooves of the board 1314 by scooping up the wafers when the wafer carrier 1313 is moved up. Also, the wafer carrier 1313 has an opening 1313a which allows the board 1314 to pass through it when the wafer carrier 1313 scoops up the wafers on the board 1314.

When the wafers are completely washed, as shown in FIG. 15C, a carrier convey robot 1308 raises the wafer carrier 1313, stores all the wafers on the board 1314 into the wafer carrier 1313, and conveys the wafer carrier 1313 to a carrier receiving unit 1305a on a spin dryer 1305. The wafer carrier 1313 is placed on this carrier receiving unit 1305a such that the wafer surfaces point in a direction perpendicular to the moving direction of the carrier convey robot 1308. This state is suited to rotate the wafer carrier 1313 about its axis on the spin dryer 1305.

The wafers dried by the spin dryer 1305 are conveyed, while being kept stored in the wafer carrier 1313, to the stage of an unloader 1306 by the carrier convey robot 1308. By a series of these operations, twenty-five porous wafers are obtained.

In this apparatus, the first wafer convey robot 1307 moves vertically along a vertical shaft 1307a and moves horizontally along a horizontal shaft 1350. The second wafer convey robot 1330 moves vertically along a vertical shaft 1330a and moves horizontally along a horizontal shaft 1351. The carrier convey robot 1308 moves vertically along a vertical shaft 1308a and moves horizontally along the horizontal shaft 1350.

An HF solution circulation filtration system will be described below. A filter unit 1309 in the circulation filtration system has a function of circulating and filtering an HF solution overflowing from the anodizing bath 2211' and returning the HF solution to the anodizing bath 2211'. This circulation filtration system has a function of removing particles and the like produced in the anodizing bath 2211' and a function of efficiently removing fine bubbles which are produced by an anodization reaction and keep sticking to the wafer surfaces.

In this automatic anodizing apparatus, the anodizing bath 2211', the washing bath 1304, and the carrier receiving unit 1305a of the spin dryer 1305 are substantially linearly arranged on a plan view, and the wafer surfaces are pointed in a direction perpendicular to the moving directions of the first and second wafer convey robots 1307 and 1330. This improves the efficiency of wafer convey between the individual steps (anodization, washing, and drying) and increases the productivity. Additionally, the arrangement can be simplified because the robots are moved only in the two directions as described above.

In the above automatic anodizing apparatus, it is also possible to use an arrangement in which the wafer convey robots 1307 and 1330 are driven by using the same horizontal shaft.

This arrangement can be realized by providing an elevating mechanism for horizontally driving the wafer convey robots 1307 and 1330 along the horizontal shaft by integrating main bodies 1307b and 1330b of the wafer convey robots 1307 and 1330 and moving a suction unit 1307a of the wafer convey robot 1307 upward and downward, and a horizontal driving mechanism for moving a suction unit 1330a of the wafer convey robot 1330 in the axial direction (horizontal direction) of the horizontal shaft 1350.

To set a wafer in the anodizing bath 2211' in this arrangement, a wafer held in the board 1311 is held by suction by the suction unit 1307a and conveyed to the front surface of a corresponding holder 2202 in the anodizing bath 2211' as indicated by the arrow d in FIG. 30. After the suction unit 1330a of the wafer convey robot 1330 is moved to the left in FIG. 30 by the horizontal driving mechanism to hold the wafer by suction, the suction unit 1307a is moved up by the elevating mechanism. Thereafter, the suction unit 1330a is moved to the right in FIG. 30 by the horizontal driving mechanism to a position where the wafer comes in contact with the O-rings of the holder 2202, and the wafer is held by suction by the holder 2202.

On the other hand, to transfer a wafer from the anodizing bath 2211' to the washing bath 1304, the rear surface of the wafer is held by suction by the suction unit 1330a, and the suction of the wafer by the O-rings of the holder 2202 is released. The suction unit 1330a is moved to the left in FIG. 30 to form a predetermined spacing between the wafer and the holder 2202. The suction unit 1307a is moved down to a position between the wafer and the holder 2202 by the elevating mechanism and holds the rear surface of the wafer. The suction by the suction unit 1330a is released, and the suction unit 1330a is moved to the right in FIG. 30 by the horizontal driving mechanism. Thereafter, the integrated wafer convey robots 1307 and 1330 are moved to the washing bath 1304 as indicated by an arrow e' in FIG. 30.

This arrangement eliminates the need to move the wafer convey robot 1307 across the wafer convey robot 1330 as indicated by the arrow e in conveying a wafer from the anodizing bath 2211' to the washing bath 1304. Therefore, the integrated wafer convey robots 1307 and 1330 can be moved as indicated by the arrow e' in FIG. 30. Consequently, the wafer convey path can be shortened.

[Seventh Arrangement]

Figure 31:
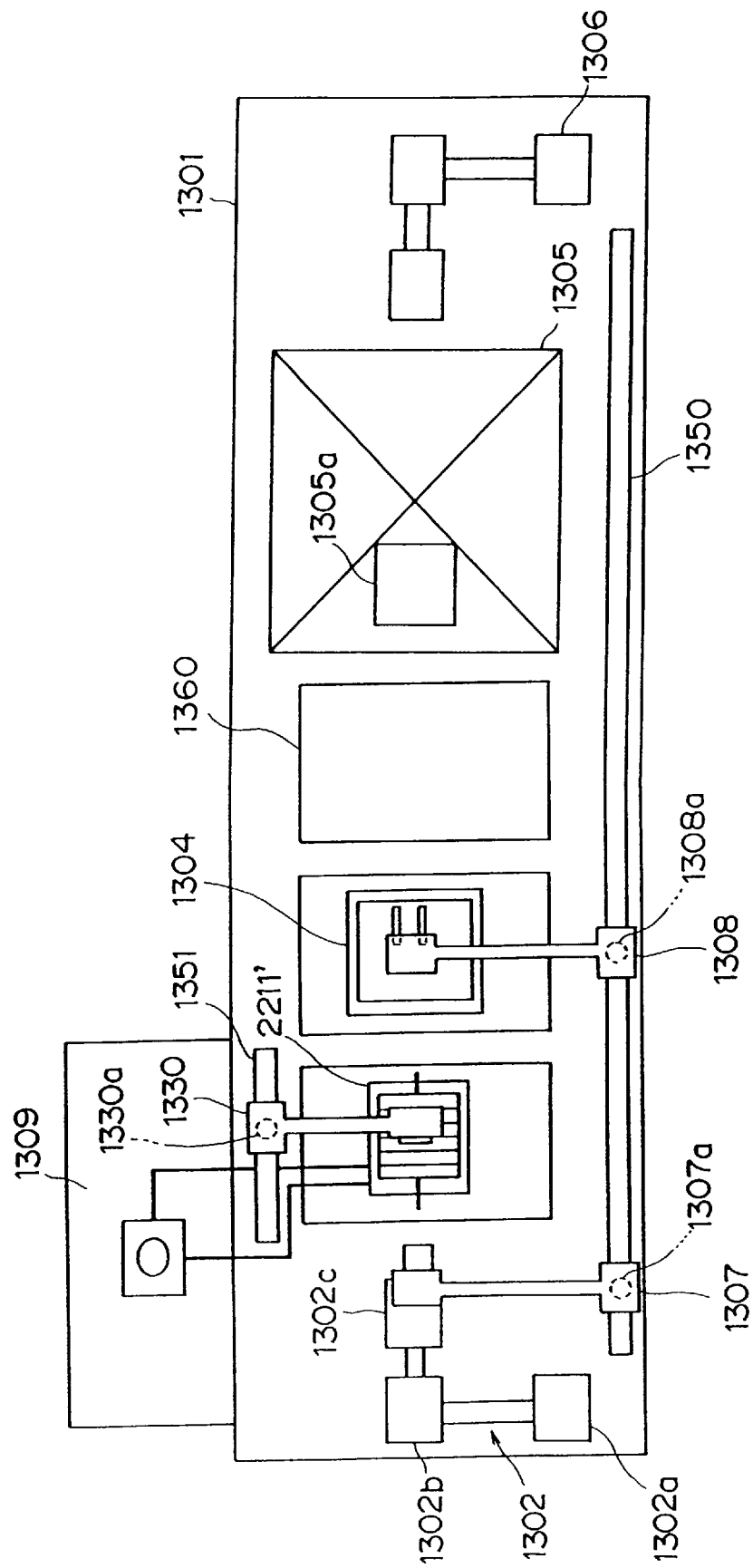
FIG. 31 is a schematic plan view showing another arrangement of the automatic anodizing apparatus according to the second embodiment.

This arrangement is made by improving the automatic anodizing apparatus according to the sixth arrangement. FIG. 31 is a schematic plan view of an improved automatic anodizing apparatus according to this arrangement. The automatic anodizing apparatus according to this arrangement has a dryer 1360 for drying an arm 1308b of the carrier convey robot 1308 after completely washed wafers are stored in a wafer carrier 1313 and conveyed from a washing bath 1304 to a carrier receiving unit 1305a on a spin dryer 1305 by the carrier convey robot 1308.

As a method of drying the arm 1308b, a method of spraying nitrogen gas or some other gas on the arm 1308b is preferable.

The wafer process procedure of the automatic anodizing apparatus according to this arrangement will be described below by comparing it with the wafer process procedure of the automatic anodizing apparatus according to the sixth arrangement.

Following the same procedure as in the automatic anodizing apparatus according to the sixth arrangement, wafers completely washed in the washing bath 1304 are stored in the wafer carrier 1313 and conveyed to the carrier receiving unit 1305a on the spin dryer 1305 by the carrier convey robot 1308.

During the convey, pure water for washing is attached to the arm 1308b of the carrier convey robot 1308. Accordingly, if the wafer carrier 1313 completely dried by the spin dryer 1305 is conveyed to an unloader 1306 by the carrier convey robot 1308 to which the pure water is attached, the pure water can be attached to the dried wafers again.

In the automatic anodizing apparatus according to this arrangement, therefore, after the wafer carrier 1313 is conveyed from the washing bath 1304 to the spin dryer 1305, the carrier convey robot 1308 is so moved as to position the arm 1308b on the dryer 1360. The dryer 1360 dries the arm 1308b by spraying, e.g., nitrogen gas on the arm 1308b.

After the arm 1308b is dried by the dryer 1360 and the wafers and the wafer carrier 1313 are dried by the spin dryer 1305, the convey robot 1308 grips the wafer carrier 1313 with the arm 1308b and conveys the wafer carrier 1313 to the stage of the unloader 1306.

In the embodiment described above, it is possible by improving the substrate supporting method to increase the efficiency of anodization and the number of sizes of processable substrates.

[Third Embodiment]

This embodiment provides a method of fabricating a semiconductor base by using the apparatus according to the first or second embodiment described above in some of the fabrication steps.

FIGS. 32A to 32F are views showing the steps of the semiconductor base fabrication method. This fabrication method will be briefly described below. That is, a porous silicon layer is formed on a single-crystal silicon substrate, and a non-porous layer is formed on the porous silicon layer. A first substrate on which an insulating film is preferably formed and a separately prepared second substrate are adhered such that the insulating film is sandwiched between them. Thereafter, the single-crystal silicon substrate is removed from the rear surface of the first substrate. Additionally, the porous silicon layer is etched to fabricate a semiconductor substrate.

A practical method of fabricating a semiconductor base will be described below with reference to FIGS. 32A to 32F.

Figure 32A:
FIGS. 32A to 32F are sectional views showing a semiconductor substrate fabrication method.

First, a single-crystal Si substrate 51 for forming a first substrate is prepared, and a porous Si layer 52 is formed on the major surface of the substrate 51 (FIG. 32A). This porous Si layer 52 can be formed by processing the major surface of the single-crystal substrate 51 by using the anodizing apparatus according to the first or second embodiment described above.

Figure 32B:
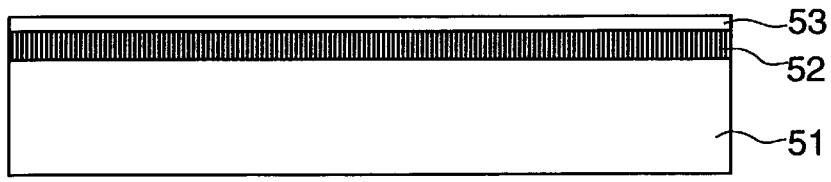

Subsequently, at least one non-porous layer 53 is formed on the porous Si layer 52 (FIG. 32B). This non-porous layer 53 is preferably, e.g., a single-crystal Si layer, a poly-Si layer, an amorphous Si layer, a metal film layer, a compound semiconductor layer, or a superconductive layer. Also, a device such as a MOSFET can be formed in the non-porous layer 53.

Figure 32C:
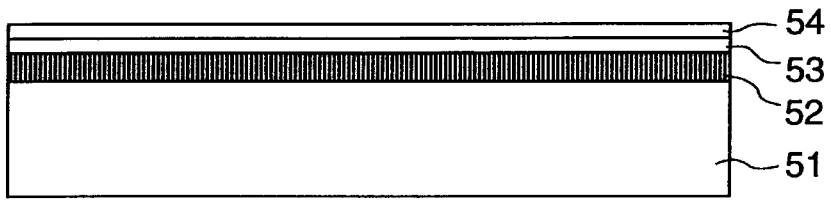

It is preferable that an $SiO_2$ layer 54 be formed on the non-porous layer 53 and the resultant structure be preferably used as a first substrate (FIG. 32C). This $SiO_2$ layer 54 is also useful in a sense that when the first substrate and a second substrate 55 are adhered in the subsequent step, the interface state density of the interface between the adhered surfaces can be separated from an active layer.

Figure 32D:
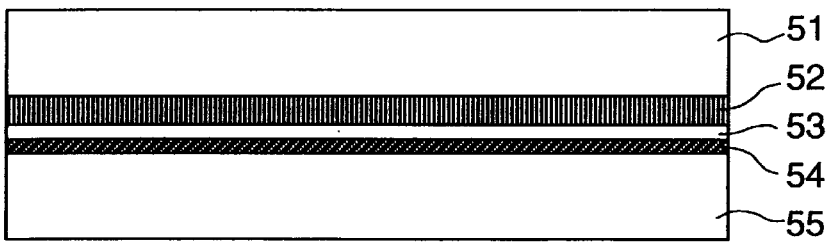

Subsequently, the first substrate and the second substrate 55 are brought into tight contact with each other at room temperature so as to sandwich the $SiO_2$ layer 54 between them (FIG. 32D). Thereafter, the adhesion can also be strengthened by performing any of an anode junction process, a pressurizing process, and, if necessary, annealing, or by combining these processes.

When a single-crystal Si layer is formed as the non-porous layer 53, this single-crystal Si layer is preferably adhered to the second substrate 55 after the $SiO_2$ layer 54 is formed on the surface of the single-crystal Si layer by, e.g., thermal oxidation.

As the second substrate 55, it is preferable to use, e.g., an Si substrate, a substrate obtained by forming an $SiO_2$ layer on an Si substrate, a light-transmitting substrate such as quartz, or sapphire. However, the second substrate 55 can also be some other type of substrate as long as the surface to be adhered is sufficiently flat.

Note that FIG. 32D shows the state in which the first and second substrates are adhered via the $SiO_2$ layer 54. However, this $SiO_2$ layer 54 need not be formed if the non-porous layer 53 or the second substrate is not Si.

Also, a thin insulating plate can be sandwiched between the first and second substrates when they are adhered.

Figure 32E:
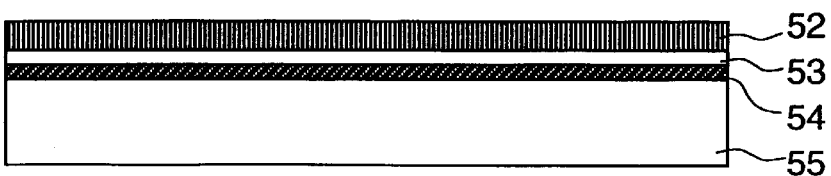

Subsequently, the first substrate is removed from the second substrate so that the porous Si layer 53 remains (FIG. 32E). As the method of removal, it is possible to use a first method (by which the first substrate is wasted) using grinding, polishing, or etching or a second method by which the first and second substrates are separated from the porous layer 53. When the second method is used, the separated first substrate can be reused by removing porous Si remaining on the substrate and, where necessary, planarizing the substrate surface.

Figure 32F:
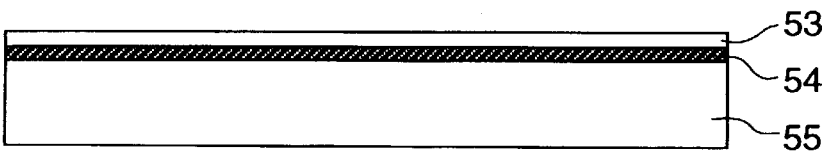

Subsequently, the porous Si layer 52 is selectively etched away (FIG. 32F).

FIG. 32E schematically shows the semiconductor substrate obtained by the above fabrication method. In this fabrication method, the non-porous layer 53 (e.g., a single-crystal Si layer) is formed flat and uniformly over the entire region of the surface of the second substrate 55.

For example, when an insulating substrate is used as the second substrate 55, the semiconductor substrate obtained by the above fabrication method is extremely usefull in the formation of an insulated electronic device.

The present invention is not limited to the above embodiments and various changes and modifications can be made within the spirit and scope of the present invention. Therefore, to apprise the public of the scope of the present invention the following claims are made.

What is claimed is:

1. A semiconductor processing system for processing a semiconductor substrate, comprising:
   a cleaning apparatus for cleaning the semiconductor substrate;
   a spin dryer for drying the semiconductor substrate cleaned by said cleaning apparatus; and
   a convey apparatus for conveying the semiconductor substrate from a preceding step of the cleaning to said cleaning apparatus and from said cleaning apparatus to said spin dryer,
   wherein said spin dryer comprises a receiving unit for receiving the cleaned semiconductor substrate,
   said cleaning apparatus and said receiving unit are substantially arranged in a straight line,
   said convey apparatus conveys the semiconductor substrate such that a surface of the semiconductor substrate is parallel to a direction perpendicular to the straight line, and
   said spin dryer receives the semiconductor substrate from said convey apparatus in such a manner that the surface of the semiconductor substrate is parallel to the direction perpendicular to the straight line.

2. The system according to claim 1, wherein said convey apparatus comprises a first convey robot for conveying the substrate to said cleaning apparatus, and a second convey robot for conveying the substrate contained in a carrier from said cleaning apparatus to said receiving unit of said drying apparatus.

3. The system according to claim 2, wherein each of said first and second convey robots has only a first driving shaft for moving the substrate or the carrier to a portion above each apparatus and a second driving shaft for moving the substrate or the carrier along the straight line, as driving shafts for conveying the substrate or the carrier.

4. A substrate processing system for processing a substrate, comprising:
   a processing bath for chemically processing a substrate;
   a cleaning bath for cleaning the substrate chemically processed by said processing bath;
   a spin dryer for drying the substrate cleaned by said cleaning bath; and
   a convey apparatus for conveying the substrate from said processing bath to said cleaning bath and from said cleaning bath to said spin dryer,
   wherein said processing bath, said cleaning bath, and said spin dryer are substantially arranged in a straight line when viewed from above,
   said convey apparatus conveys the substrate such that a surface of the substrate is parallel to a direction perpendicular to the straight line, and
   said spin dryer receives the semiconductor substrate from said convey apparatus in such a manner that the surface of the semiconductor substrate is parallel to the direction perpendicular to the straight line.

5. The system according to claim 4, wherein said convey apparatus comprises a first convey robot for conveying the substrate from said processing bath to said cleaning bath, and a second convey robot for conveying the substrate from said cleaning bath to said drying apparatus and from said drying apparatus to an unloader.

6. The system according to claim 5, further comprising a second drying apparatus for drying said second convey robot after said second convey robot conveys the substrate from said cleaning bath to said drying apparatus and before said second convey robot conveys the substrate from said drying apparatus to said unloader.

* * * * *

UNITED STATES PATENT AND TRADEMARK OFFICE
CERTIFICATE OF CORRECTION

PATENT NO.     : 6,202,655 B1
DATED          : March 20, 2001
INVENTOR(S)    : Yamagata It is certified that error appears in the above-identified patent and that said Letters Patent is hereby corrected as shown below:

<u>Column 14,</u>
Line 42, delete "holer" and insert therefor -- holder --

<u>Column 18,</u>
Line 53, delete "i320" and insert -- therefor -- 1320 --

<u>Column 27,</u>
Line 22, delete "ales" and insert therefor -- sales --.

Signed and Sealed this

Second Day of April, 2002

*Attest:*

*Attesting Officer*

JAMES E. ROGAN
*Director of the United States Patent and Trademark Office*